United States Patent
Hirano et al.

(10) Patent No.: US 8,735,052 B2
(45) Date of Patent: May 27, 2014

(54) SURFACE MODIFYING MATERIAL, METHOD OF FORMING RESIST PATTERN, AND METHOD OF FORMING PATTERN

(75) Inventors: Isao Hirano, Kawasaki (JP); Junichi Tsuchiya, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 107 days.

(21) Appl. No.: 13/047,404

(22) Filed: Mar. 14, 2011

(65) Prior Publication Data

US 2011/0269076 A1    Nov. 3, 2011

(30) Foreign Application Priority Data

Mar. 19, 2010    (JP) .................................. 2010-064365

(51) Int. Cl.
    *G03F 7/30*          (2006.01)
(52) U.S. Cl.
    USPC ........... 430/323; 430/325; 430/326; 430/330; 430/271.1
(58) Field of Classification Search
    None
    See application file for complete search history.

(56) References Cited

U.S. PATENT DOCUMENTS

| | | | | | |
|---|---|---|---|---|---|
| 4,060,656 | A | * | 11/1977 | Naka et al. | ............... 428/355 EP |
| 5,576,359 | A | * | 11/1996 | Urano et al. | ................... 523/400 |
| 5,945,517 | A | | 8/1999 | Nitta et al. | |
| 6,153,733 | A | | 11/2000 | Yukawa et al. | |
| 7,074,543 | B2 | | 7/2006 | Iwai et al. | |
| 2001/0006759 | A1 | * | 7/2001 | Shipley et al. | ............. 430/280.1 |
| 2004/0097014 | A1 | * | 5/2004 | Musa | ........................... 438/118 |
| 2008/0113296 | A1 | * | 5/2008 | Yamamoto et al. | ........ 430/280.1 |
| 2008/0233515 | A1 | | 9/2008 | Ito et al. | |

FOREIGN PATENT DOCUMENTS

| | | |
|---|---|---|
| EP | 2048196 A1 * | 4/2009 |
| JP | S56-016129 | 2/1981 |
| JP | H09-208554 | 8/1997 |
| JP | H11-035551 | 2/1999 |
| JP | H11-035552 | 2/1999 |
| JP | H11-035573 | 2/1999 |
| JP | H11-322707 | 11/1999 |
| JP | 2003-076012 | 3/2003 |
| JP | 2003-241385 | 8/2003 |
| JP | 2005-336452 | 12/2005 |
| JP | 2006-259582 | 9/2006 |
| JP | 2008-031370 A * | 2/2008 |
| TW | 200903155 | 1/2009 |
| WO | WO 2004/074242 | 9/2004 |
| WO | WO 2004/076495 | 9/2004 |

OTHER PUBLICATIONS

English translation of JP, 2008-031370, A (2008) from machine translation from AIPN Japan Patent Office National Center for Industrial Property Information and Training, generated Sep. 20, 2012, 8 pages.*

Office Action mailed on Mar. 4, 2014 in Taiwanese Patent Application No. 100107923.

* cited by examiner

*Primary Examiner* — Cynthia Hamilton
(74) *Attorney, Agent, or Firm* — Knobbe Martens Olson & Bear LLP

(57) ABSTRACT

A surface modifying material for forming a surface modifying layer provided between a substrate and a resist film, the surface modifying material including an epoxy resin having a weight average molecular weight of 1,000 to 50,000;
  a method of forming a resist pattern, including: forming a surface modifying layer on a substrate using the surface modifying material, forming a resist film on the substrate, on which the surface modified layer has been formed, using a resist composition, conducting exposure of the resist film, and alkali developing the resist film to form a resist pattern; and
  a method of forming a pattern, including: etching the substrate, on which a resist pattern has been formed by the method of forming a resist pattern.

12 Claims, No Drawings

SURFACE MODIFYING MATERIAL, METHOD OF FORMING RESIST PATTERN, AND METHOD OF FORMING PATTERN

BACKGROUND OF THE INVENTION

1. Field of the Invention

The present invention relates to a surface modifying material for forming a surface modifying layer provided between a substrate and a resist film, a method of forming a resist pattern using the surface modifying material, and a method of forming a pattern which includes a step for conducting an etching treatment.

Priority is claimed on Japanese Patent Application No. 2010-064365, filed Mar. 19, 2010, the content of which is incorporated herein by reference.

2. Description of the Related Art

In lithography techniques, for example, a resist film composed of a resist material is formed on a substrate, and the resist film is subjected to selective exposure of radial rays such as light or electron beam through a mask having a predetermined pattern, followed by development, thereby forming a resist pattern having a predetermined shape on the resist film. Further, the substrate having the resist pattern formed thereon is then subjected to an etching treatment using the resist pattern as a mask, thereby forming a pattern.

A resist material in which the exposed portions become soluble in a developing solution is called a positive-type, and a resist material in which the exposed portions become insoluble in a developing solution is called a negative-type.

In recent years, in the production of semiconductor elements and liquid crystal display elements, advances in lithography techniques have lead to rapid progress in the field of pattern miniaturization. Typically, these miniaturization techniques involve shortening the wavelength (energy increasing) of the exposure light source. Conventionally, ultraviolet radiation typified by g-line and i-line radiation has been used, but nowadays KrF excimer lasers and ArF excimer lasers are now starting to be introduced in mass production. Furthermore, research is also being conducted into lithography techniques that use an exposure light source having a shorter wavelength (higher energy) than these excimer lasers, such as an electron beam (EB), extreme ultraviolet radiation (EUV), and X ray.

As shortening of the wavelength of the exposure light source progresses, it is required to improve various lithography properties of the resist material, such as the sensitivity to the exposure light source and the resolution capable of reproducing patterns of minute dimensions. As a resist material which satisfies these conditions, a chemically amplified resist has been known. As a chemically amplified composition, a composition including a base component that exhibits a changed solubility in an alkali developing solution under the action of acid and an acid-generator component that generates acid upon exposure is generally used. For example, in a chemically amplified positive resist composition, a base component that exhibits increased solubility in an alkali developing solution under the action of acid is used.

Conventionally, a resin (base resin) is typically used as the base component of a chemically amplified resist composition. In the case of a positive type, a resin that exhibits increased solubility in an alkali developing solution under the action of acid is used as a base resin.

Currently, resins that contain structural units derived from (meth)acrylate esters within the main chain (acrylic resins) are mainly used as base resins for chemically amplified resist compositions that use ArF excimer laser lithography, as they exhibit excellent transparency in the vicinity of 193 nm (for example, see Patent Document 1).

Here, in the present descriptions, the term "(meth)acrylic acid" is a generic term that includes either or both of acrylic acid having a hydrogen atom bonded to the α-position and methacrylic acid having a methyl group bonded to the α-position. The term "(meth)acrylate ester" is a generic term that includes either or both of the acrylate ester having a hydrogen atom bonded to the α-position and the methacrylate ester having a methyl group bonded to the α-position. The term "(meth)acrylate" is a generic term that includes either or both of the acrylate having a hydrogen atom bonded to the α-position and the methacrylate having a methyl group bonded to the α-position.

Further, in order to improve the pattern resolution, a method of forming a pattern has been proposed, in which separation of the resist pattern from the substrate has been suppressed. More specifically, the method of forming a pattern that includes: formation of a thin film (surface modifying layer) of about 10 Å by using a solution prepared by dissolving an epoxylated 1,2-polybutadiene obtained through epoxylation of 1,2-polybutadiene (having a weight average molecular weight of about 150,000) in an organic solvent, and applying the solution onto a silicon wafer; a bake treatment at 130° C.; subsequent formation of a resist pattern (having a line width of 1,000 to 1,500 nm) on top of the silicon wafer onto which the surface modifying layer has been formed; followed by an etching treatment, has been proposed (see Patent Document 2).

[Patent Document 1] Japanese Unexamined Patent Application, First Publication No. 2003-241385

[Patent Document 2] Japanese Unexamined Patent Application, First Publication No. Sho 56-16129

SUMMARY OF THE INVENTION

Problems to be Solved by the Invention

Further progress in pattern miniaturization has resulted in ever greater demands for improvements in lithography techniques, both in terms of lithography properties such as the resistance to pattern collapse, and in terms of the pattern resolution. Conventional methods that have been used for preventing pattern collapse include treating the substrate such as a silicon wafer with a compound such as hexamethyldisilazane (HMDS) or providing an organic antireflection film on top of the substrate, thereby improving the adhesion between the resist pattern and the substrate.

However, when an isolated line resist pattern of minute dimension was formed on top of a substrate prepared by subjecting, for example, a silicon wafer to the HMDS treatment, or on top of a substrate provided with a surface modifying layer that is formed in the same manner as in the method disclosed in Patent Document 2, both of the resistance to pattern collapse and the resolution were unsatisfactory.

Further, when forming a resist pattern on top of a substrate prepared by forming the aforementioned surface modifying layer on a silicon wafer, followed by a bake treatment at 130° C., and etching the resist pattern, the edge of the resist pattern readily detached from the substrate.

The present invention takes the above circumstances into consideration, with an object of providing a surface modifying material and a method of forming a resist pattern that are capable of forming a resist pattern exhibiting excellent adhesion with a substrate, superior resistance to pattern collapse and high resolution, and a method of forming a pattern by which a resist pattern is unlikely to detach from a substrate during an etching treatment.

Means for Solving the Invention

As a result of intensive and extensive investigation aimed at achieving the above object, the inventors of the present invention discovered that the above object could be achieved by providing a surface modifying layer between a substrate and a resist film by using an epoxy resin having a specific weight average molecular weight, and they were therefore able to complete the present invention.

That is, a first aspect of the present invention is a surface modifying material for forming a surface modifying layer provided between a substrate and a resist film, which is a surface modifying material containing an epoxy resin having a weight average molecular weight of 1,000 to 50,000.

A second aspect of the present invention is a method of forming a resist pattern, including: forming a surface modifying layer on a substrate using a surface modifying material containing an epoxy resin having a weight average molecular weight of 1,000 to 50,000; forming a resist film on the substrate, on which the surface modifying layer has been formed, using a resist composition; conducting exposure of the resist film; and alkali developing the resist film to form a resist pattern.

A third aspect of the present invention is a method of forming a pattern, including: subjecting the substrate, on which a resist pattern has been formed by the method of forming a resist pattern according to the second aspect described above, to an etching treatment.

In the present description and the claims, the term "aliphatic" is a relative concept used in relation to the term "aromatic", and defines a group or compound that has no aromaticity.

The term "alkyl group" includes linear, branched or cyclic, monovalent saturated hydrocarbon groups, unless otherwise specified. The same applies for the alkyl group within an alkoxy group.

The term "alkylene group" includes linear, branched or cyclic divalent saturated hydrocarbon groups, unless otherwise specified.

A "halogenated alkyl group" is a group in which some or all of the hydrogen atoms of an alkyl group have been substituted with halogen atoms, and a "halogenated alkylene group" is a group in which some or all of the hydrogen atoms of an alkylene group have been substituted with halogen atoms. Examples of the halogen atoms include fluorine atoms, chlorine atoms, bromine atoms and iodine atoms.

A "hydroxyalkyl group" is a group in which some or all of the hydrogen atoms of an alkyl group have been substituted with hydroxyl groups.

A "structural unit" refers to a monomer unit that contributes to the formation of a polymeric compound (namely, a resin, polymer or copolymer).

The term "exposure" is used as a general concept that includes irradiation with any form of radiation.

According to the present invention, a surface modifying material and a method of forming a resist pattern that are capable of forming a resist pattern exhibiting excellent adhesion with a substrate, superior resistance to pattern collapse and high resolution can be provided.

Further, according to the present invention, a method of forming a pattern by which a resist pattern is unlikely to detach from a substrate during an etching treatment can be provided.

DETAILED DESCRIPTION OF THE INVENTION

<<Surface Modifying Material>>

A surface modifying material of the present invention is a material for forming a surface modifying layer provided between a substrate and a resist film and contains an epoxy resin having a weight average molecular weight of 1,000 to 50,000.

By providing a surface modifying layer, adhesion between the substrate and the resist pattern is enhanced, and pattern collapse and detachment of the resist pattern from the substrate are suppressed.

The surface modifying material of the present invention enables formation of a surface modifying layer that is capable of sufficiently suppressing pattern collapse and detachment of the resist pattern from the substrate even in the formation of patterns having more minute dimensions than ever before (on the order of nanometers).

(Epoxy Resin)

In the present invention, the term "epoxy resin" includes both comparatively low molecular weight polymers (prepolymers) having at least two epoxy groups within each molecule, as well as thermosetting resins produced by a ring-opening reaction of the epoxy groups of such prepolymers.

The weight average molecular weight of the epoxy resin in the present invention (hereafter, referred to as a "component (G)") is 1,000 to 50,000, preferably 2,000 to 40,000, more preferably 3,000 to 30,000, and most preferably 3,000 to 20,000.

If the weight average molecular weight of the component (G) is within the aforementioned range, a surface modifying layer bonded to the substrate in a favorable manner can be formed, and the adhesion between the resist pattern and the substrate improves.

When the weight average molecular weight is at least as large as the lower limit, crosslinking efficiency with the substrate is enhanced, so that the substrate and the surface modifying layer are strongly bonded together. On the other hand, when a solution prepared by dissolving the component (G) in an organic solvent is used as the surface modifying material, it is desirable that the solution exhibit an adequate level of viscosity so that the solution can be easily applied uniformly on top of the substrate. When the weight average molecular weight is not greater than the above-mentioned upper limit, an increase in the viscosity of the solution can be suppressed and the viscosity level will be adequate, so that the solution will be easily applied uniformly on top of the substrate.

In the present invention, the term "weight average molecular weight" refers to the polystyrene-equivalent weight average molecular weight value determined by gel permeation chromatography. Hereafter, the weight average molecular weight may be expressed as Mw.

The component (G) is preferably an epoxy resin having unopened epoxy groups, as such resins produce excellent adhesion between the resist film and the substrate, and better suppress pattern collapse and detachment of the resist pattern from the substrate. Examples of such epoxy resins include resins in which an epoxy group represented by general formula (g0-1) shown below is present partway along the main chain of a polymeric compound, with the carbon atoms of the epoxy group forming a portion of the main chain; resins in which an epoxy group represented by general formula (g0-2) shown below is included within the side chains of a polymeric compound, and resins in which an epoxy group represented by general formula (g0-2) shown below forms a terminal of the main chain of a polymeric compound; resins in which an epoxy group represented by general formula (g0-3) shown below is included within the side chains of a polymeric compound, and resins in which an epoxy group represented by general formula (g0-3) shown below forms a terminal of the main chain of a polymeric compound; resins in which an epoxy group represented by general formula (g0-4) shown below is included within the side chains of a polymeric compound, and resins in which an epoxy group represented by general formula (g0-4) shown below forms a terminal of the main chain of a polymeric compound; and resins in which an epoxy group represented by general formula (g0-5) shown below is included within the side chains of a polymeric compound, and resins in which an epoxy group represented by general formula (g0-5) shown below forms a terminal of the main chain of a polymeric compound.

[Chemical Formula 1]

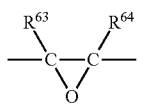

(g0-1)

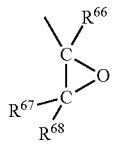

(g0-2)

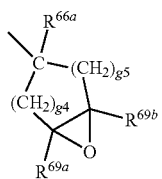

(g0-3)

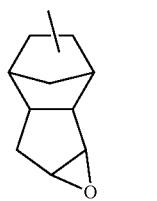

(g0-4)

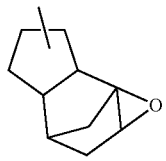

(g0-5)

In the formulas, each of $R^{63}$ and $R^{64}$ independently represents a hydrogen atom or an alkyl group; each of $R^{66}$ to $R^{68}$ independently represents a hydrogen atom or an alkyl group; each of $R^{66a}$, $R^{69a}$ and $R^{69b}$ independently represents a hydrogen atom or an alkyl group; g4 represents an integer of 1 to 20; and g5 represents an integer of 1 to 20.

In formula (g0-1) above, each of $R^{63}$ and $R^{64}$ independently represents a hydrogen atom or an alkyl group. With respect to $R^{63}$ and $R^{64}$, the alkyl group is preferably an alkyl group of 1 to 5 carbon atoms, more preferably a methyl group or ethyl group, and most preferably a methyl group. Of the various possibilities, each of $R^{63}$ and $R^{64}$ preferably represents a hydrogen atom or a methyl group.

In formula (g0-2) above, each of $R^{66}$ to $R^{68}$ independently represents a hydrogen atom or an alkyl group. With respect to $R^{66}$ to $R^{68}$, the alkyl group is preferably an alkyl group of 1 to 5 carbon atoms, more preferably a methyl group or ethyl group, and most preferably a methyl group. Of these, $R^{66}$ preferably represents a hydrogen atom or a methyl group; and each of $R^{67}$ and $R^{68}$ preferably represents a hydrogen atom or a methyl group, and it is particularly desirable that both of $R^{67}$ and $R^{68}$ represents a hydrogen atom.

In formula (g0-3) above, each of $R^{66a}$, $R^{69a}$ and $R^{69b}$ independently represents a hydrogen atom or an alkyl group. With respect to $R^{66a}$, $R^{69a}$ and $R^{69b}$, the alkyl group is preferably an alkyl group of 1 to 5 carbon atoms, more preferably a methyl group or ethyl group, and most preferably a methyl group. Of these, $R^{66a}$ preferably represents a hydrogen atom or a methyl group; and each of $R^{69a}$ and $R^{69b}$ preferably represents a hydrogen atom or a methyl group, and it is particularly desirable that both of $R^{69a}$ and $R^{69b}$ represents a hydrogen atom.

g4 represents an integer of 1 to 20, is preferably 1 to 5, is more preferably 1 or 2, and is most preferably 2.

g5 represents an integer of 1 to 20, is preferably 1 to 5, is more preferably 1 or 2, and is most preferably 1.

Of the various possibilities described above, resins in which an epoxy group represented by general formula (g0-1) is present partway along the main chain of a polymeric compound, with the carbon atoms of the epoxy group forming a portion of the main chain; resins in which an epoxy group represented by general formula (g0-2) is included within the side chains of a polymeric compound; resins in which an epoxy group represented by general formula (g0-3) is included within the side chains of a polymeric compound; resins in which an epoxy group represented by general formula (g0-4) is included within the side chains of a polymeric compound; and resins in which an epoxy group represented by general formula (g0-5) is included within the side chains of a polymeric compound are preferred.

A more specific and preferred example of the component (G) is a resin having a repeating structural unit (g1) containing an epoxy group.

Resins having this type of repeating structure are preferred, because the adhesion between the resist pattern and the substrate improves, when the weight average molecular weight is within the range from 1,000 to 50,000.

(Structural Unit (g1))

There are no particular limitations on the structural unit (g1) containing an epoxy group, and examples thereof include structural units formed from an organic group containing an epoxy group, wherein the carbon atoms of the epoxy group form a portion of the main chain.

Apart from the above type of structural units, the structural unit (g1) may also be a structural unit derived from a hydroxystyrene, a structural unit derived from an acrylate ester, or a structural unit having a cyclic main chain (hereafter referred to as a "cyclic main chain structural unit"). Of these, structural units derived from acrylate esters are preferred.

Here, in the description and claims of the present invention, the expression "structural unit derived from a hydroxystyrene" refers to a structural unit which is formed by the cleavage of the ethylenic double bond of a hydroxystyrene.

The term "hydroxystyrene" is a generic term that includes hydroxystyrene, compounds in which the hydrogen atom at the α-position of a hydroxystyrene has been substituted with another substituent such as an alkyl group, and derivatives thereof. Unless specified otherwise, the α-position (α-position carbon atom) of a structural unit derived from a hydroxystyrene refers to the carbon atom to which the benzene ring is bonded.

Examples of the alkyl group for the substituent at the α-position of the hydroxystyrene include alkyl groups of 1 to 5 carbon atoms, and specific examples include linear and branched alkyl groups such as a methyl group, ethyl group, propyl group, isopropyl group, n-butyl group, isobutyl group, tert-butyl group, pentyl group, isopentyl group or neopentyl group.

The term "structural unit derived from an acrylate ester" refers to a structural unit which is formed by the cleavage of the ethylenic double bond of an acrylate ester.

Further, in the present description, the expression "cyclic main chain structural unit" describes a structural unit having a monocyclic or polycyclic structure, wherein at least one, and preferably two or more, of the carbon atoms within a ring of the cyclic structure constitute part of the main chain.

The term "acrylate ester" is a generic term that includes acrylate esters having a hydrogen atom bonded to the carbon atom on the α-position, and acrylate esters having a substituent (an atom other than a hydrogen atom or a group) bonded to the carbon atom on the α-position. Examples of the substituent include an alkyl group of 1 to 5 carbon atoms or a halogenated alkyl group of 1 to 5 carbon atoms. With respect to the "structural unit derived from an acrylate ester", the "α-position (the carbon atom on the α-position)" refers to the carbon atom having the carbonyl group bonded thereto, unless specified otherwise.

With respect to the acrylate ester, specific examples of the alkyl group of 1 to 5 carbon atoms for the substituent at the α-position include linear or branched lower alkyl groups such as a methyl group, ethyl group, propyl group, isopropyl group, n-butyl group, isobutyl group, tert-butyl group, pentyl group, isopentyl group and neopentyl group.

Specific examples of the halogenated alkyl group of 1 to 5 carbon atoms include groups in which some or all of the hydrogen atoms of the aforementioned "alkyl group of 1 to 5 carbon atoms for the substituent at the α-position" are substituted with halogen atoms. Examples of the halogen atoms include fluorine atoms, chlorine atoms, bromine atoms and iodine atoms, and fluorine atoms are particularly desirable.

In the present invention, it is preferable that a hydrogen atom, an alkyl group of 1 to 5 carbon atoms or a halogenated alkyl group of 1 to 5 carbon atoms is bonded to the α-position of the acrylate ester, and more preferably a hydrogen atom, an alkyl group of 1 to 5 carbon atoms or a fluorinated alkyl group of 1 to 5 carbon atoms. In terms of industrial availability, a hydrogen atom or a methyl group is the most desirable.

Examples of structures for the structural unit (g1) include structural units represented by general formulas (g1-1) to (g1-4) shown below, and structural units derived from the compounds disclosed in paragraphs [0012] to [0042] in Japanese Unexamined Patent Application, First Publication No. 2003-076012.

Of these, it is preferable to include at least one structural unit selected from the group consisting of structural units represented by general formulas (g1-1) to (g1-4) shown below, as such structural units yield superior effects for the present invention.

[Chemical Formula 2]

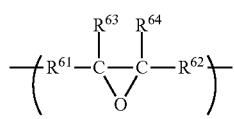
(g1-1)

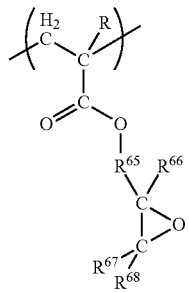
(g1-2)

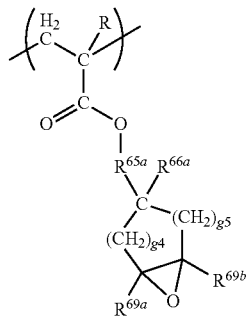
(g1-3)

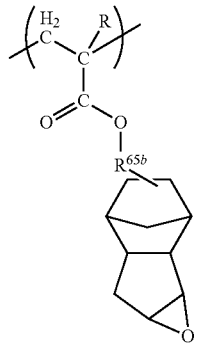
(g1-4)

In the formulas, each of $R^{61}$ and $R^{62}$ independently represents a divalent hydrocarbon group which may have a substituent, and each of $R^{63}$ and $R^{64}$ independently represents a hydrogen atom or an alkyl group; R represents a hydrogen atom, an alkyl group of 1 to 5 carbon atoms or a halogenated alkyl group of 1 to 5 carbon atoms; $R^{65}$ represents a divalent hydrocarbon group which may have a substituent, and each of $R^{66}$ to $R^{68}$ independently represents a hydrogen atom or an alkyl group; $R^{65a}$ represents a divalent hydrocarbon group which may have a substituent; each of $R^{66a}$, $R^{69a}$ and $R^{69b}$ independently represents a hydrogen atom or an alkyl group; g4 represents an integer of 1 to 20; and g5 represents an integer of 1 to 20; and $R^{65b}$ represents a divalent hydrocarbon group which may have a substituent.

In formula (g1-1) above, each of $R^{61}$ and $R^{62}$ independently represents a divalent hydrocarbon group which may have a substituent.

The expression that the hydrocarbon group "may have a substituent" means that some or all of the hydrogen atoms within the hydrocarbon group may be substituted with an atom other than a hydrogen atom or with a group.

The hydrocarbon group for $R^{61}$ or $R^{62}$ may be either an aliphatic hydrocarbon group or an aromatic hydrocarbon group.

An "aliphatic hydrocarbon group" describes a hydrocarbon group having no aromaticity. The aliphatic hydrocarbon group may be saturated or unsaturated, but is preferably saturated.

Examples of the aliphatic hydrocarbon group for $R^{61}$ or $R^{62}$ include linear or branched aliphatic hydrocarbon groups, and aliphatic hydrocarbon groups containing a ring in the structure thereof.

The linear or branched aliphatic hydrocarbon group is preferably a group of 1 to 10 carbon atoms, more preferably 1 to 8 carbon atoms, still more preferably 1 to 5 carbon atoms, and most preferably 1 or 2 carbon atoms.

The linear aliphatic hydrocarbon group is preferably a linear alkylene group, and specific examples include a methylene group [—$CH_2$—], ethylene group [—$(CH_2)_2$—], trimethylene group [—$(CH_2)_3$—], tetramethylene group [—$(CH_2)_4$—], or pentamethylene group [—$(CH_2)_5$—].

The branched aliphatic hydrocarbon group is preferably a branched alkylene group, and specific examples include alkylalkylene groups, including alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$— and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH2CH_3)CH_2$— and —$C(CH_2CH_3)_2$—$CH_2$—; alkyltrimethylene groups such as —$CH(CH_3)CH_2CH_2$— and —$CH_2CH(CH_3)CH_2$—; and alkyltetramethylene groups such as —$CH(CH_3)CH_2CH_2CH_2$— and —$CH_2CH(CH_3)CH_2CH_2$—. As the alkyl group within the alkylalkylene group, a linear alkyl group of 1 to 5 carbon atoms is preferable.

The linear or branched aliphatic hydrocarbon group (hereafter also referred to as a "chain-like aliphatic hydrocarbon group") may or may not have a substituent. Examples of the substituent include a fluorine atom, a fluorinated alkyl group of 1 to 5 carbon atoms, and an oxygen atom (=O).

Examples of the aliphatic hydrocarbon group containing a ring in the structure thereof include cyclic aliphatic hydrocarbon groups (groups in which two or more hydrogen atoms have been removed from an aliphatic hydrocarbon ring), and groups in which the cyclic aliphatic hydrocarbon group is bonded to the terminal of an aforementioned chain-like aliphatic hydrocarbon group or interposed within the chain of an aforementioned chain-like aliphatic hydrocarbon group.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic group, a group in which two or more hydrogen atoms have been removed from a monocycloalkane of 3 to 6 carbon atoms is preferable. Examples of the monocycloalkane include cyclopentane and cyclohexane. As the polycyclic group, a group in which two or more hydrogen atoms have been removed from a polycycloalkane of 7 to 12 carbon atoms is preferable. Examples of the polycycloalkane include adamantane, norbornane, isobornane, tricyclodecane and tetracyclododecane.

The cyclic aliphatic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

Examples of the aromatic hydrocarbon group for $R^{61}$ or $R^{62}$ include divalent aromatic hydrocarbon groups in which an additional one hydrogen atom has been removed from the aromatic hydrocarbon nucleus of a monovalent aromatic hydrocarbon group such as a phenyl group, biphenyl group, fluorenyl group, naphthyl group, anthryl group or phenanthryl group; aromatic hydrocarbon groups in which a portion of the carbon atoms that constitute an aforementioned divalent aromatic hydrocarbon group have been substituted with a hetero atom such as an oxygen atom, sulfur atom or nitrogen atom; and aromatic hydrocarbon groups in which an additional one hydrogen atom has been removed from the aromatic hydrocarbon nucleus of an arylalkyl group such as a benzyl group, phenethyl group, 1-naphthylmethyl group, 2-naphthylmethyl group, 1-naphthylethyl group or 2-naphthylethyl group.

The aromatic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

As $R^{61}$ or $R^{62}$, a linear aliphatic hydrocarbon group is preferable, a linear alkylene group is more preferable, a linear alkylene group of 1 to 5 carbon atoms is still more preferable, and a methylene group is the most desirable.

In formula (g1-1) above, each of $R^{63}$ and $R^{64}$ independently represents a hydrogen atom or an alkyl group.

The alkyl group for $R^{63}$ and $R^{64}$ is the same as those described above in formula (g0-1) above.

Of the various possibilities, each of $R^{63}$ and $R^{64}$ preferably represents a hydrogen atom or a methyl group.

In formula (g1-2) above, R represents a hydrogen atom, an alkyl group of 1 to 5 carbon atoms or a halogenated alkyl group of 1 to 5 carbon atoms.

The alkyl group or halogenated alkyl group for R is the same as the aforementioned alkyl group of 1 to 5 carbon atoms or halogenated alkyl group of 1 to 5 carbon atoms which may be bonded to the α-position of the acrylate ester.

Of these, R is preferably a hydrogen atom or an alkyl group of 1 to 5 carbon atoms, and is most preferably a hydrogen atom or a methyl group.

In formula (g1-2) above, $R^{65}$ represents a divalent hydrocarbon group which may have a substituent. Examples of $R^{65}$ include the same groups as those listed above for $R^{61}$ and $R^{62}$ in formula (g1-1), and of these, a linear aliphatic hydrocarbon group is preferable, a linear alkylene group is more preferable, a linear alkylene group of 1 to 5 carbon atoms is still more preferable, and a methylene group is the most desirable.

In formula (g1-2) above, each of $R^{66}$ to $R^{68}$ independently represents a hydrogen atom or an alkyl group. The alkyl group for $R^{66}$ to $R^{68}$ is the same as those described above in formula (g0-2).

Of the various possibilities, each of $R^{66}$ to $R^{68}$ preferably represents a hydrogen atom or a methyl group.

In formula (g1-3) above, $R^{65a}$ represents a divalent hydrocarbon group which may have a substituent. Examples of $R^{65a}$ include the same groups as those listed above for $R^{65}$ in formula (g1-2), and of these, a linear aliphatic hydrocarbon group is preferable, a linear alkylene group is more preferable, a linear alkylene group of 1 to 5 carbon atoms is still more preferable, and a methylene group is the most desirable.

In formula (g1-3) above, each of $R^{66a}$, $R^{69a}$ and $R^{69b}$ independently represents a hydrogen atom or an alkyl group. The alkyl group for $R^{66a}$, $R^{69a}$ and $R^{69b}$ is the same as those described above in formula (g0-3). Of the various possibilities, each of $R^{66a}$, $R^{69a}$ and $R^{69b}$ preferably represents a hydrogen atom or a methyl group.

Both of g4 and g5 are the same as those described above in formula (g0-3).

In formula (g1-4) above, $R^{65b}$ represents a divalent hydrocarbon group which may have a substituent. Examples of $R^{65b}$ include the same groups as those listed above for $R^{65}$ in formula (g1-2), and of these, a linear aliphatic hydrocarbon group is preferable, a linear alkylene group is more preferable, a linear alkylene group of 1 to 5 carbon atoms is still more preferable, and a methylene group is the most desirable.

Specific examples of the structural units represented by the above general formulas (g1-1) to (g1-4) are shown below.

In each of the following formulas, $R^\alpha$ represents a hydrogen atom, a methyl group or a trifluoromethyl group.

[Chemical Formula 3]

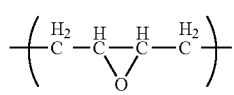
(g1-1-1)

[Chemical Formula 4]

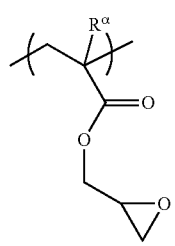
(g1-2-1)

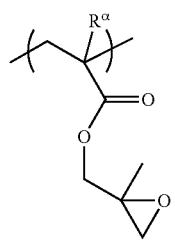
(g1-2-2)

[Chemical Formula 5]

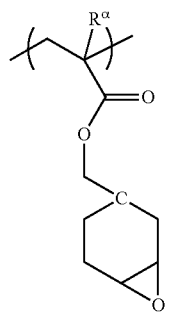
(g1-3-1)

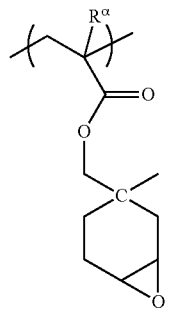
(g1-3-2)

-continued

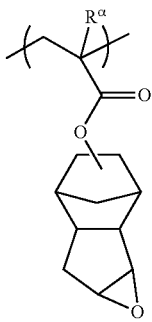
(g1-4-1)

The component (G) may include either a single type of structural unit (g1) or a combination of two or more types.

Of the various possibilities above, as the component (G), those including a structural unit represented by formula (g1-1) above, or those including a structural unit represented by formula (g1-2) or (g1-3) above are preferred.

In those cases where the component (G) includes a structural unit represented by formula (g1-1) above, a polymer (homopolymer) formed from a repeating single type of structural unit represented by formula (g1-1) is preferred.

In those cases where the component (G) includes a structural unit represented by formula (g1-2) or (g1-3) above, a copolymer containing the structural unit represented by formula (g1-2) and one or more of the other structural units described below; a copolymer containing the structural unit represented by formula (g1-3) and one or more of the other structural units described below; a copolymer formed from the repetition of the structural unit represented by formula (g1-2) and structural unit represented by formula (g1-3); or a copolymer containing the structural unit represented by formula (g1-2), structural unit represented by formula (g1-3) and one or more of the other structural units described below is preferred.

The amount of the structural unit (g1) within the component (G), based on the combined total of all the structural units that constitute the component (G), is preferably at least 10 mol %, more preferably 20 mol % or greater, still more preferably 30 mol % or greater, and most preferably 35 mol % or greater. This amount of the structural unit (g1) may also be 100 mol %.

By ensuring that the amount of the structural unit (g1) is at least as large as the lower limit of the above range, crosslinking efficiency with the substrate is enhanced, thereby improving the adhesion between the resist pattern and the substrate.

In those cases where the component (G) is a copolymer, the amount of the structural unit (g1) within the copolymer, based on the combined total of all the structural units that constitute the component (G), is preferably within a range from 10 to 80 mol %, more preferably from 20 to 80 mol %, and still more preferably from 30 to 80 mol %.

By ensuring that the amount of the structural unit (g1) is at least as large as the lower limit of the above range, crosslinking efficiency with the substrate is enhanced, thereby improving the adhesion between the resist pattern and the substrate. On the other hand, by ensuring that the amount of the structural unit (g1) is not more than the upper limit of the abovementioned range, lithography properties such as the resolution of the resist pattern and the suppression of pattern collapse can be improved during the formation of a surface modifying layer.

(Other Structural Units (g2))

If required, the component (G) may also include another structural unit (g2) besides the structural unit (g1), provided the inclusion of this other structural unit does not impair the effects of the present invention.

There are no particular limitations on this other structural unit (g2), although a structural unit derived from a compound that is copolymerizable with the compound that gives rise to the structural unit (g1) is preferred.

Specific examples of preferred forms of the structural unit (g2) include: structural units derived from acrylic acid and structural units derived from methacrylic acid (hereafter collectively referred to as "structural unit (g21)"), structural units derived from alkyl acrylates such as methyl acrylate and ethyl acrylate (wherein the alkyl group preferably contains 1 to 5 carbon atoms) (hereafter referred to as "structural unit (g22)"); structural units derived from alkyl methacrylates such as methyl methacrylate and ethyl methacrylate (wherein the alkyl group preferably contains 1 to 5 carbon atoms) (hereafter referred to as "structural unit (g23)"); and the structural units (a1) to (a4) described below in connection with the component (A1-1). Of the structural units (a1) to (a4), the structural units (a1), (a2) and (a4) are preferred, as they yield better suppression of pattern collapse and detachment of the resist pattern from the substrate, and the structural unit (a4) is particularly desirable.

The component (G) may include either a single type of structural unit (g2) or a combination of two or more types.

The amount of the structural unit (g2) within the component (G), based on the combined total of all the structural units that constitute the component (G), is preferably within a range from 1 to 30 mol %, more preferably from 5 to 25 mol %, and still more preferably from 10 to 20 mol %.

By ensuring that the amount of the structural unit (g2) is at least as large as the lower limit of the above-mentioned range, lithography properties such as the resolution of the resist pattern and the suppression of pattern collapse can be improved during the formation of a surface modifying layer. On the other hand, by ensuring that the amount of the structural unit (g2) is not more than the upper limit of the above-mentioned range, pattern collapse can be better suppressed during resist pattern formation. Further, a better balance can be achieved with the structural unit (g1).

In the surface modifying material of the present invention, as the component (G), either a single epoxy resin or a combination of two or more epoxy resins may be used.

In the present invention, preferred examples of the component (G) include: polymers (homopolymers) composed of a repeating structural unit (g1), and copolymers having a structural unit (g1) and a structural unit (g2).

Specific examples of such copolymers include copolymers having a structural unit (g1) and a structural unit (g21).

As the component (G), epoxy resins having structural units (G-1) to (G-3) as shown below are particularly desirable.

[Chemical Formula 6]

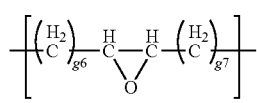

(G-1)

In the formula, each of g6 and g7 independently represents an integer of 1 to 5.

An epoxy resin according to formula (G-1) is a homopolymer composed of repeating structural units represented by the formula (G-1).

In the above formula, each of g6 and g7 preferably independently represents 1 or 2, and more preferably 1. Resins in which g6 and g7 are both 1 are particularly desirable.

[Chemical Formula 7]

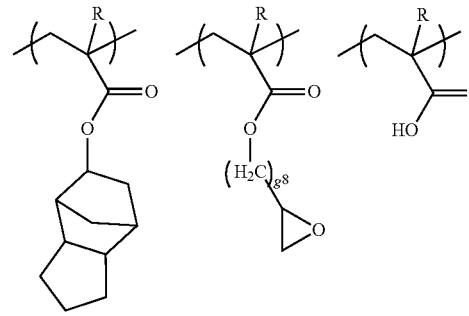

(G-2)

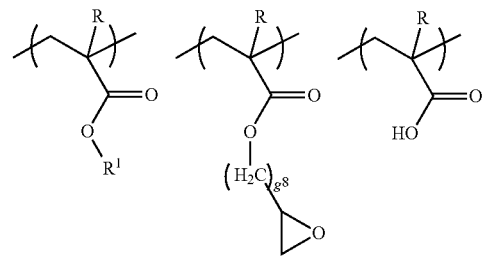

(G-3)

In the above formulas, R is the same as defined above, wherein the plurality of R groups may be the same or different, g8 represents an integer of 1 to 5, and $R^1$ represents an alkyl group.

In the above formulas, R is preferably a hydrogen atom or an alkyl group of 1 to 5 carbon atoms, and is most preferably a hydrogen atom or a methyl group.

g8 is preferably either 1 or 2, and most preferably 1.

$R^1$ is preferably an alkyl group of 1 to 5 carbon atoms, more preferably a methyl group or ethyl group, and most preferably a methyl group.

[Chemical Formula 8]

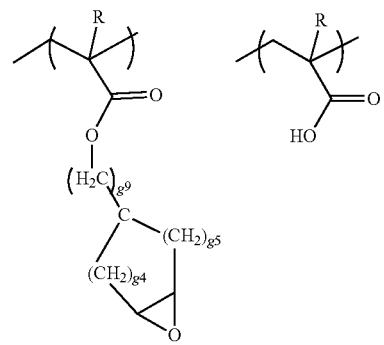

(G-4)

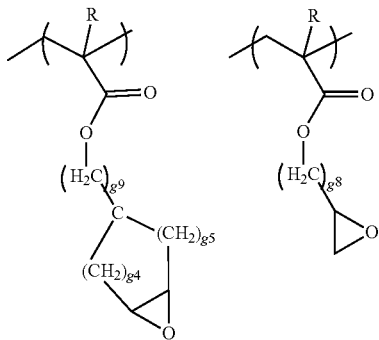
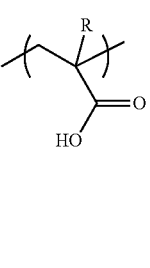

(G-5)

In the above formulas, R is the same as defined above, wherein the plurality of R groups may be the same or different, g8 is the same as defined above, g9 represents an integer of 1 to 5, and each of g4 and g5 is the same as defined above.

In the above formulas, R is preferably a hydrogen atom or an alkyl group of 1 to 5 carbon atoms, and is most preferably a hydrogen atom or a methyl group.

g8 is preferably either 1 or 2, and most preferably 1.
g9 is preferably either 1 or 2, and most preferably 1.
g4 is preferably either 1 or 2, and most preferably 2.
g5 is preferably either 1 or 2, and most preferably 1.

The polymer (homopolymer) or copolymer having a structure including a repeating structural unit (g1) can be obtained, for example, by subjecting monomers that give rise to the desired structural units to a conventional radical polymerization or the like using a radical polymerization initiator such as azobisisobutyronitrile (AIBN) or dimethyl azobisisobutyrate.

The dispersity (Mw/Mn) of the component (G) is preferably within a range from 1.0 to 6.5, more preferably from 1.5 to 6, and most preferably from 1.5 to 5. Here, "Mn" is the number average molecular weight.

The amount of the component (G) within the surface modifying material of the present invention is preferably within a range from 0.010 to 0.050% by weight, more preferably from 0.010 to 0.040% by weight, and still more preferably from 0.015 to 0.035% by weight.

By ensuring that the amount of the component (G) is at least as large as the lower limit of the above range, the adhesion between the resist pattern and the substrate improves. On the other hand, when a solution prepared by dissolving the component (G) in an organic solvent is used as the surface modifying material, it is preferable that the solution exhibit an adequate level of viscosity so that the solution can be easily applied uniformly on top of the substrate. By ensuring that the amount of the component (G) is not greater than the above-mentioned upper limit, an increase in the viscosity of the solution could be suppressed, and the solution could be easily applied uniformly on top of the substrate.

(Other Components)

The surface modifying material may include additional components other than the above-mentioned component (G).

Examples of other components include organic solvents, sulfur-containing organic compounds, nitrogen-containing organic compounds, surfactants, organic acids, photoacid generators, photobase generators, and dyes.

The organic solvent may be any organic solvent which can dissolve the component (G) to give a uniform solution, and examples thereof include those which have been generally used as organic solvents for chemically amplified resist compositions.

Specific examples of the organic solvents include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene.

These organic solvents can be used individually, or as a mixed solvent containing two or more different solvents.

There are no particular limitations on the form for the surface modifying material of the present invention as long as the material is capable of forming a surface modifying layer while including the component (G). For example, it may be a material that is used as a solution formed by dissolving the component (G) in an organic solvent, or it may be a material that is used as a sheet-like object formed by drying this solution.

<<Method of Forming Resist Pattern>>

The method of forming a resist pattern according to the present invention includes a step of forming a surface modifying layer on a substrate using a surface modifying material containing an epoxy resin having a weight average molecular weight of 1,000 to 50,000 (hereafter, referred to as "surface modifying layer formation step"); a step of forming a resist film on the substrate, on which the surface modifying layer has been formed, using a resist composition (hereafter, referred to as "resist film formation step"); a step of conducting exposure of the resist film (hereafter, referred to as "exposure step"); and a step of alkali developing the resist film to form a resist pattern (hereafter, referred to as "developing step").

[Surface Modifying Layer Formation Step]

The surface modifying material of the present invention described above is used as a surface modifying material.

Preferred examples of epoxy resins included in the surface modifying material include those having a repeating structural unit (g1) described above because the adhesion between the resist pattern and the substrate improves, and those in which the amount of the structural unit (g1), based on the combined total of all the structural units that constitute the epoxy resin, is at least 10 mol % are the most preferred.

Further, of the various possibilities, examples of preferred structures for the structural unit (g1) include at least one structural unit selected from the group consisting of structural units represented by general formulas (g1-1) to (g1-4) above, because the adhesion between the resist pattern and the substrate is particularly improved.

The substrate is not specifically limited, and a conventionally known substrate can be used. For example, substrates for electronic components, and such substrates having predetermined wiring patterns formed thereon can be used. Specific examples of the material of the substrate include metals such as silicon wafer, copper, chromium, iron and aluminum, as well as glass substrates. Suitable materials for the wiring pattern include copper, aluminum, nickel and gold.

There are no particular limitations on the method of forming a surface modifying layer on top of a substrate using a surface modifying material, and conventional methods can be employed.

For example, in those cases where a solution formed by dissolving the component (G) in an organic solvent (namely, a component (G) solution) is used as a surface modifying material, the component (G) solution is coated onto a substrate by a conventionally known method using a spinner or the like, and subjected to a baking treatment to volatilize the organic solvent, thereby forming a surface modifying layer.

In the bake treatment, the bake temperature is preferably within a range from 80 to 400° C., more preferably from 180 to 300° C., and the bake treatment time is preferably within a range from 15 to 120 seconds, and more preferably from 30 to 90 seconds.

In those cases where the epoxy resin used in the surface modifying material includes structural units represented by general formula (g1-1) above, the bake temperature described above is preferably within a range from 150 to 300° C., and more preferably from 180 to 300° C.

In those cases where the epoxy resin used in the surface modifying material includes structural units represented by general formula (g1-2) above, structural units represented by general formula (g1-3) above or structural units represented by general formula (g1-4) above, the bake temperature described above is preferably within a range from 85 to 350° C., and more preferably from 120 to 300° C.

By ensuring that all of the above bake temperatures are at least as large as the lower limit of the above ranges, the adhesion between the resist pattern and the substrate improves. On the other hand, by ensuring that all of the above bake temperatures are not more than the upper limit of the above ranges, the effect of improving the adhesion can be satisfactorily achieved.

The thickness of the surface modifying layer is preferably within a range from 0.01 to 3.5 nm, and more preferably from 0.3 to 2.5 nm. By ensuring that this thickness is at least as large as the lower limit of the above-mentioned range, there can be exerted such effects that the adhesion between the resist pattern and the substrate improves, and sufficient etching resistance can be achieved. By ensuring that this thickness is not more than the upper limit of the above range, the effects of providing the surface modifying layer can be satisfactorily achieved.

In those cases where the epoxy resin used in the surface modifying material includes structural units represented by general formula (g1-1) above and also the bake temperature is 240° C., the static contact angle of the surface of the surface modifying layer (namely, the surface on the opposite side of the substrate) is preferably not more than 65 degrees, more preferably not more than 60 degrees, and still more preferably from 30 to 50 degrees.

In those cases where the epoxy resin used in the surface modifying material includes structural units represented by general formula (g1-2) above, structural units represented by general formula (g1-3) above or structural units represented by general formula (g1-4) above, and also the bake temperature is 240° C., the static contact angle of the surface of the surface modifying layer (namely, the surface on the opposite side of the substrate) is preferably not more than 65 degrees, more preferably not more than 60 degrees, and still more preferably from 30 to 50 degrees.

By ensuring that all of the above static contact angles are within the above ranges, the adhesion between the resist pattern and the substrate improves.

The static contact angle of the surface of the surface modifying layer (namely, the surface on the opposite side of the substrate) can be measured using a commercially available measurement apparatus such as a DROP MASTER-700 (a product name, manufactured by Kyowa Interface Science Co. Ltd.), AUTO SLIDING ANGLE: SA-30DM (a product name, manufactured by Kyowa Interface Science Co. Ltd.), or AUTO DISPENSER: AD-31 (a product name, manufactured by Kyowa Interface Science Co. Ltd.) following the dropwise addition of a predetermined amount of water onto the surface of the surface modifying layer formed on top of the substrate.

[Resist Film Formation Step]

There are no particular limitations on the method of forming a resist film using a resist composition on top of a substrate on which a surface modifying layer has been formed, and conventional methods can be employed.

More specifically, a resist composition is applied on top of a substrate, on which a surface modifying layer has been formed, by a conventionally known method using a spinner or the like, and subjected to a bake treatment (a prebake) preferably under temperature conditions of 80 to 150° C. for preferably from 40 to 120 seconds, more preferably from 60 to 90 seconds, to volatilize the organic solvent, thereby forming a resist film.

The thickness of the resist film is preferably within a range from 50 to 500 nm, and more preferably from 50 to 450 nm. Ensuring a thickness within this range yields favorable effects, such as enabling the formation of a resist pattern at a high resolution, and ensuring that a satisfactory level of resistance to etching is obtained.

In the method of forming a resist pattern according to the present invention, the aforementioned resist composition is preferably a chemically amplified resist composition from the viewpoint of enabling microfabrication. Details of the resist composition will be described later.

[Exposure Step]

Subsequently, the resist film formed on top of the substrate, on which the surface modifying layer has been formed, is subjected to exposure.

More specifically, for example, the resist film formed in the above-mentioned manner is selectively exposed through a photomask, and is preferably subjected to PEB (post exposure baking) treatment.

The wavelength to be used for exposure is not particularly limited and the exposure can be conducted using radiations such as KrF excimer laser, ArF excimer laser, $F_2$ excimer laser, extreme ultraviolet rays (EUV), vacuum ultraviolet rays (VUV), electron beam (EB), X-rays, and soft X-rays.

The selective exposure of the resist film can be either a general exposure (dry exposure) conducted in air or an inert gas such as nitrogen, or immersion exposure.

In immersion exposure, exposure is conducted in a state where the region between the lens and the resist film formed on a wafer (which was conventionally filled with air or an inert gas such as nitrogen) is filled with a solvent (an immersion medium) that has a larger refractive index than the refractive index of air.

More specifically, in immersion lithography, the region between the resist film formed in the above-described manner and lens at the lowermost portion of the exposure apparatus is filled with a solvent (an immersion medium) that has a larger refractive index than the refractive index of air, and in this state, the resist film is subjected to exposure (immersion exposure) through a desired photomask.

The immersion medium preferably exhibits a refractive index larger than the refractive index of air but smaller than the refractive index of the resist film to be subjected to immersion exposure. The refractive index of the immersion medium is not particularly limited as long as it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

As the immersion medium, water is preferable in terms of cost, safety, environmental issues and versatility.

The PEB treatment is conducted at a bake temperature which changes (increases or decreases) the solubility of the resist film in an alkali developing solution.

In other words, for example, when the first resist film is composed of a chemically amplified resist composition, by conducting PEB treatment after exposure, diffusion of acid generated from the acid generator component within the resist film and change (increase or decrease) in solubility of the resist film in an alkali developing solution by the action of the acid proceed.

More specifically, for example, the resist film is selectively exposed through a photomask having a predetermined pattern, and then, post exposure bake (PEB) is preferably conducted under temperature conditions of 80 to 150° C. for 40 to 120 seconds, more preferably for 60 to 90 seconds.

[Developing Step]

Subsequently, after the exposure and preferably following the post exposure baking (PEB) treatment, the resist film is subjected to alkali developing to form a resist pattern.

The alkali developing can be conducted by conventional methods using an alkaline aqueous solution such as a 0.1 to 10% by weight aqueous solution of tetramethylammonium hydroxide (TMAH).

After the above alkali developing, a rinse treatment using water or the like may be conducted.

Further, after the above alkali developing, a bake treatment (post bake) may be conducted. The post bake (which is performed in order to remove water content after the alkali developing and rinsing) is generally conducted at about 100° C. preferably for 30 to 90 seconds.

According to the method of forming a resist pattern of the present invention, by conducing the aforementioned surface modifying layer formation step, resist film formation step, exposure step and developing step, a resist pattern that is faithful to the mask pattern can be obtained in addition to the effects of the present invention.

<<Method of Forming a Pattern>>

A method of forming a pattern according to the present invention includes a step of etching the substrate, on which a resist pattern has been formed by the method of forming a resist pattern according to the present invention described above.

Known methods can be employed for the etching treatment.

For example, by using hydrofluoric acid (HF), ammonium fluoride ($NH_4F$) or an aqueous solution having these materials mixed as an etchant, and immersing the substrate on which a resist pattern is formed in the etchant, a wet etching treatment is preferably conducted at a temperature from 23 to 60° C. for 15 to 3,600 seconds.

Examples of preferred methods for the dry etching treatment include oxygen plasma etching and etching that uses halogen-containing gas (preferably fluorocarbon gases such as $CF_4$ gas or $CHF_3$ gas).

Semiconductor devices or the like can be manufactured by subjecting the substrate to an etching treatment as described above.

In the method of forming a pattern according to the present invention, when conducting an etching treatment on the substrate on which a resist pattern has been formed, the edge of the resist pattern in particular is unlikely to detach from the substrate, thereby forming a high resolution pattern.

According to the surface modifying material of the present invention as well as the method of forming a resist pattern that uses the surface modifying material as described above, the effects of enabling formation of a resist pattern that exhibits excellent adhesion with a substrate, superior resistance to pattern collapse and high resolution can be achieved. Further, by employing the method of forming a pattern according to the present invention, the resist pattern is unlikely to detach from the substrate when an etching treatment is conducted.

The reasons for these effects have not been elucidated yet, but are thought to include the following.

Due to the intensive and extensive investigation conducted by the inventors of the present invention, it has become clear that in the formation of a resist pattern with minute size, when conventional methods that use epoxy resins with relatively high weight average molecular weight are employed for forming a surface modifying layer provided between a substrate and a resist film, the adhesion between the resist pattern and the substrate is inadequate, and also the deficiency (namely, the inadequate adhesion) becomes prominent as the thickness of the surface modifying layer reduces. It should be noted that the thickness of the surface modifying layer has also been reduced than before due to increased pattern miniaturization.

On the other hand, during further investigation, the inventors of the present invention have confirmed by measuring the contact angle of the surface of the surface modifying layer formed on top of the substrate that the contact angle values varied when conventional methods were employed.

The reason for this variance in the contact angle values is thought as follows. Because epoxy resins having a relatively high weight average molecular weight are used in the conventional methods, for example, a solution containing the epoxy resin (namely, a surface modifying material) exhibits a high level of viscosity, and it is thus difficult to uniformly apply the surface modifying material onto the substrate. For this reason, the action (crosslinking) between the substrate and the surface modifying material occurs ununiformly at the interface between the two, so that the substrate and the surface modifying layer do not bond together satisfactorily, thereby lowering the in-plane uniformity of the substrate. Accordingly, a resist pattern is formed on top of the substrate with low in-plane uniformity via the surface modifying layer, and thus the adhesion between the resist pattern and the substrate is inadequate and the resist pattern readily collapses.

On the other hand, it has been confirmed that the aforementioned contact angle values do not vary in the present invention where an epoxy resin having a weight average molecular weight within a specific range has been selected. From this observation, it has been considered as follows. The action (crosslinking) between the substrate and the surface modifying material occurs uniformly at the interface between the two, so that the substrate and the surface modifying layer are bonded together satisfactorily, thereby enhancing the in-plane uniformity of the substrate. As a result, the adhesion between the resist pattern and the substrate improves, the resist pattern collapse is suppressed, and the resolution is also enhanced.

Further in the method of forming a resist pattern according to the present invention, it is preferable to conduct a bake treatment at a high temperature when forming the surface modifying layer, since it improves the adhesion between the resist pattern and the substrate and makes the detachment of the resist pattern from the substrate unlikely even when an etching treatment is conducted.

The reasons why the aforementioned effects can be achieved by conducting the bake treatment at a high temperature have not been elucidated yet, but are thought to include the following.

It has been known from the formulas (i.e., the Dupre formula, Young formula and Young-Dupre formula) showing the relationship between the contact angle and the adhesion that the adhesive strength increases as the contact angle value reduces.

According to the investigation conducted by the inventors of the present invention, it has been confirmed that the contact angle values at the surface of the surface modifying layer formed on top of the substrate reduce as the bake temperature increases. From the formulas that show the aforementioned relationship, this observation indicates that the substrate and the surface modifying layer are bonded together more strongly as the bake temperature is increased. As a result, it is thought that the resist pattern formed via the surface modifying layer that is bonded strongly to the substrate exhibits superior adhesion with the substrate so as to achieve the aforementioned effects.

Because the resist pattern formed by the resist pattern formation method of the present invention also exhibits superior resolution, the method is also particularly useful as a method used in the formation of isolated line patterns.

Further, by employing the method of forming a resist pattern according to the present invention, a resist pattern exhibiting not only excellent resistance to pattern collapse and resolution but also favorable lithography properties such as exposure margin (EL margin) and mask reproducibility (such as mask linearity) can be formed.

Details of Resist Compositions:

There are no particular limitations on the resist composition used in the method of forming a resist pattern according to the present invention, and conventionally known compositions can be employed.

As mentioned above, the resist composition is preferably a chemically amplified resist composition, and specific examples of preferred compositions include those containing a base component (A) (hereafter, referred to as "component (A)") which exhibits changed solubility in an alkali developing solution under the action of acid and an acid generator component (B) (hereafter, referred to as "component (B)") which generates acid upon exposure.

With respect to the resist film formed using such chemically amplified resist composition on top of the substrate, on which the surface modifying layer of the present invention has been formed, when a selective exposure is conducted during the resist pattern formation, an acid is generated from the component (B) and the acid changes the solubility of the component (A) in an alkali developing solution. As a result, the solubility of the exposed portions of the resist film in an alkali developing solution is changed, whereas the solubility of the unexposed portions in an alkali developing solution remains unchanged. Accordingly, by subsequently performing alkali developing, the exposed portions are dissolved and removed in the case of a positive resist composition, whereas the unexposed portions are dissolved and removed in the case of a negative resist composition, and hence in either case, a resist pattern can be formed.

It is preferable that such a chemically amplified resist composition also include a nitrogen-containing organic compound (D).

Such a chemically amplified resist composition may be either a negative resist composition or a positive resist composition.

<Component (A)>

As the component (A), an organic compound typically used as a base component for a chemically amplified resist composition can be used alone, or two or more of such organic compounds can be mixed together.

Here, the term "base component" refers to an organic compound capable of forming a film, and is preferably an organic compound having a molecular weight of 500 or more. When the organic compound has a molecular weight of 500 or more, the film-forming ability is improved, and a resist pattern at the nano level can be more readily formed.

The "organic compounds having a molecular weight of 500 or more" which can be used as the base component can be broadly classified into non-polymers and polymers.

In general, as a non-polymer, any of those compounds having a molecular weight of at least 500 but less than 4,000 may be used. Hereafter, a non-polymer having a molecular weight of at least 500 but less than 4,000 is referred to as a "low molecular weight compound".

As a polymer, any of those compounds having a molecular weight of 1,000 or more may be used. Hereafter, a polymer having a molecular weight of 1,000 or more is referred to as a "polymeric compound". In the case of a polymeric compound, the "molecular weight" refers to the polystyrene-equivalent weight average molecular weight value determined by gel permeation chromatography (GPC). Hereafter, a polymeric compound is frequently referred to as simply a "resin".

As the component (A), a resin component that exhibits changed solubility in an alkali developing solution under the action of acid can be used, and a low molecular weight compound component that exhibits changed solubility in an alkali developing solution under the action of acid may also be used.

In those cases where the resist composition of the present invention is a "positive chemically amplified resist composition", a base component (hereafter referred to as "component (A1)") that exhibits increased solubility in an alkali developing solution under the action of acid is used as the component (A).

The component (A1) is substantially insoluble in an alkali developing solution prior to exposure, but when acid is generated from the component (B) upon exposure, the action of the acid causes an increase in the solubility of the component (A) in an alkali developing solution. Therefore, in the formation of a resist pattern, by conducting selective exposure of a resist film formed by applying the positive chemically amplified resist composition onto a substrate, the exposed portions change from an insoluble state to a soluble state in an alkali developing solution, whereas the unexposed portions remain substantially insoluble in an alkali developing solution, and hence, a resist pattern can be formed by alkali developing.

In the resist composition of the present invention, the component (A) is preferably a base component that exhibits increased solubility in an alkali developing solution under the action of acid (namely, the component (A1)). Namely, the resist composition of the present invention is preferably a positive chemically amplified resist composition.

The component (A1) may be a resin component (A1-1) that exhibits increased solubility in an alkali developing solution under the action of acid (hereafter, referred to as "component (A1-1)"), a low molecular weight compound (A1-2) that exhibits increased solubility in an alkali developing solution under the action of acid (hereafter, referred to as "component (A1-2)"), or a mixture of the component (A1-1) and the component (A1-2). Of these possibilities, the component (A1) preferably includes a component (A1-1).

[Component (A1-1)]

As the component (A1-1), a single resin component (base resin) typically used as a base component for a chemically amplified resist composition can be used alone, or two or more of such resin components can be mixed together.

The component (A1-1) preferably includes a structural unit derived from an acrylate ester.

Of the various possibilities, it is particularly desirable that the component (A1-1) have a structural unit (a1) derived from an acrylate ester containing an acid dissociable, dissolution inhibiting group.

Further, it is preferable that the component (A1-1) have a structural unit (a2) derived from an acrylate ester containing a lactone-containing cyclic group, as well as the structural unit (a1).

Moreover, in addition to the structural unit (a1), or in addition to the combination of the structural units (a1) and (a2), the component (A1-1) preferably also has a structural unit (a3) derived from an acrylate ester that contains a polar group-containing aliphatic hydrocarbon group.

Furthermore, in addition to the structural unit (a1), in addition to the combination of the structural units (a1) and (a2), or in addition to the combination of the structural units (a1) to (a3), the component (A1-1) preferably also has a structural unit (a4) derived from an acrylate ester that contains a non-acid-dissociable aliphatic polycyclic group.

(Structural Unit (a1))

The structural unit (a1) is a structural unit derived from an acrylate ester containing an acid dissociable, dissolution inhibiting group.

As the acid dissociable, dissolution inhibiting group in the structural unit (a1), any of the groups that have been proposed as acid dissociable, dissolution inhibiting groups for the base resins of chemically amplified resists can be used, provided the group has an alkali dissolution-inhibiting effect that renders the entire component (A1-1) insoluble in an alkali developing solution prior to dissociation, and then following dissociation by the action of acid, increases the solubility of the entire component (A1-1) in the alkali developing solution. Generally, groups that form either a cyclic or chain-like tertiary alkyl ester with the carboxyl group of the (meth)acrylic acid or the like, and acetal-type acid dissociable, dissolution inhibiting groups such as alkoxyalkyl groups are the most widely known.

Here, a "tertiary alkyl ester" describes a structure in which an ester is formed by substituting the hydrogen atom of a carboxyl group with a chain-like or cyclic tertiary alkyl group, and a tertiary carbon atom within the chain-like or cyclic tertiary alkyl group is bonded to the oxygen atom at the terminal of the carbonyloxy group (—C(=O)—O—). In this tertiary alkyl ester, the action of acid causes cleavage of the bond between the oxygen atom and the tertiary carbon atom.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid dissociable, dissolution inhibiting groups".

Examples of tertiary alkyl ester-type acid dissociable, dissolution inhibiting groups include aliphatic branched, acid dissociable, dissolution inhibiting groups and aliphatic cyclic group-containing acid dissociable, dissolution inhibiting groups.

In the claims and description of the present invention, the term "aliphatic branched" refers to a branched structure having no aromaticity.

The "aliphatic branched, acid-dissociable, dissolution-inhibiting group" is not limited to structures constituted of only carbon atoms and hydrogen atoms (not limited to hydrocarbon groups), but is preferably a hydrocarbon group.

Further, the "hydrocarbon group" may be either saturated or unsaturated, but is preferably saturated.

Examples of aliphatic branched, acid dissociable, dissolution inhibiting groups include tertiary alkyl groups of 4 to 8 carbon atoms, and specific examples include a tert-butyl group, tert-pentyl group and tert-heptyl group.

The term "aliphatic cyclic group" refers to a monocyclic group or polycyclic group that has no aromaticity.

The "aliphatic cyclic group" within the structural unit (a1) may or may not have a substituent. Examples of the substituent include lower alkyl groups of 1 to 5 carbon atoms, lower alkoxy groups of 1 to 5 carbon atoms, a fluorine atom, fluorinated lower alkyl groups of 1 to 5 carbon atoms, and an oxygen atom (=O).

The basic ring of the "aliphatic cyclic group" exclusive of substituents is not limited to be constituted from only carbon and hydrogen (not limited to hydrocarbon groups), but is preferably a hydrocarbon group.

Further, the "hydrocarbon group" may be either saturated or unsaturated, but is preferably saturated. Furthermore, the "aliphatic cyclic group" is preferably a polycyclic group.

Examples of such aliphatic cyclic groups include groups in which one or more hydrogen atoms have been removed from a monocycloalkane or a polycycloalkane such as a bicycloalkane, tricycloalkane or tetracycloalkane, which may or may not be substituted with a lower alkyl group, a fluorine atom or a fluorinated alkyl group. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

Examples of the aliphatic cyclic group-containing acid dissociable, dissolution inhibiting group include groups having a tertiary carbon atom within the ring structure of a cyclic alkyl group. Specific examples include a 2-methyl-2-adamantyl group and a 2-ethyl-2-adamantyl group. Alternatively, groups having an aliphatic cyclic group such as an adamantyl group, cyclohexyl group, cyclopentyl group, norbornyl group, tricyclodecyl group or tetracyclododecyl group, and a branched alkylene group having a tertiary carbon atom bonded to the aliphatic cyclic group, such as the groups bonded to the oxygen atom of the carbonyloxy group (—C(O)—O—) in the structural units represented by general formulas (a1″-1) to (a1″-6) shown below, may also be used.

[Chemical Formula 9]

(a1″-1)

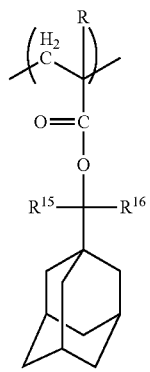

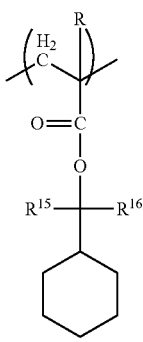

(a1″-2)

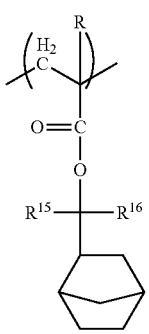

(a1″-3)

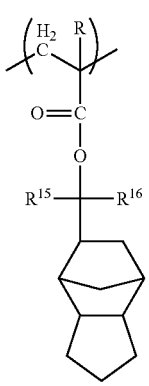

(a1″-4)

(a1″-5)

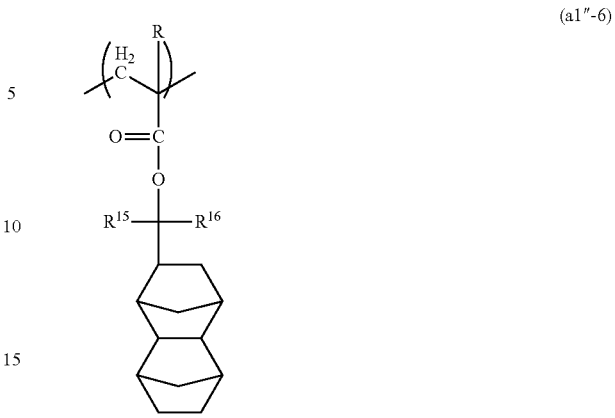

(a1″-6)

In the above formulas, each R represents a hydrogen atom, a lower alkyl group or a halogenated lower alkyl group, and each of $R^{15}$ and $R^{16}$ independently represents an alkyl group (which may be linear or branched, and preferably has 1 to 5 carbon atoms).

In general formulas (a1″-1) to (a1″-6) above, the lower alkyl group or halogenated lower alkyl group for R are the same as the lower alkyl group or halogenated lower alkyl group which can be bonded to the α-position of the aforementioned acrylate ester.

An "acetal-type acid dissociable, dissolution inhibiting group" generally substitutes a hydrogen atom at the terminal of an alkali-soluble group such as a carboxyl group or hydroxyl group, so as to be bonded with an oxygen atom. When acid is generated upon exposure, the generated acid acts to break the bond between the acetal-type acid dissociable, dissolution inhibiting group and the oxygen atom to which the acetal-type, acid dissociable, dissolution inhibiting group is bonded.

Examples of acetal-type acid dissociable, dissolution inhibiting groups include groups represented by general formula (p1) shown below.

[Chemical Formula 10]

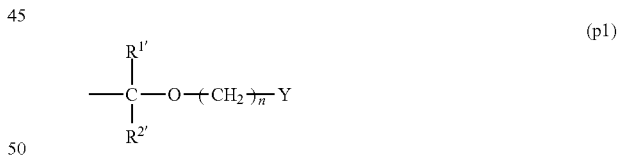

(p1)

In the formula, each of $R^{1'}$ and $R^{2'}$ independently represents a hydrogen atom or a lower alkyl group, n represents an integer of 0 to 3, and Y represents a lower alkyl group or an aliphatic cyclic group.

In the above formula, n is preferably an integer of 0 to 2, more preferably 0 or 1, and is most preferably 0.

Examples of the lower alkyl group for $R^{1'}$ and $R^{2'}$ include the same lower alkyl groups as those listed above for R, although a methyl group or ethyl group is preferable, and a methyl group is particularly desirable.

Of the various possibilities, it is preferable that at least one of $R^{1'}$ and $R^{2'}$ be a hydrogen atom. In other words, it is preferable that the acid dissociable, dissolution inhibiting group (p1) is a group represented by general formula (p1-1) shown below.

[Chemical Formula 11]

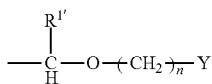
(p1-1)

In the formula, R$^{1'}$, n and Y are the same as defined above for formula (p1).

Examples of the lower alkyl group for Y include the same groups as those listed above for the lower alkyl group for R.

As the aliphatic cyclic group for Y, any of the monocyclic or polycyclic aliphatic cyclic groups that have been proposed for conventional ArF resists and the like may be appropriately selected for use. For example, the same groups as those described above in connection with the "aliphatic cyclic group" may be used.

Further, as the acetal-type, acid dissociable, dissolution inhibiting group, groups represented by general formula (p2) shown below may also be used.

[Chemical Formula 12]

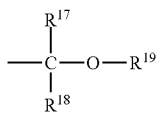
(p2)

In the formula, R$^{17}$ and R$^{18}$ each independently represents a linear or branched alkyl group or a hydrogen atom, and R$^{19}$ represents a linear, branched or cyclic alkyl group. Alternatively, each of R$^{17}$ and R$^{19}$ may independently represent a linear or branched alkylene group, wherein R$^{17}$ is bonded to R$^{19}$ to form a ring.

The alkyl group for R$^{17}$ or R$^{18}$ preferably has 1 to 15 carbon atoms, and may be either linear or branched, although an ethyl group or methyl group is preferable, and a methyl group is the most preferred.

It is particularly desirable that either one of R$^{17}$ and R$^{18}$ be a hydrogen atom, and the other be a methyl group.

R$^{19}$ represents a linear, branched or cyclic alkyl group which preferably has 1 to 15 carbon atoms, and may be any of linear, branched or cyclic.

When R$^{19}$ represents a linear or branched alkyl group, it is preferably an alkyl group of 1 to 5 carbon atoms, more preferably an ethyl group or methyl group, and most preferably an ethyl group.

When R$^{19}$ represents a cycloalkyl group, it preferably has 4 to 15 carbon atoms, more preferably 4 to 12 carbon atoms, and most preferably 5 to 10 carbon atoms. Examples of the cyclic alkyl group include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group. Specific examples include groups in which one or more hydrogen atoms have been removed from a monocycloalkane such as cyclopentane and cyclohexane, or a polycycloalkane such as adamantane, norbornane, isobornane, tricyclodecane or tetracyclododecane. Among these, a group in which one or more hydrogen atoms have been removed from adamantane is preferable.

Further, in the above formula, each of R$^{17}$ and R$^{19}$ may independently represent a linear or branched alkylene group (and preferably an alkylene group of 1 to 5 carbon atoms), wherein R$^{19}$ is bonded to R$^{17}$.

In such a case, a cyclic group is formed by R$^{17}$, R$^{19}$, the oxygen atom having R$^{19}$ bonded thereto and the carbon atom having the oxygen atom and R$^{17}$ bonded thereto. Such a cyclic group is preferably a 4- to 7-membered ring, and more preferably a 4- to 6-membered ring. Specific examples of the cyclic group include tetrahydropyranyl group and tetrahydrofuranyl group.

As the structural unit (a1), it is preferable to use at least one type of structural unit selected from the group consisting of structural units represented by general formula (a1-0-1) shown below and structural units represented by general formula (a1-0-2) shown below.

[Chemical Formula 13]

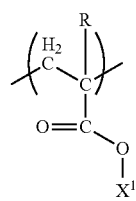
(a1-0-1)

In the formula, R represents a hydrogen atom, a lower alkyl group or a halogenated lower alkyl group, and X$^1$ represents an acid dissociable, dissolution inhibiting group.

[Chemical Formula 14]

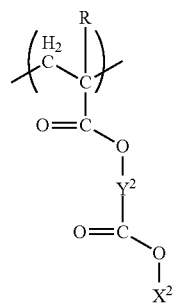
(a1-0-2)

In the formula, R represents a hydrogen atom, a lower alkyl group or a halogenated lower alkyl group, X$^2$ represents an acid dissociable, dissolution inhibiting group, and Y$^2$ represents a divalent linking group.

In general formula (a1-0-1), the lower alkyl group or halogenated lower alkyl group for R is the same as defined above for the lower alkyl group or halogenated lower alkyl group that may be bonded to the α-position of an aforementioned acrylate ester.

X$^1$ is not particularly limited, as long as it is an acid dissociable, dissolution inhibiting group, and examples include the aforementioned tertiary alkyl ester-type acid dissociable, dissolution inhibiting groups and acetal-type acid dissociable, dissolution inhibiting groups, and of these, tertiary alkyl ester-type acid dissociable, dissolution inhibiting groups are preferable.

In general formula (a1-0-2), R is as defined above.

X$^2$ is the same as X$^1$ in general formula (a1-0-1).

Examples of the divalent linking group for $Y^2$ include alkylene groups, divalent aliphatic cyclic groups, and divalent linking groups containing a hetero atom.

Examples of the aliphatic cyclic group include the same groups as those used above within the description of the "aliphatic cyclic group", with the exception that two or more hydrogen atoms have been removed therefrom.

When $Y^2$ represents an alkylene group, the group preferably contains 1 to 10 carbon atoms, more preferably 1 to 6 carbon atoms, still more preferably 1 to 4 carbon atoms, and most preferably 1 to 3 carbon atoms.

When $Y^2$ represents a divalent aliphatic cyclic group, a group in which two or more hydrogen atoms have been removed from cyclopentane, cyclohexane, norbornane, isobornane, adamantane, tricyclodecane or tetracyclododecane is particularly desirable.

When $Y^2$ represents a divalent linking group containing a hetero atom, specific examples of the divalent linking group containing a hetero atom include —O—, —C(=O)—O—, —C(=O)—, —O—C(=O)—O—, —C(=O)—NH—, —NH— (wherein H may be substituted with a substituent such as an alkyl group or acyl group or the like), —S—, —S(=O)$_2$—, —S(=O)$_2$—O—, and —A—O (oxygen atom)—B— (wherein each of A and B independently represents a divalent hydrocarbon group which may have a substituent).

In those cases where $Y^2$ is —NH— and the H has been substituted with a substituent such as an alkyl group or acyl group or the like, the number of carbon atoms within the substituent is preferably from 1 to 10 carbon atoms, more preferably from 1 to 8 carbon atoms, and most preferably from 1 to 5 carbon atoms.

When $Y^2$ represents —A—O—B—, each of A and B independently represents a divalent hydrocarbon group which may have a substituent.

The description that the hydrocarbon group "may have a substituent" means that some or all of the hydrogen atoms within the hydrocarbon group may be substituted with a group or with an atom other than a hydrogen atom.

The hydrocarbon group for A may be either an aliphatic hydrocarbon group or an aromatic hydrocarbon group. An "aliphatic hydrocarbon group" refers to a hydrocarbon group that has no aromaticity.

The aliphatic hydrocarbon group for A may be saturated or unsaturated, but in general, is preferably saturated.

Specific examples of the aliphatic hydrocarbon group for A include linear and branched aliphatic hydrocarbon groups, and aliphatic hydrocarbon groups containing a ring in the structure thereof.

The linear or branched aliphatic hydrocarbon group preferably has 1 to 10 carbon atoms, more preferably 1 to 8, still more preferably 2 to 5, and most preferably 2 carbon atoms.

As the linear aliphatic hydrocarbon group, a linear alkylene group is preferable, and specific examples include a methylene group, ethylene group [—(CH$_2$)$_2$—], trimethylene group [—(CH$_2$)$_3$—], tetramethylene group [—(CH$_2$)$_4$—] and pentamethylene group [—(CH$_2$)$_5$—].

As the branched aliphatic hydrocarbon group, a branched alkylene group is preferable, and specific examples include alkylalkylene groups, including alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—, alkylethylene groups such as —CH(CH$_3$)CH$_2$—, —CH(CH$_3$)CH(CH$_3$)—, —C(CH$_3$)$_2$CH$_2$— and —CH(CH$_2$CH$_3$)CH$_2$—, alkyltrimethylene groups such as —CH(CH$_3$)CH$_2$CH$_2$— and —CH$_2$CH(CH$_3$)CH$_2$—, and alkyltetramethylene groups such as —CH(CH$_3$)CH$_2$CH$_2$CH$_2$— and —CH$_2$CH(CH$_3$)CH$_2$CH$_2$—. As the alkyl group within the alkylalkylene group, a linear alkyl group of 1 to 5 carbon atoms is preferable.

The chain-like aliphatic hydrocarbon group may or may not have a substituent. Examples of the substituent include a fluorine atom, a fluorinated lower alkyl group of 1 to 5 carbon atoms, and an oxygen atom (=O).

Examples of the hydrocarbon group containing a ring in the structure thereof include cyclic aliphatic hydrocarbon groups (groups in which two hydrogen atoms have been removed from an aliphatic hydrocarbon ring), and groups in which this type of cyclic aliphatic hydrocarbon group is either bonded to the terminal of an aforementioned chain-like aliphatic hydrocarbon group, or interposed within the chain of an aforementioned chain-like aliphatic hydrocarbon group.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic group, a group in which two hydrogen atoms have been removed from a monocycloalkane of 3 to 6 carbon atoms is preferable. Specific examples of the monocycloalkane include cyclopentane and cyclohexane.

As the polycyclic group, a group in which two hydrogen atoms have been removed from a polycycloalkane of 7 to 12 carbon atoms is preferable. Specific examples of the polycycloalkane include adamantane, norbornane, isobornane, tricyclodecane and tetracyclododecane.

The cyclic aliphatic hydrocarbon group may or may not have a substituent. Examples of the substituent include lower alkyl groups of 1 to 5 carbon atoms, a fluorine atom, fluorinated lower alkyl groups of 1 to 5 carbon atoms, and an oxygen atom (=O).

As the group A, a linear aliphatic hydrocarbon group is preferred, a linear alkylene group is more preferred, a linear alkylene group of 2 to 5 carbon atoms is still more preferred, and an ethylene group is the most desirable.

Specific examples of the aromatic hydrocarbon group for A include divalent aromatic hydrocarbon groups in which an additional hydrogen atom has been removed from the nucleus of a monovalent aromatic hydrocarbon group such as a phenyl group, biphenyl group, fluorenyl group, naphthyl group, anthryl group or phenanthryl group; aromatic hydrocarbon groups in which a portion of the carbon atoms that constitute the ring of an aforementioned divalent aromatic hydrocarbon group have been substituted with a hetero atom such as an oxygen atom, sulfur atom or nitrogen atom; and aromatic hydrocarbon groups in which an additional hydrogen atom has been removed from the nucleus of an arylalkyl group such as a benzyl group, phenethyl group, 1-naphthylmethyl group, 2-naphthylmethyl group, 1-naphthylethyl group or 2-naphthylethyl group.

The aromatic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

Examples of the hydrocarbon group for B include the same divalent hydrocarbon groups as those listed above for A.

As the group B, a linear or branched aliphatic hydrocarbon group is preferred, and a methylene group or an alkylmethylene group is particularly desirable.

The alkyl group within the alkylmethylene group is preferably a linear alkyl group of 1 to 5 carbon atoms, more preferably a linear alkyl group of 1 to 3 carbon atoms, and most preferably a methyl group.

Specific examples of the structural unit (a1) include structural units represented by general formulas (a1-1) to (a1-4) shown below.

[Chemical Formula 15]

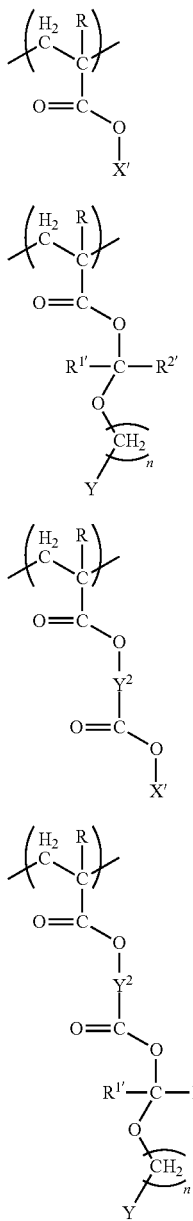

In the above formulas, X' represents a tertiary alkyl ester-type acid dissociable, dissolution inhibiting group, Y represents a lower alkyl group of 1 to 5 carbon atoms or an aliphatic cyclic group, n represents an integer of 0 to 3, $Y^2$ represents a divalent linking group, R is the same as defined above for R, and each of $R^{1'}$ and $R^{2'}$ independently represents a hydrogen atom or a lower alkyl group of 1 to 5 carbon atoms.

In the formulas above, examples of X' include the same groups as the tertiary alkyl ester-type acid dissociable, dissolution inhibiting groups listed above for $X^1$.

Examples of $R^{1'}$, $R^{2'}$, n and Y include the same groups and numbers as those listed above for $R^{1'}$, $R^{2'}$, n and Y in general formula (p1) described above in connection with the "acetal-type acid dissociable, dissolution inhibiting groups".

Examples of $Y^2$ include the same groups as those listed above for $Y^2$ in general formula (a1-0-2).

Specific examples of structural units represented by general formula (a1-1) to (a1-4) are shown below.

In each of the following formulas, $R^\alpha$ represents a hydrogen atom, a methyl group or a trifluoromethyl group.

[Chemical Formula 16]

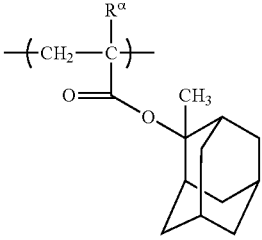

(a1-1-1)

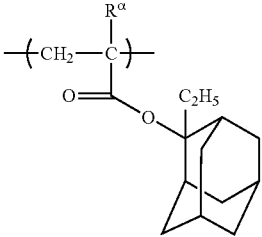

(a1-1-2)

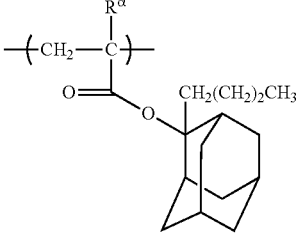

(a1-1-3)

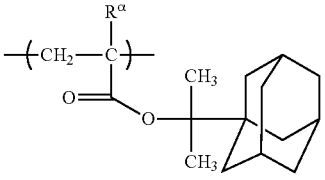

(a1-1-4)

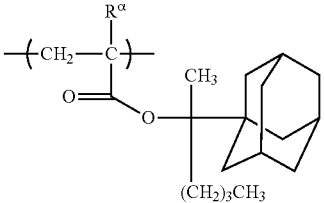

(a1-1-5)

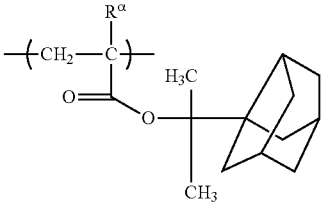

(a1-1-6)

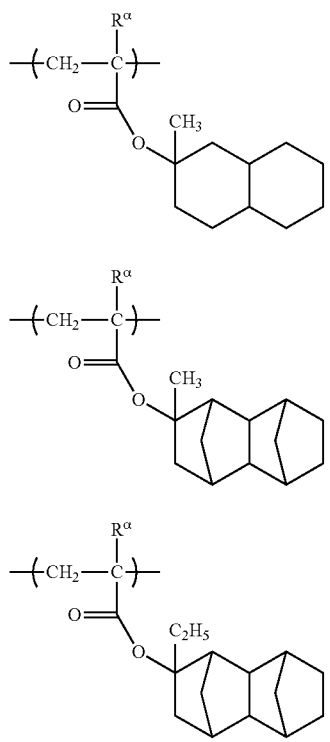
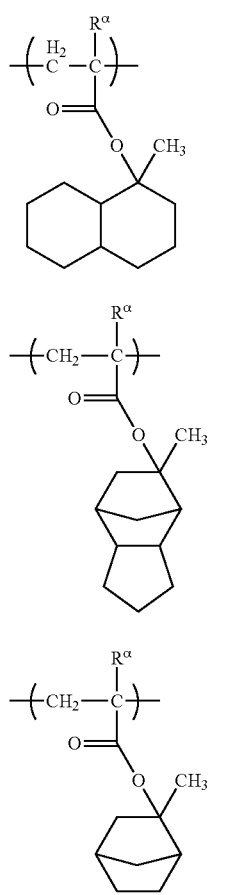
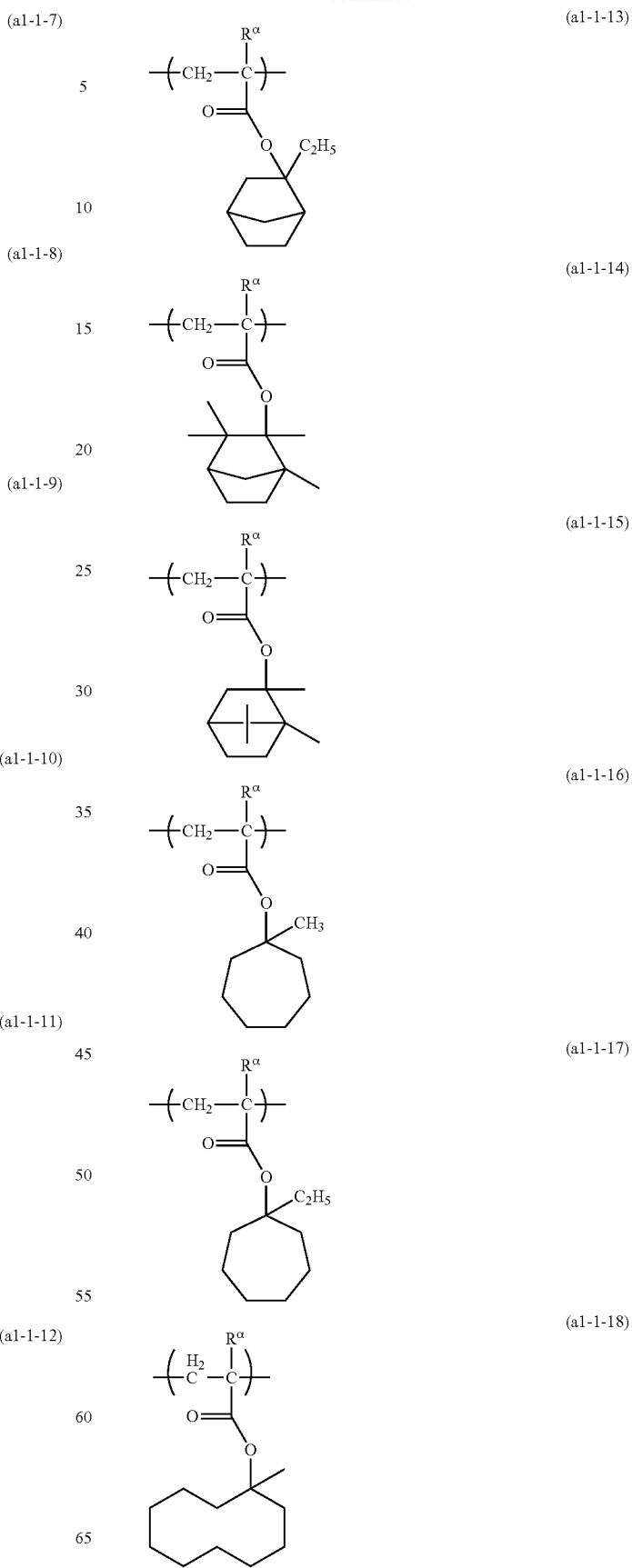

(a1-1-19) 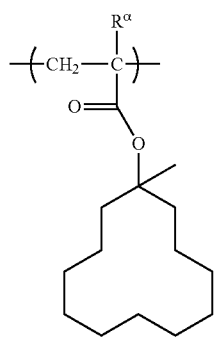
(a1-1-20) 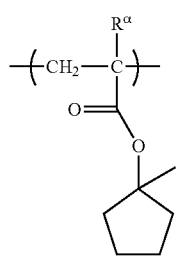
(a1-1-21) 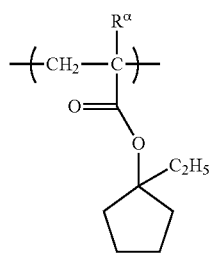
[Chemical Formula 18]
(a1-1-22) 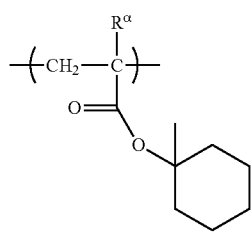
(a1-1-23) 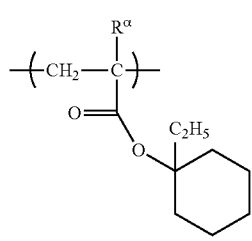
(a1-1-24) 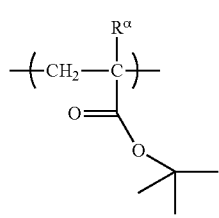
(a1-1-25) 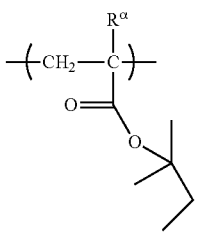
(a1-1-26) 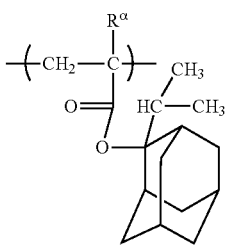
(a1-1-27) 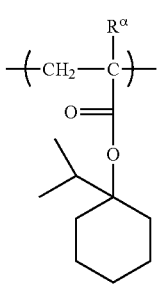
(a1-1-28) 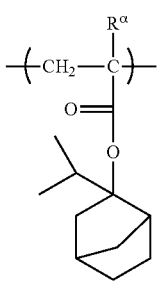
(a1-1-29) 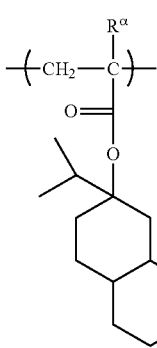

(a1-1-30)
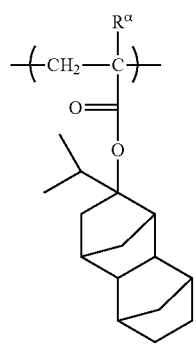
(a1-1-31)
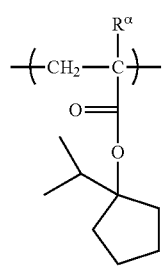
(a1-1-32)
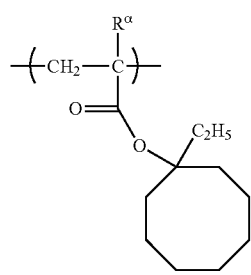
(a1-1-33)
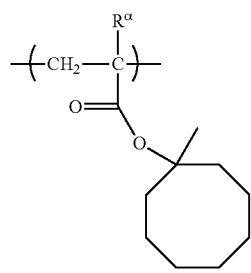
[Chemical Formula 19]
(a1-2-1)
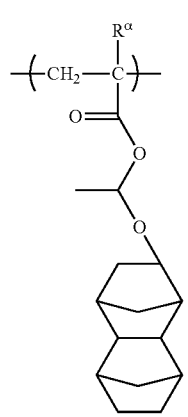
(a1-2-2)
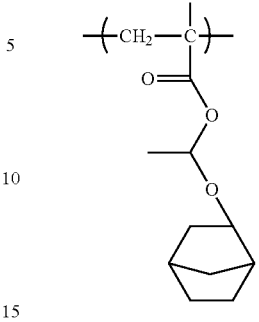
(a1-2-3)
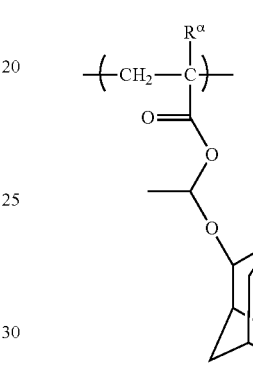
(a1-2-4)
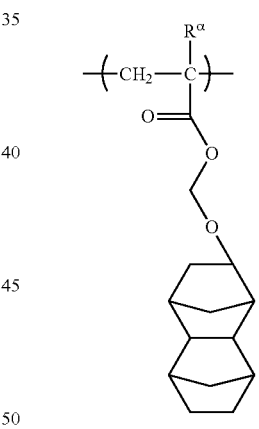
(a1-2-5)
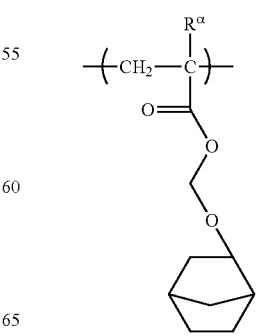

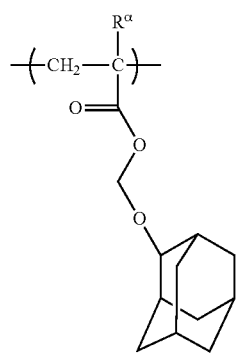
(a1-2-6)
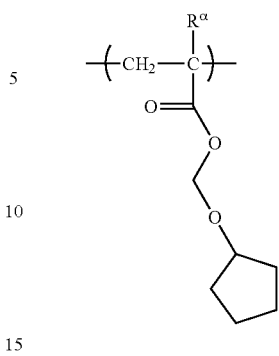
(a1-2-10)
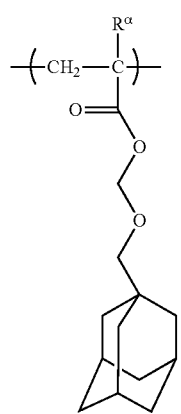
(a1-2-7)
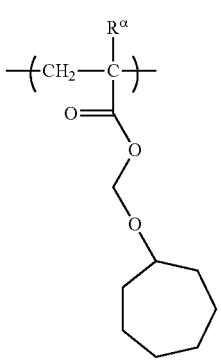
(a1-2-11)
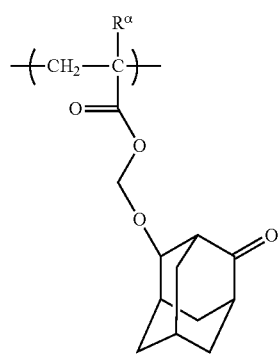
(a1-2-8)
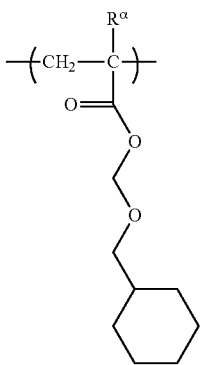
(a1-2-12)
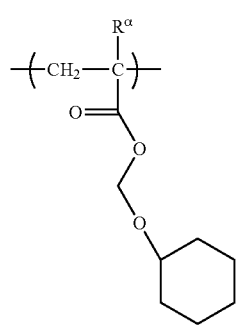
(a1-2-9)
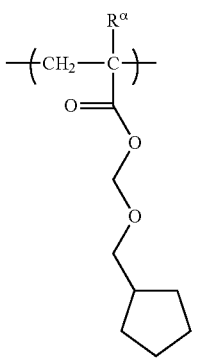
(a1-2-13)

(a1-2-14) 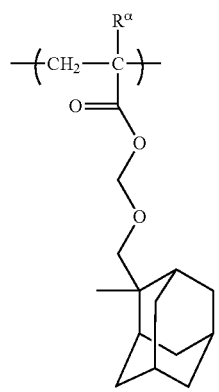
(a1-2-15) 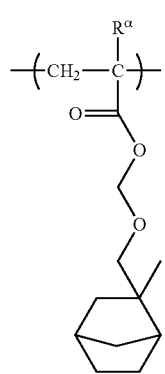
(a1-2-16) 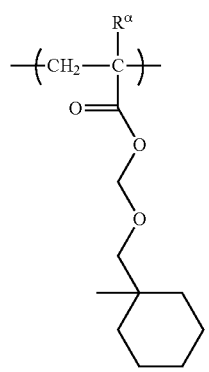
(a1-2-17) 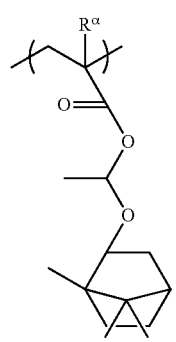
(a1-2-18) 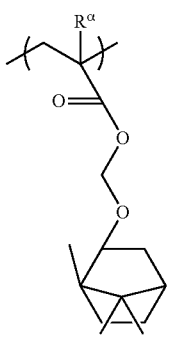
(a1-2-19) 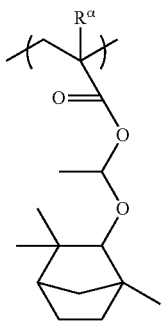
(a1-2-20) 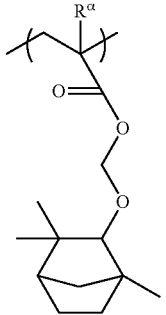
(a1-2-21) 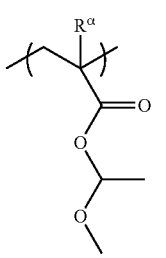
(a1-2-22) 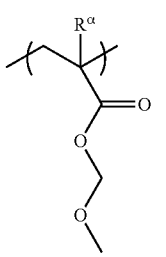

(a1-2-23)
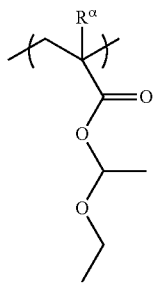
(a1-2-24)
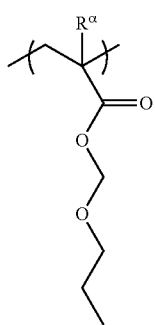
[Chemical Formula 20]
(a1-3-1)
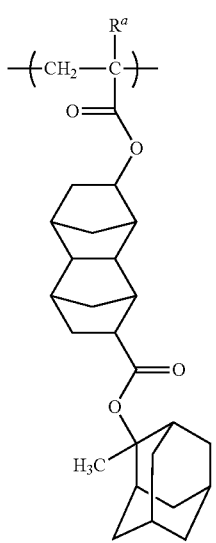
(a1-3-2)
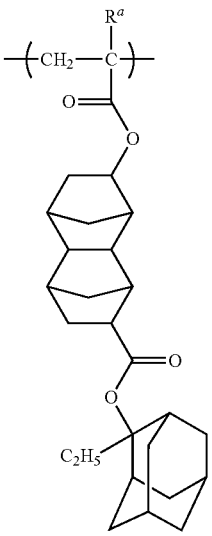
(a1-3-3)
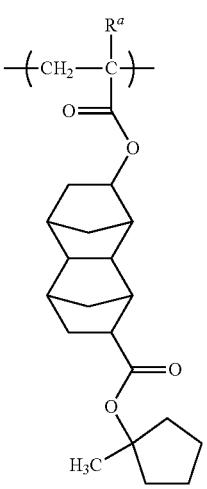
(a1-3-4)
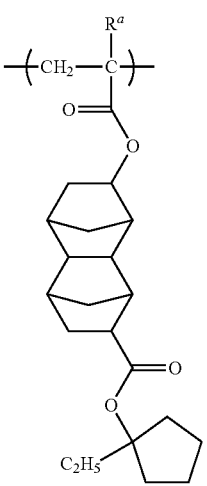

(a1-3-5)
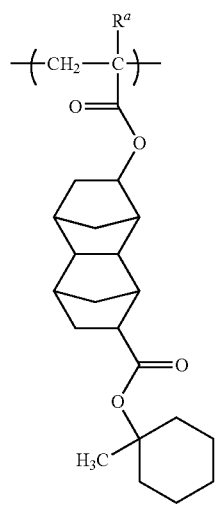
(a1-3-8)
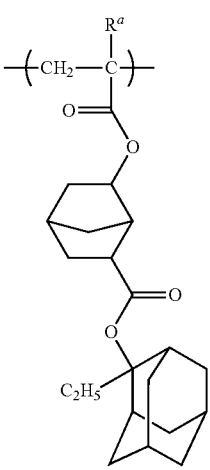
(a1-3-6)
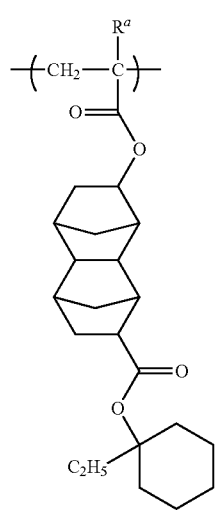
(a1-3-9)
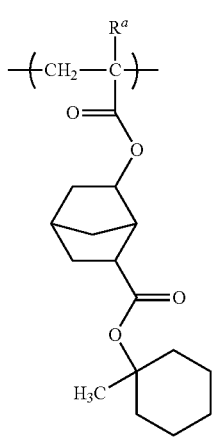
(a1-3-7)
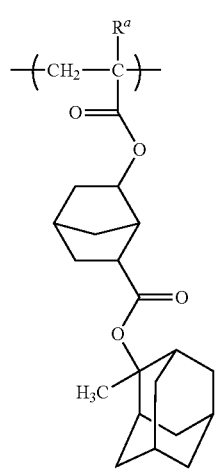
(a1-3-10)
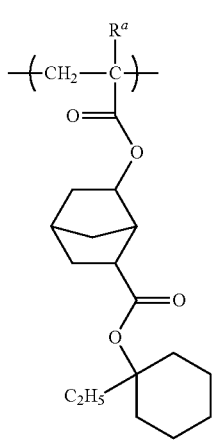

(a1-3-11) 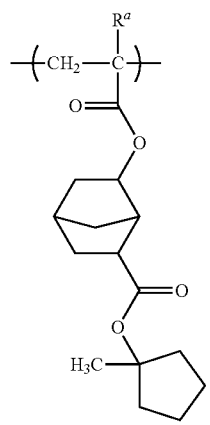
(a1-3-12) 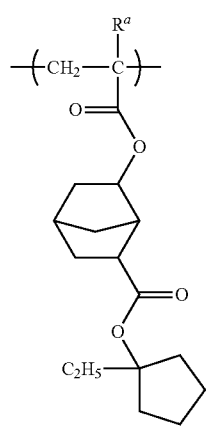
(a1-3-13) 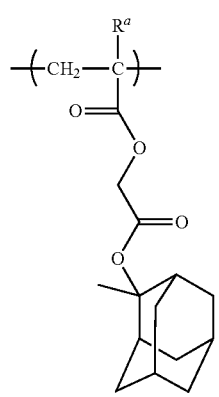
(a1-3-14) 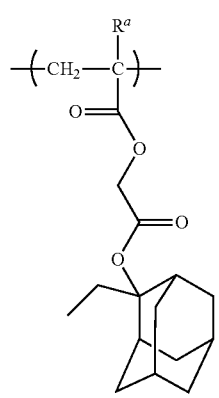
(a1-3-15) 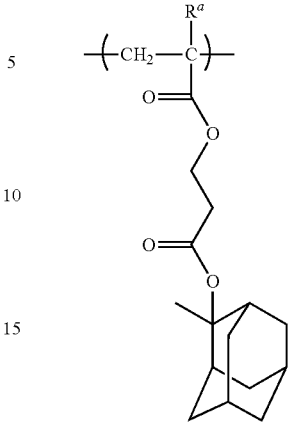
(a1-3-16) 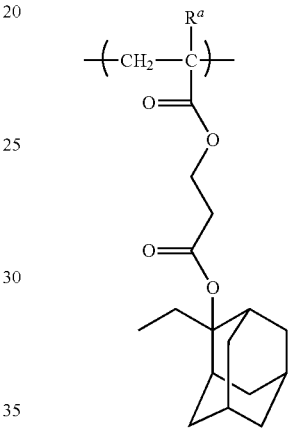
(a1-3-17) 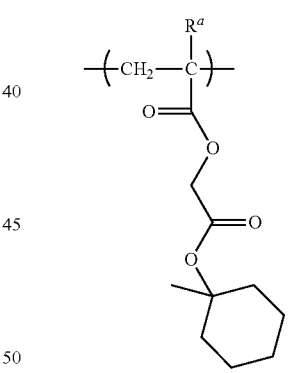
(a1-3-18) 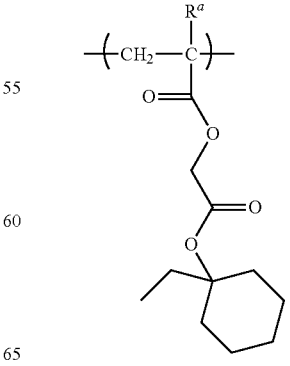

[Chemical Formula 21]
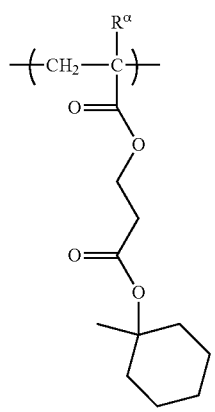 (a1-3-19)
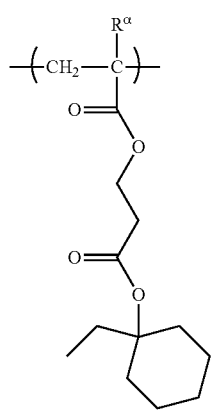 (a1-3-20)
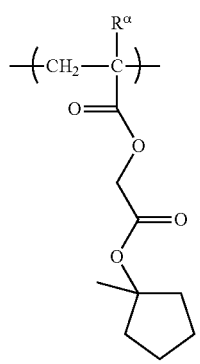 (a1-3-21)
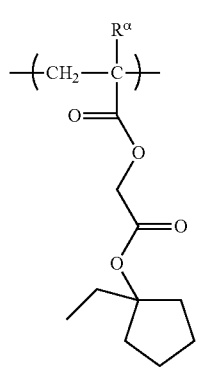 (a1-3-22)
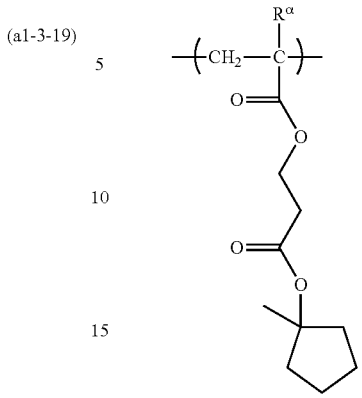 (a1-3-23)
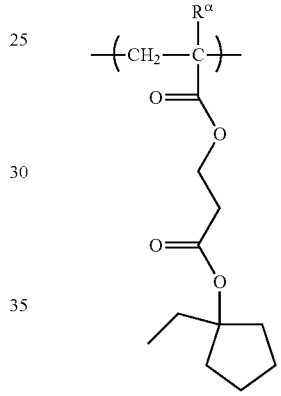 (a1-3-24)
[Chemical Formula 22]
 (a1-3-25)

(a1-3-26)
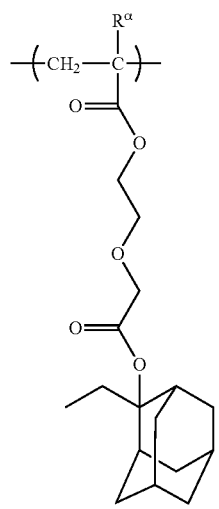
(a1-3-27)
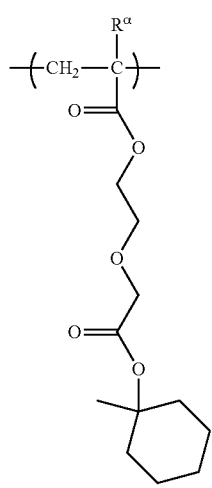
(a1-3-28)
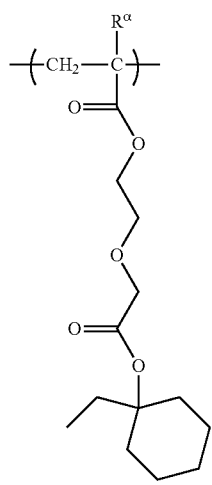
(a1-3-29)
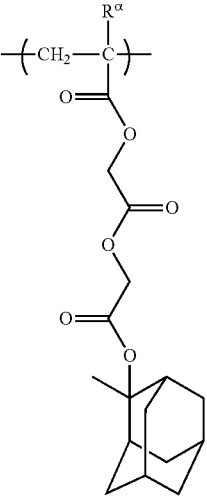
(a1-3-30)
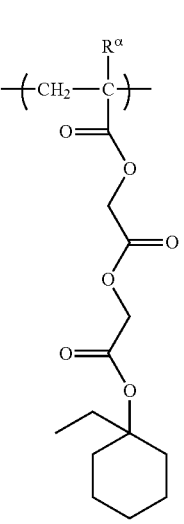
(a1-3-31)
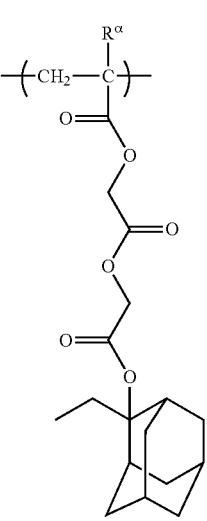

(a1-3-32)
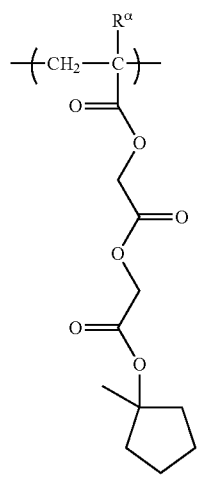
[Chemical Formula 23]
(a1-4-1)
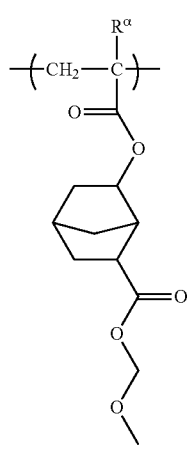
(a1-4-2)
(a1-4-3)
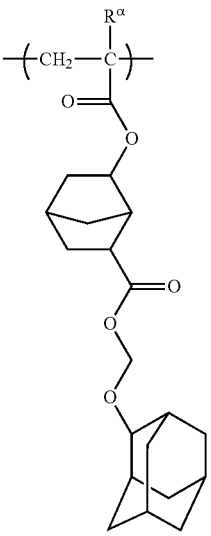
(a1-4-4)
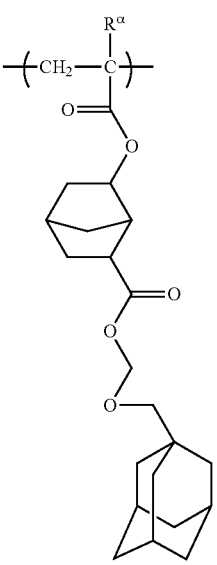
(a1-4-5)
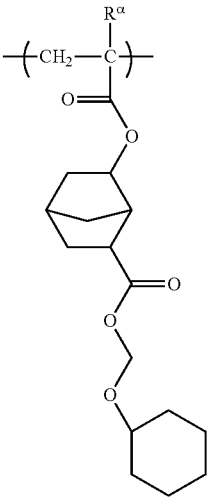

(a1-4-6)
(a1-4-7)
(a1-4-8)
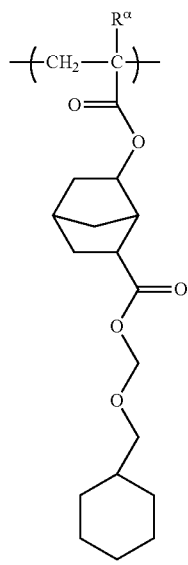
(a1-4-9)
(a1-4-10)
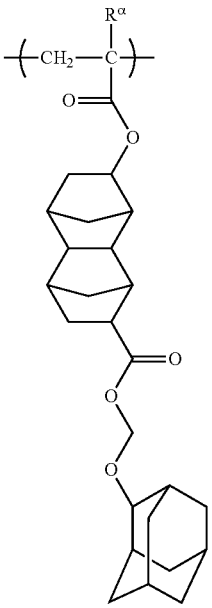

(a1-4-11)
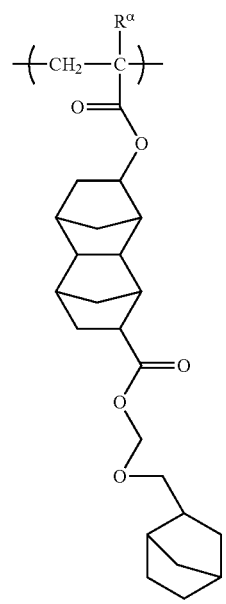
(a1-4-12)
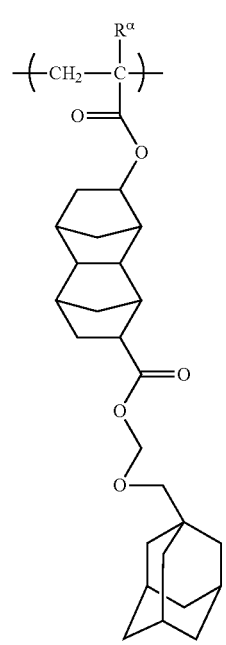
(a1-4-13)
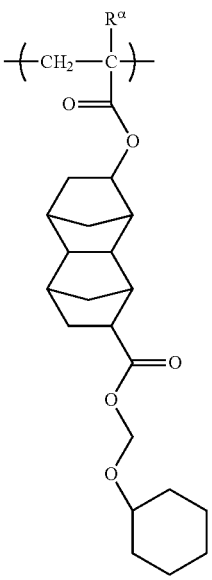
(a1-4-14)
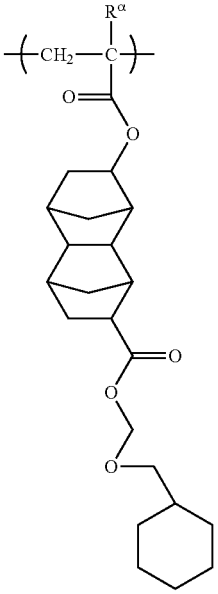

-continued (a1-4-15)

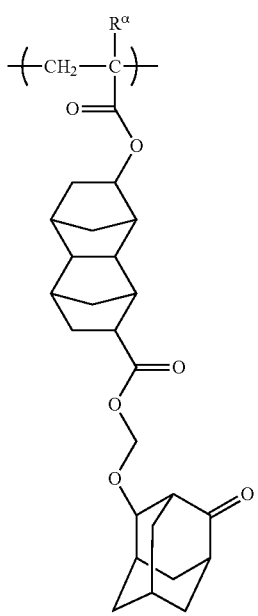

As the structural unit (a1), one type of structural unit may be used alone, or two or more types of structural units may be used in combination.

Among these, structural units represented by general formulas (a1-1) to (a1-3) are preferable, and more specifically, the use of at least one structural unit selected from the group consisting of structural units represented by formulas (a1-1-1) to (a1-1-4), formulas (a1-1-16) to (a1-1-17), formulas (a1-1-20) to (a1-1-23), formula (a1-1-26), formulas (a1-1-32) to (a1-1-33), and formulas (a1-3-25) to (a1-3-28) is more preferable.

Moreover, as the structural unit (a1), structural units represented by general formula (a1-1-01) shown below, which includes the structural units represented by formulas (a1-1-1) to (a1-1-3) and formula (a1-1-26), structural units represented by general formula (a1-1-02) shown below, which includes the structural units represented by formulas (a1-1-16) to (a1-1-17), formulas (a1-1-20) to (a1-1-23) and formulas (a1-1-32) to (a1-1-33), structural units represented by general formula (a1-3-01) shown below, which includes the structural units represented by formulas (a1-3-25) to (a1-3-26), and structural units represented by general formula (a1-3-02) shown below, which includes the structural units represented by formulas (a1-3-27) to (a1-3-28) are preferred.

[Chemical Formula 24]

(a1-1-01)

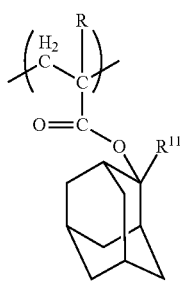

In the formula, R represents a hydrogen atom, an alkyl group of 1 to 5 carbon atoms or a halogenated alkyl group of 1 to 5 carbon atoms, and $R^{11}$ represents an alkyl group of 1 to 5 carbon atoms.

[Chemical Formula 25]

(a1-1-02)

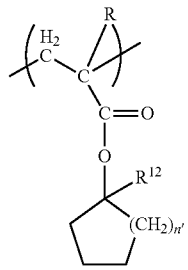

In the formula, R represents a hydrogen atom, an alkyl group of 1 to 5 carbon atoms or a halogenated alkyl group of 1 to 5 carbon atoms, $R^{12}$ represents an alkyl group of 1 to 5 carbon atoms, and n' represents an integer of 1 to 6.

In general formula (a1-1-01), R is the same as defined above.

The alkyl group of 1 to 5 carbon atoms for $R^{11}$ is the same as defined above for the alkyl group of 1 to 5 carbon atoms for R, and is preferably a methyl group or an ethyl group.

In general formula (a1-1-02), R is the same as defined above.

The alkyl group of 1 to 5 carbon atoms for $R^{12}$ is the same as defined above for the alkyl group of 1 to 5 carbon atoms for R, is preferably a methyl group or an ethyl group, and is most preferably an ethyl group.

n' is preferably 1 or 2.

[Chemical Formula 26]

(a1-3-01)

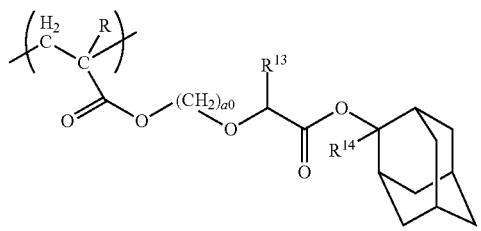

In the formula, R represents a hydrogen atom, an alkyl group of 1 to 5 carbon atoms or a halogenated alkyl group of 1 to 5 carbon atoms, $R^{14}$ represents an alkyl group of 1 to 5 carbon atoms, $R^{13}$ represents a hydrogen atom or a methyl group, and a0 represents an integer of 1 to 10.

[Chemical Formula 27]

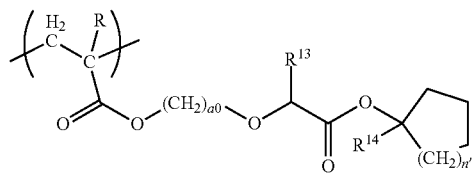

(a1-3-02)

In the formula, R represents a hydrogen atom, an alkyl group of 1 to 5 carbon atoms or a halogenated alkyl group of 1 to 5 carbon atoms, $R^{14}$ represents an alkyl group of 1 to 5 carbon atoms, $R^{13}$ represents a hydrogen atom or a methyl group, a0 represents an integer of 1 to 10, and n' represents an integer of 1 to 6.

In general formulas (a1-3-01) and (a1-3-02), R is the same as defined above.

$R^{13}$ is preferably a hydrogen atom.

The alkyl group of 1 to 5 carbon atoms for $R^{14}$ is the same as defined above for the alkyl group of 1 to 5 carbon atoms for R, and is preferably a methyl group or an ethyl group.

a0 is preferably an integer of 1 to 8, more preferably an integer of 2 to 5, and most preferably 2.

n' is the same as defined above, and is preferably 1 or 2.

In the component (A1-1), the amount of the structural unit (a1), based on the combined total of all the structural units that constitute the component (A1-1), is preferably within a range from 10 to 80 mol %, more preferably from 20 to 70 mol %, and still more preferably from 25 to 60 mol %. By ensuring that the amount of the structural unit (a1) is at least as large as the lower limit of the above range, a pattern can be formed easily using a resist composition prepared from the component (A1-1), whereas by ensuring that the amount is not more than the upper limit of the above range, a good balance can be achieved with the other structural units.

(Structural Unit (a2))

The structural unit (a2) is a structural unit derived from an acrylate ester containing a lactone-containing cyclic group.

The term "lactone-containing cyclic group" refers to a cyclic group including a ring containing a —O—C(O)— structure (the lactone ring). This "lactone ring" is counted as the first ring, so that a lactone-containing cyclic group in which the only ring structure is the lactone ring is referred to as a monocyclic group, and groups that also contain other ring structures are described as polycyclic groups regardless of the structure of the other rings.

When the component (A1-1) is used for forming a resist film, the lactone-containing cyclic group of the structural unit (a2) is effective in improving the adhesion between the resist film and the substrate, and increasing the compatibility with developing solutions containing water.

As the structural unit (a2), there is no particular limitation, and an arbitrary structural unit may be used.

Specific examples of lactone-containing monocyclic groups include groups in which one hydrogen atom has been removed from a 4- to 6-membered lactone ring, including a group in which one hydrogen atom has been removed from β-propiolactone, a group in which one hydrogen atom has been removed from γ-butyrolactone, and a group in which one hydrogen atom has been removed from δ-valerolactone. Further, examples of lactone-containing polycyclic groups include groups in which one hydrogen atom has been removed from a lactone ring-containing bicycloalkane, tricycloalkane, or tetracycloalkane.

More specifically, examples of the structural unit (a2) include structural units represented by general formulas (a2-1) to (a2-5) shown below.

[Chemical Formula 28]

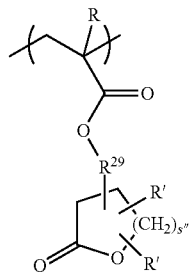

(a2-1)

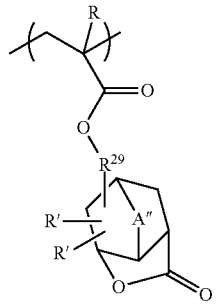

(a2-2)

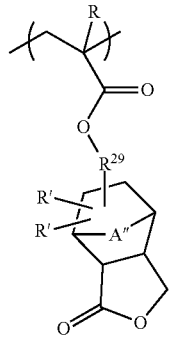

(a2-3)

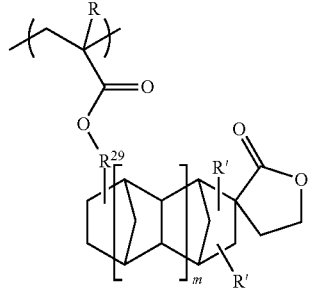

(a2-4)

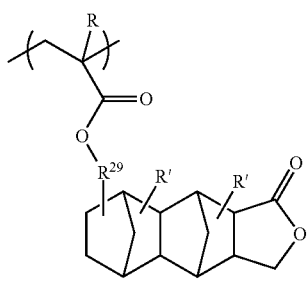
(a2-5)

In the above formulas, R represents a hydrogen atom, a lower alkyl group or a halogenated lower alkyl group, each R' independently represents a hydrogen atom, an alkyl group of 1 to 5 carbon atoms, an alkoxy group of 1 to 5 carbon atoms or —COOR", wherein R" represents a hydrogen atom or an alkyl group, $R^{29}$ represents a single bond or a divalent linking group, s" represents 0 or an integer of 1 or 2, A" represents an oxygen atom, a sulfur atom or an alkylene group of 1 to 5 carbon atoms which may contain an oxygen atom or a sulfur atom, and m represents an integer of 0 or 1.

In general formulas (a2-1) to (a2-5), R is the same as defined above for R in the structural unit (a1).

Examples of the alkyl group of 1 to 5 carbon atoms for R' include a methyl group, ethyl group, propyl group, n-butyl group or tert-butyl group.

Examples of the alkoxy group of 1 to 5 carbon atoms for R' include a methoxy group, ethoxy group, n-propoxy group, iso-propoxy group, n-butoxy group or tert-butoxy group.

In terms of industrial availability, R' is preferably a hydrogen atom.

R" preferably represents a hydrogen atom or a linear, branched or cyclic alkyl group of 1 to 15 carbon atoms.

In those cases where R" represents a linear or branched alkyl group, the alkyl group preferably has 1 to 10 carbon atoms, and more preferably 1 to 5 carbon atoms.

In those cases where R" represents a cyclic alkyl group, the cyclic alkyl group preferably has 3 to 15 carbon atoms, more preferably 4 to 12 carbon atoms, and most preferably 5 to 10 carbon atoms. Examples of the cyclic alkyl group include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group. Specific examples include groups in which one or more hydrogen atoms have been removed from a monocycloalkane such as cyclopentane and cyclohexane, or a polycycloalkane such as adamantane, norbornane, isobornane, tricyclodecane or tetracyclododecane.

A" is preferably an alkylene group of 1 to 5 carbon atoms or —O—, is more preferably an alkylene group of 1 to 5 carbon atoms, and is most preferably a methylene group.

$R^{29}$ represents a single bond or a divalent linking group. Examples of the divalent linking group include the same divalent linking groups as those described above for $Y^2$ in general formula (a1-0-2), and of these groups, an alkylene group, an ester linkage (—C(=O)—O—) or a combination thereof is preferred. The alkylene group for the divalent linking group for $R^{29}$ is preferably a linear or branched alkylene group. Specific examples include the same linear alkylene groups and branched alkylene groups as those listed above for the aliphatic hydrocarbon group for A within the description for $Y^2$.

s" is preferably an integer of 1 or 2.

Specific examples of the structural units represented by general formulas (a2-1) to (a2-5) are shown below.

In each of the following formulas, $R^\alpha$ represents a hydrogen atom, a methyl group or a trifluoromethyl group.

[Chemical Formula 29]

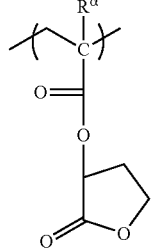
(a2-1-1)

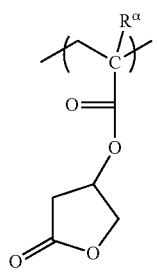
(a2-1-2)

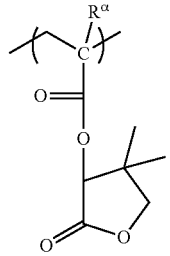
(a2-1-3)

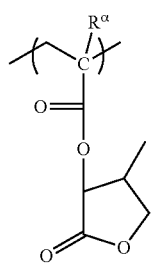
(a2-1-4)

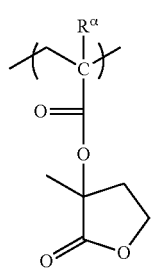
(a2-1-5)

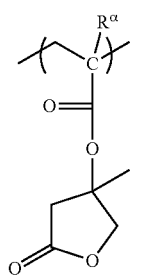 (a2-1-6)
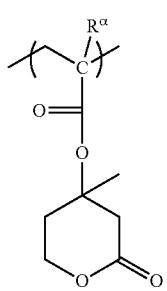 (a2-1-7)
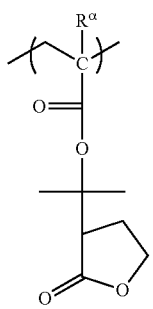 (a2-1-8)
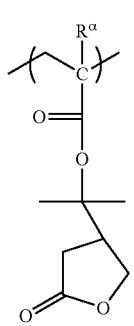 (a2-1-9)
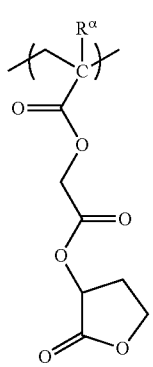 (a2-1-10)
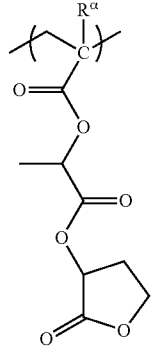 (a2-1-11)
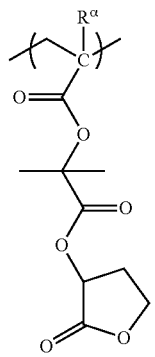 (a2-1-12)
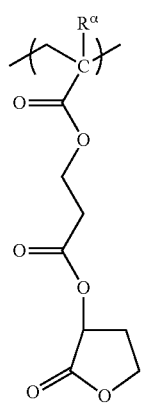 (a2-1-13)
[Chemical Formula 30]
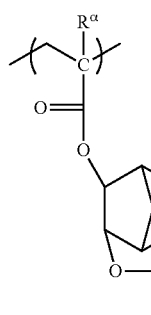 (a2-2-1)

(a2-2-2) 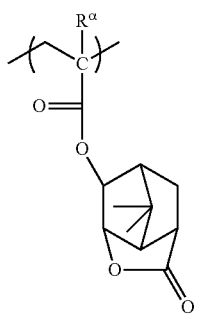
(a2-2-3) 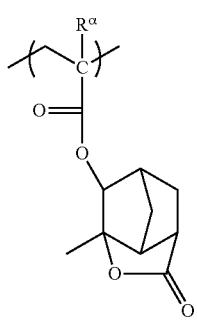
(a2-2-4) 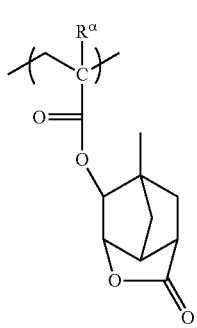
(a2-2-5) 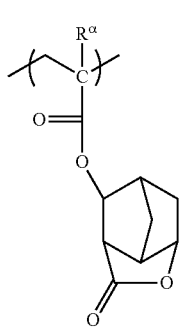
(a2-2-6) 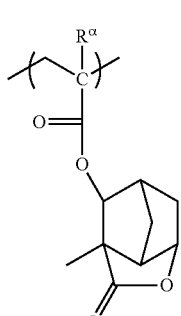
(a2-2-7) 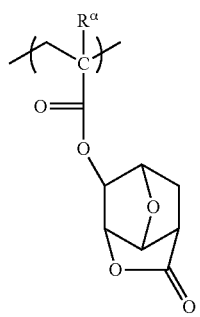
(a2-2-8) 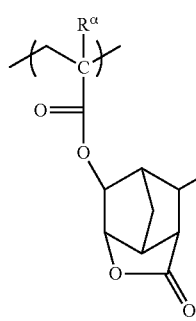
(a2-2-9) 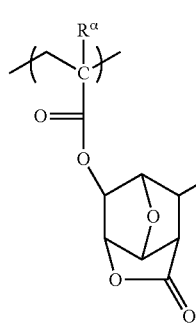
(a2-2-10) 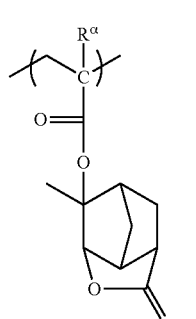
(a2-2-11) 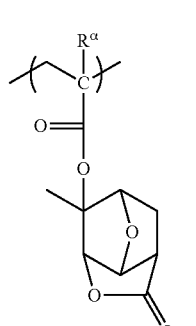

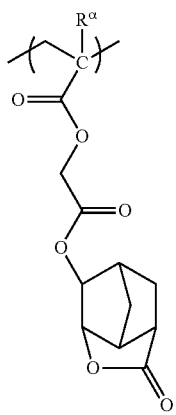 (a2-2-12)
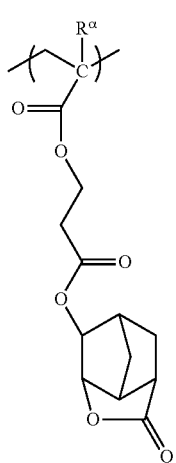 (a2-2-13)
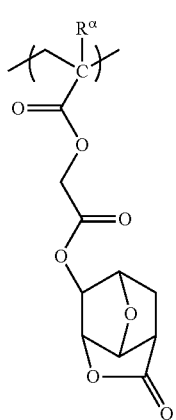 (a2-2-14)
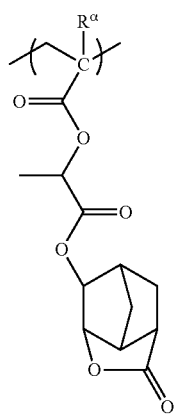 (a2-2-15)
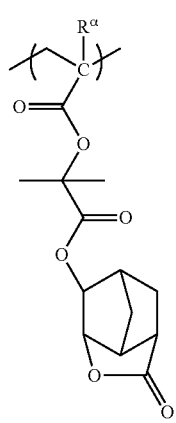 (a2-2-16)
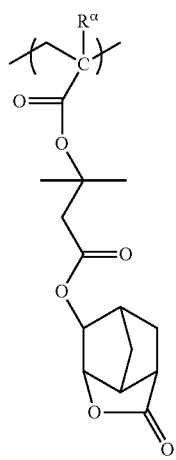 (a2-2-17)
[Chemical Formula 31]
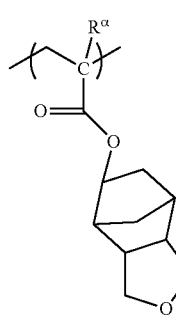 (a2-3-1)

(a2-3-2) 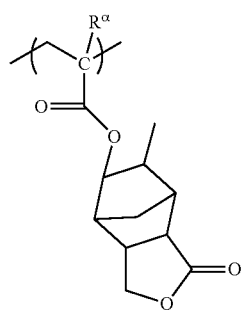
(a2-3-3) 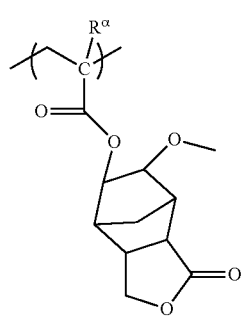
(a2-3-4) 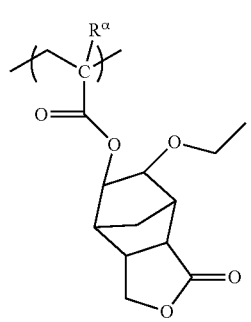
(a2-3-5) 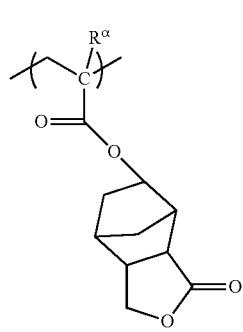
[Chemical Formula 32]
(a2-4-1) 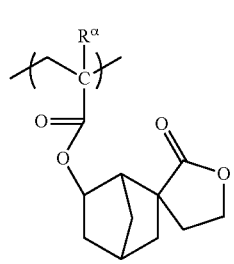
(a2-4-2) 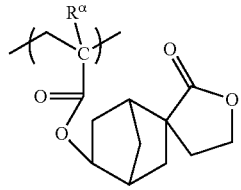
(a2-4-3) 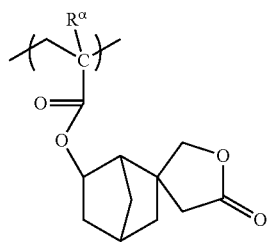
(a2-4-4) 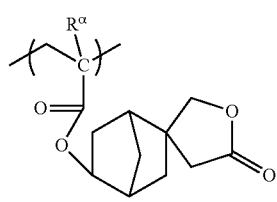
(a2-4-5) 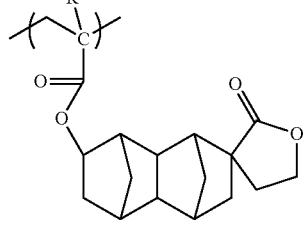
(a2-4-6) 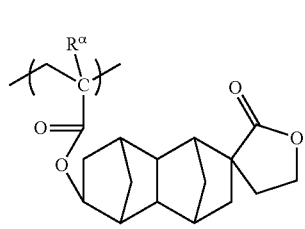
(a2-4-7) 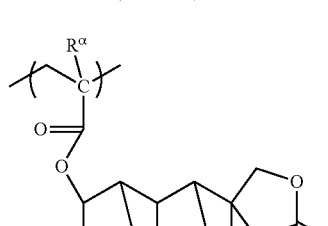
(a2-4-8) 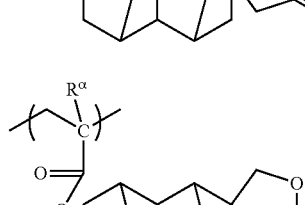
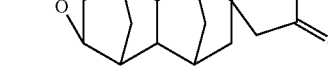

(a2-4-9)
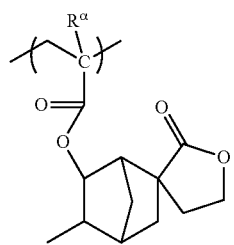
(a2-4-10)
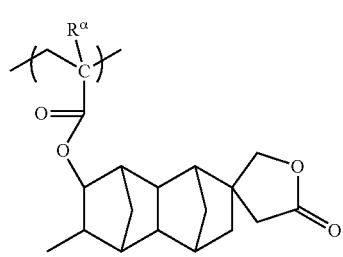
(a2-4-11)
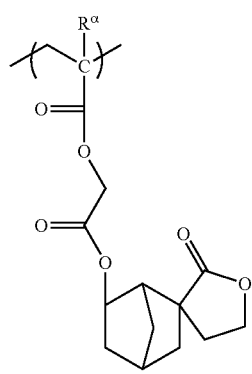
(a2-4-12)
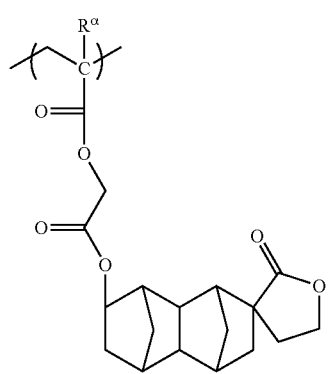
[Chemical Formula 33]
(a2-5-1)
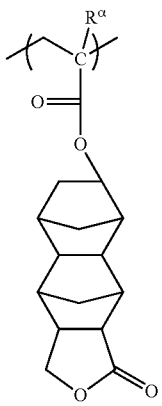
(a2-5-2)
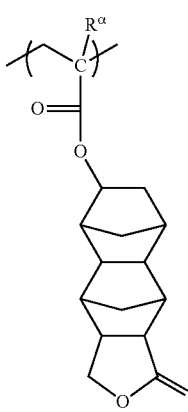
(a2-5-3)
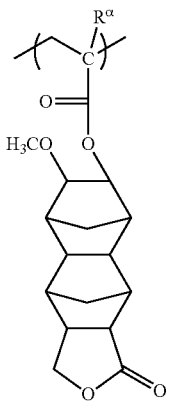
(a2-5-4)
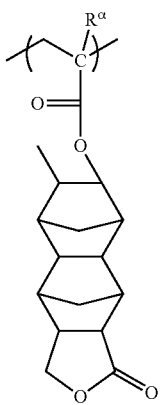

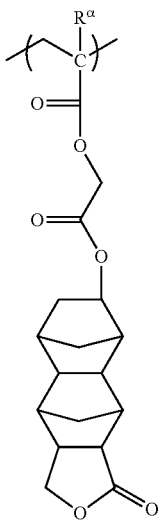

(a2-5-5)

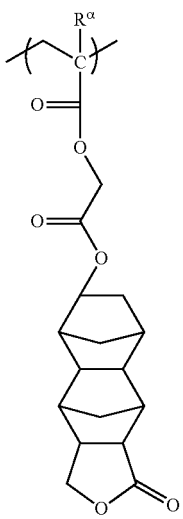

(a2-5-6)

In the component (A1-1), as the structural unit (a2), one type of structural unit may be used alone, or two or more types of structural units may be used in combination.

The structural unit (a2) is preferably at least one structural unit selected from the group consisting of structural units represented by general formulas (a2-1) to (a2-5), and is more preferably at least one structural unit selected from the group consisting of structural units represented by general formulas (a2-1) to (a2-3). Of these, it is particularly preferable to use at least one structural unit selected from the group consisting of the structural units represented by chemical formulas (a2-1-1), (a2-1-2), (a2-2-1), (a2-2-7), (a2-3-1) and (a2-3-5).

The amount of the structural unit (a2) within the component (A1-1), based on the combined total of all the structural units that constitute the component (A1-1), is preferably within a range from 5 to 60 mol %, more preferably from 10 to 50 mol %, and most preferably from 20 to 50 mol %. By ensuring that this amount is at least as large as the lower limit of the above range, the effects generated by including the structural unit (a2) are obtained satisfactorily, whereas by ensuring that the amount is not more than the upper limit of the above range, a good balance can be achieved with the other structural units.

(Structural Unit (a3))

The structural unit (a3) is a structural unit derived from an acrylate ester containing a polar group-containing aliphatic hydrocarbon group.

By including the structural unit (a3) within the component (A1-1), the hydrophilicity of the component (A) is improved, and the compatibility of the component (A) with the developing solution is improved. As a result, the alkali solubility of the exposed portions improves, which contributes to an improvement in the resolution.

Examples of the polar group include a hydroxyl group, cyano group, carboxyl group, or hydroxyalkyl group in which some of the hydrogen atoms bonded to the carbon atoms have been substituted with fluorine atoms, although a hydroxyl group is particularly desirable.

Examples of the aliphatic hydrocarbon group include linear or branched hydrocarbon groups (and preferably alkylene groups) of 1 to 10 carbon atoms, and cyclic aliphatic hydrocarbon groups (cyclic groups). These cyclic groups may be either monocyclic or polycyclic, and can be selected appropriately from the multitude of groups that have been proposed for the resins of resist compositions designed for use with ArF excimer lasers. The cyclic group is preferably a polycyclic group, and preferably contains 7 to 30 carbon atoms.

Of the various possibilities, structural units derived from an acrylate ester that includes an aliphatic polycyclic group containing a hydroxyl group, cyano group, carboxyl group or a hydroxyalkyl group in which some of the hydrogen atoms bonded to the carbon atoms have been substituted with fluorine atoms are particularly desirable. Examples of the polycyclic group include groups in which two or more hydrogen atoms have been removed from a bicycloalkane, tricycloalkane or tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, groups in which two or more hydrogen atoms have been removed from norbornane, or groups in which two or more hydrogen atoms have been removed from tetracyclododecane are preferred industrially.

When the hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by formulas (a3-1), (a3-2) and (a3-3) shown below are preferable.

[Chemical Formula 34]

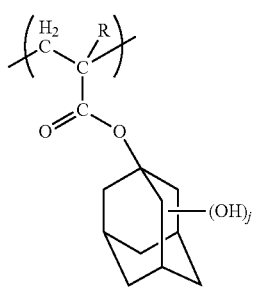

(a3-1)

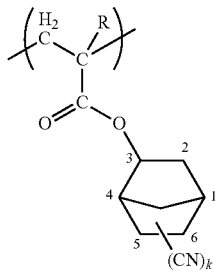
(a3-2)

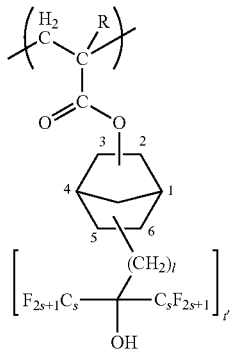
(a3-3)

In these formulas, R is the same as defined above, j is an integer of 1 to 3, k is an integer of 1 to 3, t' is an integer of 1 to 3, l is an integer of 1 to 5, and s is an integer of 1 to 3.

In formula (a3-1), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group.

j is preferably 1, and it is particularly desirable that the hydroxyl group be bonded to the 3rd position of the adamantyl group.

In formula (a3-2), k is preferably 1. The cyano group is preferably bonded to the 5th or 6th position of the norbornyl group.

In formula (a3-3), t' is preferably 1. l is preferably 1. s is preferably 1. Further, it is preferable that a 2-norbornyl group or 3-norbornyl group be bonded to the terminal of the carboxyl group of the acrylic acid. The fluorinated alkyl alcohol is preferably bonded to the 5th or 6th position of the norbornyl group.

As the structural unit (a3), one type of structural unit may be used alone, or two or more types of structural units may be used in combination.

The amount of the structural unit (a3) within the component (A1-1), based on the combined total of all the structural units that constitute the component (A1-1), is preferably within a range from 5 to 50 mol %, and more preferably from 10 to 40 mol %. By ensuring that this amount is at least as large as the lower limit of the above range, the effects generated by including the structural unit (a3) are obtained satisfactorily, whereas by ensuring that the amount is not more than the upper limit of the above range, a good balance can be achieved with the other structural units.

(Structural Unit (a4))

The structural unit (a4) is a structural unit derived from an acrylate ester containing a non-acid-dissociable aliphatic polycyclic group.

By including the structural unit (a4) within the component (A1-1), lithography properties such as the depth of focus (DOF), the resolution and the exposure margin (EL margin) can be improved. Further, as a result of an increase in the carbon density, the etching resistance also improves.

Examples of the polycyclic group include the same groups as those described above in connection with the aforementioned structural unit (a1), and any of the multitude of conventional polycyclic groups used within the resin component of resist compositions for use with ArF excimer lasers or KrF excimer lasers (and particularly for ArF excimer lasers) can be used.

In terms of factors such as industrial availability and the like, at least one polycyclic group selected from amongst a tricyclodecyl group, adamantyl group, tetracyclododecyl group, isobornyl group and norbornyl group is particularly desirable. These polycyclic groups may be substituted with a linear or branched alkyl group of 1 to 5 carbon atoms.

Specific examples of the structural unit (a4) include units with structures represented by general formulas (a-4-1) to (a-4-5) shown below.

[Chemical Formula 35]

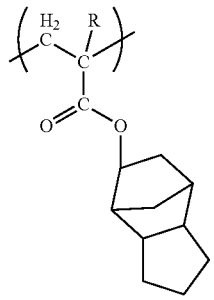
(a4-1)

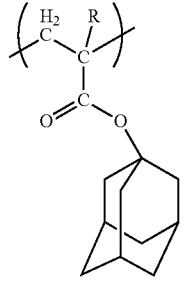
(a4-2)

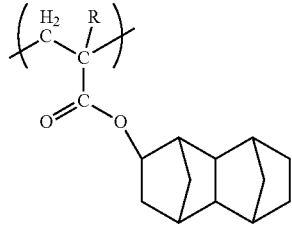
(a4-3)

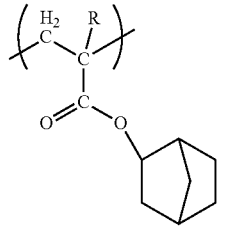
(a4-4)

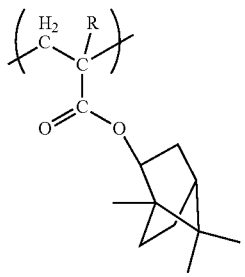

(a4-5)

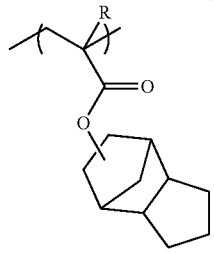

In the above formulas, R is the same as defined above.

As the structural unit (a4), one type of structural unit may be used alone, or two or more types of structural units may be used in combination.

The amount of the structural unit (a4) within the component (A1-1), based on the combined total of all the structural units that constitute the component (A1-1), is preferably within a range from 1 to 30 mol %, and more preferably from 5 to 20 mol %. By ensuring that this amount is at least as large as the lower limit of the above range, the effects generated by including the structural unit (a4) are obtained satisfactorily, whereas by ensuring that the amount is not more than the upper limit of the above range, a good balance can be achieved with the other structural units.

(Other Structural Units)

The component (A1-1) may also include other structural units besides the above structural units (a1) to (a4).

There are no particular limitations on these other structural units, and any other structural unit which cannot be classified as one of the above structural units (a1) to (a4) can be used without any particular limitations. Any of the multitude of conventional structural units used within resist resins for ArF excimer lasers or KrF excimer lasers or the like can be used.

As the other structural unit, a structural unit derived from a compound that is capable of undergoing copolymerization with the compounds that yield the above structural units (a1) to (a4) is preferred.

In the positive chemically amplified resist composition of the present invention, the component (A1-1) is preferably a polymeric compound that includes the structural unit (a1).

Examples of this type of component (A1-1) include copolymers composed of the structural units (a1), (a2) and (a3), and copolymers composed of the structural units (a1), (a2), (a3) and (a4).

Within the component (A1), the component (A1-1) may be either a single polymeric compound, or a combination of two or more polymeric compounds.

The component (A1-1) is preferably a copolymer containing the types of structural unit combinations shown below.

[Chemical Formula 36]

Copolymer (A1-1-1)

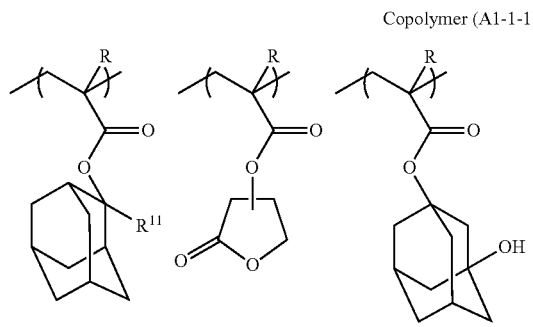

In the above formula, R is the same as defined above, wherein the plurality of R groups may be the same or different, and $R^{11}$ is the same as defined above.

In the above formulas, R is preferably a hydrogen atom or an alkyl group of 1 to 5 carbon atoms, and is more preferably a hydrogen atom or a methyl group.

$R^{11}$ is preferably a methyl group or an ethyl group, and is most preferably a methyl group.

The component (A1-1) can be obtained, for example, by a conventional radical polymerization or the like of the monomers corresponding with each of the structural units, using a radical polymerization initiator such as azobisisobutyronitrile (AIBN).

Furthermore, in the component (A1-1), by using a chain transfer agent such as HS—$CH_2$—$CH_2$—$CH_2$—$C(CF_3)_2$—OH during the above polymerization, a —$C(CF_3)_2$—OH group can be introduced at the terminals of the component (A1-1). Such a copolymer having an introduced hydroxyalkyl group in which some of the hydrogen atoms of the alkyl group are substituted with fluorine atoms is effective in reducing developing defects and LER (line edge roughness: unevenness of the side walls of a line pattern).

The weight average molecular weight (Mw) (the polystyrene equivalent value determined by gel permeation chromatography) of the component (A1-1) is not particularly limited, but is preferably within a range from 1,000 to 50,000, more preferably from 1,500 to 30,000, and most preferably from 2,000 to 20,000. Provided the weight average molecular weight is not more than the upper limit of the above-mentioned range, the component (A1-1) exhibits satisfactory solubility in a resist solvent when used as a resist, whereas provided the weight average molecular weight is at least as large as the lower limit of the above-mentioned range, the dry etching resistance and cross-sectional shape of the resist pattern can be improved.

Further, the dispersity (Mw/Mn) of the component (A1-1) is preferably within a range from 1.0 to 5.0, more preferably from 1.0 to 3.0, and most preferably from 1.2 to 2.5.

[Component (A1-2)]

As the component (A1-2), it is preferable to use a compound that has a molecular weight of at least 500 but less than 2,000, contains a hydrophilic group, and also contains an acid-dissociable, dissolution-inhibiting group such as those listed above in connection with the component (A1-1). Specific examples of the component (A1-2) include compounds containing a plurality of phenol skeletons in which a portion of the hydroxyl group hydrogen atoms have been substituted with the aforementioned acid dissociable, dissolution inhibiting groups.

Examples of the component (A1-2) include low molecular weight phenol compounds in which a portion of the hydroxyl group hydrogen atoms have been substituted with an aforementioned acid dissociable, dissolution inhibiting group. These types of compounds are known, for example, as sensitizers or heat resistance improvers for use in non-chemically amplified g-line or i-line resists.

Examples of these low molecular weight phenol compounds include bis(4-hydroxyphenyl)methane, bis(2,3,4-trihydroxyphenyl)methane, 2-(4-hydroxyphenyl)-2-(4'-hydroxyphenyl)propane, 2-(2,3,4-trihydroxyphenyl)-2-(2',3',4'-trihydroxyphenyl)propane, tris(4-hydroxyphenyl)methane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3-methylphenyl)-3,4-dihydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, 1-[1-(4-hydroxyphenyl)isopropyl]-4-[1,1-bis(4-hydroxyphenyl)ethyl]benzene, and dimers, trimers and tetramers of formalin condensation products of phenols such as phenol, m-cresol, p-cresol and xylenol. Needless to say, the low molecular weight phenol compound is not limited to these examples.

Also, there are no particular limitations on the acid dissociable, dissolution inhibiting group, and suitable examples include the groups described above.

Within the component (A1), the component (A1-2) may be either a single compound or a combination of two or more compounds.

[Component (A2)]

In those cases where the resist composition in the present invention is a negative-type chemically amplified resist composition, the component (A) is preferably a base component (A2) (hereafter referred to as "component (A2)") that is soluble in an alkali developing solution.

In the negative chemically amplified resist composition, a cross-linker (C) (hereafter referred to as "component (C)") is preferably included in addition to the component (A2).

In the negative chemically amplified resist composition, when acid is generated from the component (B) upon exposure, the action of that acid causes cross-linking between the component (A2) and the component (C), and the cross-linked product becomes insoluble in an alkali developing solution. As a result, during resist pattern formation, when a resist film obtained by applying the negative chemically amplified resist composition to a substrate is selectively exposed, the exposed portions of the resist become insoluble in an alkali developing solution, whereas the unexposed portions remain soluble in the alkali developing solution, meaning a resist pattern can be formed by alkali developing.

In those cases where the resist composition of the present invention is a negative-type chemically amplified resist composition, the component (A2) preferably includes a resin component that is soluble in an alkali developing solution (hereafter, referred to as "alkali-soluble resin component (A2-1)"). As this alkali-soluble resin, it is preferable to use a resin having a structural unit derived from at least one of α-(hydroxyalkyl)acrylic acid and a lower alkyl ester of α-(hydroxyalkyl)acrylic acid, or a resin having a fluorinated alcohol group, as disclosed in Japanese Unexamined Patent Application, First Publication No. 2005-336452 or Japanese Unexamined Patent Application, First Publication No. 2006-259582, as such resins enable the formation of a favorable resist pattern with minimal swelling. Here, the term "α-(hydroxyalkyl)acrylic acid" refers to one or both of acrylic acid in which a hydrogen atom is bonded to the carbon atom on the α-position having the carboxyl group bonded thereto, and α-hydroxyalkylacrylic acid in which a hydroxyalkyl group (preferably a hydroxyalkyl group of 1 to 5 carbon atoms) is bonded to the carbon atom on the α-position. A more detailed description of the alkali-soluble resin component (A2-1) is presented below.

Component (A2-1)

The alkali-soluble resin component (A2-1) (hereafter referred to as "component (A2-1)") may include an alkali-soluble resin having a fluorinated hydroxyalkyl group represented by general formula (a1'-1-0) shown below.

A specific example of a preferred alkali-soluble resin having a fluorinated hydroxyalkyl group is a polymeric compound (A2-1-10) (hereafter referred to as "component (A2-1-10)") containing a structural unit (a1') that contains, within the main chain, an aliphatic cyclic group having a fluorinated hydroxyalkyl group, and preferably also containing a structural unit (a2') having a hydroxyalkyl group.

Further, another example of a preferred alkali-soluble resin having a fluorinated hydroxyalkyl group is a polymeric compound (A2-1-20) (hereafter referred to as "component (A2-1-20)") containing a structural unit (a1") that contains an aliphatic cyclic group having a fluorinated hydroxyalkyl group, and preferably also containing a structural unit (a2") derived from an acrylate ester containing a hydroxyl group-containing aliphatic cyclic group, and/or a structural unit (a3") derived from an acrylic acid that has no cyclic structure and has an alcoholic hydroxyl group on a side chain.

Polymeric Compound (A2-1-10)

The component (A2-1-10) includes a structural unit (a1') that contains, within the main chain, an aliphatic cyclic group having a fluorinated hydroxyalkyl group.

Further, the component (A2-1-10) preferably also includes, in addition to the structural unit (a1'), a structural unit (a2') having a hydroxyalkyl group (hereafter, simply abbreviated as "structural unit (a2')").

Structural Unit (a1')

The component (A2-1-10) includes a structural unit (a1') that contains, within the main chain, an aliphatic cyclic group having a fluorinated hydroxyalkyl group.

In this structural unit (a1'), the "aliphatic cyclic group having a fluorinated hydroxyalkyl group" refers to a group in which a fluorinated hydroxyalkyl group is bonded to a carbon atom that constitutes part of a ring of an aliphatic cyclic group.

Furthermore, the description of the aliphatic cyclic group as being "within the main chain" means that at least one carbon atom, and preferably two or more carbon atoms, within the ring structure of the aliphatic cyclic group constitute part of the main chain of the component (A2-1-10).

By using a component (A2) that includes the component (A2-1-10) containing the structural unit (a1'), the solubility of the resist film within an alkali developing solution is enhanced, and lithography properties such as the resolution, resist pattern shape, and line edge roughness (LER) are improved. Further, because the component (A2-1-10) includes the aliphatic cyclic group (such as a norbornane or tetracyclododecane structure) within the main chain, the carbon density is increased, yielding an improvement in the etching resistance.

Here, a "fluorinated hydroxyalkyl group" describes a hydroxyalkyl group, in which a portion of the hydrogen atoms of an alkyl group have been substituted with hydroxyl groups, wherein some or all of the remaining hydrogen atoms within the hydroxyalkyl group have been substituted with fluorine atoms.

In a fluorinated hydroxyalkyl group, the fluorination increases the ease with which the hydrogen atom of the hydroxyl group is released.

In the fluorinated hydroxyalkyl group, the alkyl group is preferably a linear or branched alkyl group.

Although there are no particular limitations on the number of carbon atoms within the alkyl group, the number of carbon atoms is preferably from 1 to 20, more preferably from 4 to 16, and most preferably from 4 to 12.

There are no particular limitations on the number of hydroxyl groups, although a single hydroxyl group is preferred.

Of the various possibilities, groups in which a fluorinated alkyl group and/or a fluorine atom is bonded to the carbon atom to which the hydroxyl group is bonded (which refers to the α-position carbon atom of the hydroxyalkyl group) are preferred as the fluorinated hydroxyalkyl group.

Furthermore, the fluorinated alkyl group bonded to the α-position is preferably a group in which all of the hydrogen atoms of the alkyl group have been substituted with fluorine atoms. Furthermore, as the alkyl group of this fluorinated alkyl group, a linear or branched alkyl group of 1 to 5 carbon atoms is preferred, and an alkyl group of one carbon atom is the most desirable.

The term "aliphatic" in the expression "aliphatic cyclic group having a fluorinated hydroxyalkyl group" is a relative concept used in relation to the term "aromatic", and defines a group or compound or the like that contains no aromaticity. The aliphatic cyclic group may be either monocyclic or polycyclic.

The expression "monocyclic aliphatic cyclic group" describes a monocyclic group that contains no aromaticity, whereas the expression "polycyclic aliphatic cyclic group" describes a polycyclic group that contains no aromaticity.

In the structural unit (a1'), the aliphatic cyclic group is preferably a polycyclic group, as such groups provide superior etching resistance and the like.

The aliphatic cyclic group includes both hydrocarbon groups formed solely from carbon and hydrogen (alicyclic groups), and heterocyclic groups in which a portion of the carbon atoms that constitute the ring structure of an alicyclic group have been substituted with a hetero atom such as an oxygen atom, nitrogen atom, or sulfur atom. These aliphatic cyclic groups may have substituents, and examples of these substituents include alkyl groups of 1 to 5 carbon atoms.

The expression "may have substituents" means that some or all of the hydrogen atoms bonded to the carbon atoms that constitute the ring structure of the aliphatic cyclic group may be substituted with substituents (atoms other than a hydrogen atom or groups). An alicyclic group is preferred as the aliphatic cyclic group.

The aliphatic cyclic group may be either saturated or unsaturated, although a saturated group is preferred, as such groups exhibit superior transparency to ArF excimer lasers and the like, and also exhibit excellent resolution and depth of focus (DOF) and the like.

The number of carbon atoms within the aliphatic cyclic group is preferably within a range from 5 to 15.

Specific examples of the aliphatic cyclic group include the groups described below.

Examples of the monocyclic group include groups in which two or more hydrogen atoms have been removed from a cycloalkane. Specific examples include groups in which two or more hydrogen atoms have been removed from cyclopentane or cyclohexane.

Examples of the polycyclic group include groups in which two or more hydrogen atoms have been removed from a bicycloalkane, tricycloalkane or tetracycloalkane or the like. Specific examples include groups in which two or more hydrogen atoms have been removed from a polycycloalkane such as adamantane, norbornane, isobornane, tricyclodecane or tetracyclododecane.

These types of aliphatic cyclic groups can be selected appropriately from the multitude of groups that have been proposed for the resins of photoresist compositions designed for use in ArF excimer laser processes.

Of the various possibilities, groups in which two or more hydrogen atoms have been removed from cyclopentane, cyclohexane, adamantane, norbornane or tetracyclododecane are readily available industrially, and are consequently preferred.

Of the alicyclic groups used above, groups such as those shown in a structural unit (a1'-1) below, in which three hydrogen atoms have been removed from norbornane or tetracyclododecane, are preferred, and groups in which three hydrogen atoms have been removed from norbornane are particularly desirable.

Of the units included within the definition of the structural unit (a1'), structural units (a1'-1) represented by general formula (a1'-1) shown below are preferred. By including the structural unit (a1'-1), the solubility of the polymeric compound in an alkali developing solution improves significantly. Furthermore, the lithography properties such as the resolution are also improved.

[Chemical formula 37]

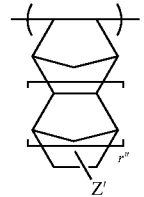

(a1'-1)

In formula (a1'-1), Z' represents a fluorinated hydroxyalkyl group, and r" is either 0 or 1.

In formula (a1'-1), r" is either 0 or 1, and in terms of industrial availability, is preferably 0.

Further, in formula (a1'-1), examples of the "fluorinated hydroxyalkyl group" represented by Z' include the same groups as those described above. Of these, Z' is preferably a group represented by general formula (a1'-1-0) shown below, as such groups yield a particularly superior resist pattern shape as well as reduced levels of line edge roughness (LER).

The term "line edge roughness (LER)" refers to non-uniform unevenness in the side walls of a pattern.

[Chemical Formula 38]

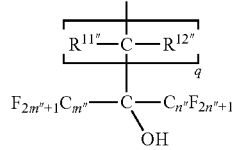

(a1'-1-0)

In formula (a1'-1-0), $R^{11''}$ and $R^{12''}$ each independently represents a hydrogen atom or a lower alkyl group of 1 to 5 carbon atoms, m" and n" each independently represents an integer of 1 to 5, and q also represents an integer of 1 to 5.

In formula (a1'-1-0), $R^{11''}$ and $R^{12''}$ each independently represents a hydrogen atom or a lower alkyl group.

As the lower alkyl group, a linear or branched lower alkyl group of 1 to 5 carbon atoms is preferred, and specific examples include a methyl group, ethyl group, propyl group, isopropyl group, n-butyl group, isobutyl group, tert-butyl group, pentyl group, isopentyl group or neopentyl group, and a methyl group is particularly desirable.

Of the various possibilities, groups in which $R^{11''}$ and $R^{12''}$ are both hydrogen atoms are particularly desirable.

q represents an integer of 1 to 5, and is preferably an integer of 1 to 3, and most preferably 1.

Each of m'' and n'' independently represents an integer of 1 to 5, and preferably an integer of 1 to 3. Groups in which m'' and n'' are both 1 are preferred in terms of ease of synthesis.

The structural unit (a1') may use either one type of structural unit, or a mixture of two or more types.

The amount of the structural unit (a1') within the component (A2-1-10), based on the combined total of all the structural units that constitute the component (A2-1-10), is preferably within a range from 50 to 90 mol %, more preferably from 55 to 90 mol %, and still more preferably from 60 to 80 mol %. Ensuring that this amount is at least as large as the lower limit of the above-mentioned range yields an improvement in the effects achieved by including the structural unit (a1'), whereas by ensuring that the amount is not more than the upper limit of the above-mentioned range, a good balance can be achieved with the other structural units.

Structural Unit (a2')

In addition to the structural unit (a1'), the component (A2-1-10) preferably also includes a structural unit (a2') having a hydroxyalkyl group.

Including a resin (A2-1-10) containing the structural unit (a2') within the component (A2) improves the solubility of the component (A2) within an alkali developing solution. Further, the cross-linking of the component (A2) with the component (C) is enhanced, meaning the difference in the solubility within the alkali developing solution (the contrast) between the exposed portions and the unexposed portions can be increased, enabling the composition to function more effectively as a negative resist.

As the structural unit (a2'), units such as a structural unit (a210) that contains, within the main chain, an aliphatic cyclic group having a hydroxyalkyl group, and a structural unit (a220) derived from an acrylate ester having a hydroxy group-containing alkyl group are preferred.

Structural Unit (a210)

The structural unit (a210) is a structural unit that contains, within the main chain, an aliphatic cyclic group having a hydroxyalkyl group.

Examples of the structural unit (a210) include the same units as those listed above for the structural unit (a1'), with the exception that the "fluorinated hydroxyalkyl group" within the structural unit (a1') is replaced with an unfluorinated hydroxyalkyl group, namely a hydroxyalkyl group in which a portion of the hydrogen atoms of an alkyl group have been substituted with hydroxyl groups, and the remaining hydrogen atoms have not been substituted with fluorine atoms.

Of the units included within the definition of the structural unit (a210), structural units represented by general formula (a2'-1) shown below (hereafter referred to as "structural unit (a2'-1)") are preferred. By including the structural unit (a2'-1), lithography properties such as the resolution, resist pattern shape and line width roughness (LWR) are improved. Further, a favorable contrast is more readily obtained, and the etching resistance also improves.

[Chemical formula 39]

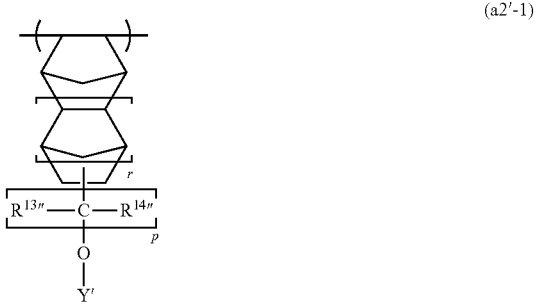

(a2'-1)

In formula (a2'-1), each of $R^{13''}$ and $R^{14''}$ independently represents a hydrogen atom or a lower alkyl group of 1 to 5 carbon atoms, Y' represents a hydrogen atom or a hydroxyalkyl group, r represents either 0 or 1, and p represents an integer of 1 to 3.

The structural unit (a2'-1) represented by general formula (a2'-1) is a structural unit that contains, within the main chain, a norbornane or tetracyclododecane structure having a hydroxyalkyl group.

In formula (a2'-1), each of $R^{13''}$ and $R^{14''}$ independently represents a hydrogen atom or a lower alkyl group. Examples of the lower alkyl group include the same groups as those listed above in relation to the lower alkyl groups represented by $R^{11''}$ and $R^{12''}$ in formula (a1'-1-1). Of the various possibilities, groups in which $R^{13''}$ and $R^{14''}$ are both hydrogen atoms are particularly desirable.

Y' represents a hydrogen atom or a hydroxyalkyl group.

As the hydroxyalkyl group, a linear or branched hydroxyalkyl group of not more than 10 carbon atoms is preferred, a linear or branched hydroxyalkyl group of not more than 8 carbon atoms is more preferred, and a linear lower hydroxyalkyl group of 1 to 3 carbon atoms is still more preferred.

There are no particular limitations on the number of hydroxyl groups or the bonding positions of those hydroxyl groups within the hydroxyalkyl group, although a single hydroxyl group is typical, and this hydroxyl group is preferably bonded to the alkyl group terminal.

Y' is most preferably a hydrogen atom.

r is either 0 or 1, and is preferably 0.

p represents an integer of 1 to 3, is preferably 1 or 2, and is most preferably 1.

Specific examples of the structural unit (a2'-1) include units represented by chemical formulas (a2'-1-1) to (a2'-1-7) shown below.

[Chemical Formula 40]

(a2'-1-1)

-continued (a2'-1-2)
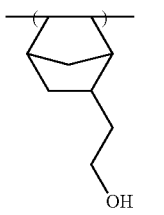

(a2'-1-3)
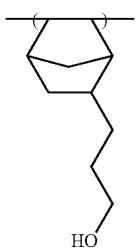

(a2'-1-4)
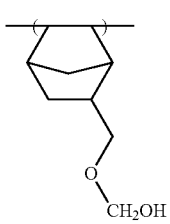

(a2'-1-5)
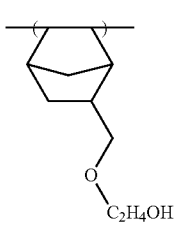

(a2'-1-6)
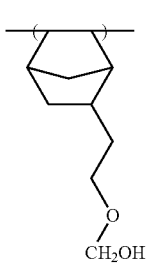

(a2'-1-7)
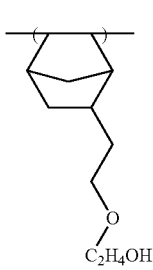

Of these structural units, those represented by the above chemical formulas (a2'-1-1), (a2'-1-2) and (a2'-1-3) are preferred.

The structural unit (a210) may use either one type of structural unit, or a mixture of two or more types.

The amount of the structural unit (a210) within the component (A2-1-10), based on the combined total of all the structural units that constitute the component (A2-1-10), is preferably within a range from 10 to 50 mol %, more preferably from 15 to 50 mol %, and still more preferably from 20 to 45 mol %. Ensuring this amount is at least as large as the lower limit of the above-mentioned range improves the effects achieved by including the structural unit (a210) such as improving the alkali solubility and making a favorable contrast more readily obtainable. On the other hand, by ensuring that the amount is not more than the upper limit of the above-mentioned range, a good balance can be achieved with the other structural units.

Structural Unit (a220)

The structural unit (a220) is a structural unit derived from an acrylate ester having a hydroxyl group-containing alkyl group.

If the structural unit (a220) is a structural unit that includes a hydroxyl group-containing cyclic alkyl group (hereafter such structural units are referred to as "structural unit (a221)"), then the resist pattern swelling suppression effect is further enhanced. Further, the resolution is also improved. Furthermore, favorable levels of contrast and etching resistance are also more readily obtained.

Examples of the structural unit (a221) include those units, amongst the structural units listed below in the description of a "structural unit (a2")" derived from an acrylate ester containing a hydroxyl group-containing aliphatic cyclic group" that constitutes the component (A2-1-20) described below, in which the aliphatic cyclic group is a saturated hydrocarbon group. Of these structural units, units in which the substituent bonded to the α-position of the acrylate ester is a fluorinated alkyl group are particularly preferred, and this substituent is most preferably a trifluoromethyl group ($-CF_3$).

Furthermore, if the structural unit (a220) is a structural unit that includes a hydroxyl group-containing chain-like alkyl group (such structural units are referred to as "structural unit (a222)"), then the hydrophilicity of the entire component (A2-1-10) is increased, the solubility of the component within an alkali developing solution is improved, and the resolution also improves. Further, the controllability of the cross-linking reaction that occurs during resist pattern formation improves, yielding improvements in the pattern shape and the resolution. Moreover, the film density also tends to increase, and this enables suppression of thickness loss during etching, and tends to also improve the heat resistance.

Examples of the structural unit (a222) include those units, amongst the structural units used below in the description of a "structural unit (a3")" derived from an acrylic acid that has no cyclic structure and has an alcoholic hydroxyl group on a side chain" that constitutes the component (A2-1-20) described below, that include a hydroxyalkyl group. Of these structural units, units having a hydroxyalkyl group at the acrylate ester portion are preferred, structural units in which the substituent bonded to the α-position of the acrylate ester is a fluorinated alkyl group are particularly preferred, and this substituent is most preferably a trifluoromethyl group ($-CF_3$).

The structural unit (a220) may use either one type of structural unit, or a mixture of two or more types.

The amount of the structural unit (a220) within the component (A2-1-10), based on the combined total of all the structural units that constitute the component (A2-1-10), is preferably within a range from 10 to 80 mol %, more preferably from 15 to 60 mol %, and still more preferably from 20 to 55 mol %. Ensuring that this amount is at least as large as the lower limit of the above-mentioned enables the effects obtained by including the structural unit (a220) to be achieved, whereas by ensuring that the amount is not more than the upper limit of the above-mentioned range, a good balance can be achieved with the other structural units.

In those cases where the structural unit (a220) includes both the structural unit (a221) and the structural unit (a222), the mixing ratio between the two structural units, reported as a molar ratio, is preferably such that structural unit (a221): structural unit (a222) is from 9:1 to 1:9, more preferably from 8:2 to 2:8, and most preferably from 6:4 to 7:3.

By including the structural unit (a221) and the structural unit (a222) in a favorable balance that satisfies the above-mentioned mixing ratio, a favorable exposure margin can be obtained. Further, a suitable level of contrast is also obtained, and the resolution is improved. Moreover, the etching resistance also improves.

Other Structural Units

In the negative chemically amplified resist composition of the present invention, besides the structural units (a1') and (a2') described above, the component (A) may also include other structural units typically used in the resin component of conventional chemically amplified resist compositions.

The resin (A2-1-10) is preferably a polymeric compound that includes the structural unit (a1') and the structural unit (a2'), and is more preferably a polymeric compound in which the structural units (a1') and (a2') represent main components.

Here the term "main components" means that the combined amount of the structural unit (a1') and the structural unit (a2'), relative to the combined total of all the structural units that constitute the component (A2-1-10), is at least 70 mol %. This amount is more preferably 80 mol % or higher, and may be 100 mol %. Of the various possibilities, polymeric compounds formed solely from the structural unit (a1') and the structural unit (a2') are the most desirable as the component (A2-1-10).

In the component (A2-1-10), the combination of the structural unit (a1') and the structural unit (a2') is preferably a combination of the structural unit (a1') and the structural unit (a210).

Preferred examples of the component (A2-1-10) include polymeric compounds containing the combinations of structural units represented by chemical formulas (A2-1-11) to (A2-1-14) shown below.

[Chemical Formula 41]

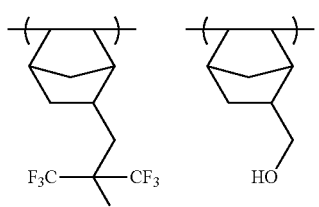

(A2-1-11)

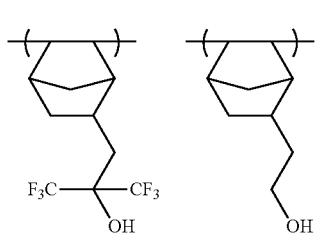

(A2-1-12)

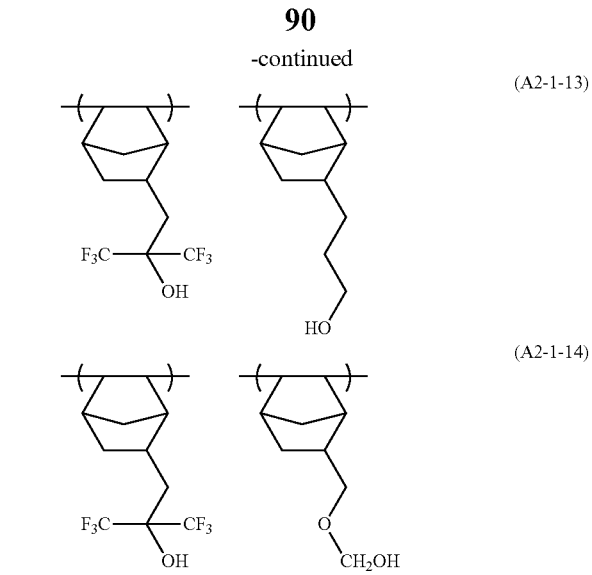

Of the above polymeric compounds, the component (A2-1-10) is preferably a polymeric compound that includes at least one combination of structural units selected from the combinations represented by chemical formulas (A2-1-11) to (A2-1-14), and is most preferably a polymeric compound including the combination of structural units represented by chemical formula (A2-1-11).

The weight average molecular weight (Mw, the polystyrene equivalent molecular weight measured by gel permeation chromatography) of the component (A2-1-10) is preferably within a range from 2,000 to 10,000, more preferably from 3,000 to 6,000, and most preferably from 3,000 to 5,000.

Ensuring that this molecular weight is at least as large as the lower limit of the above-mentioned range enables good contrast to be obtained, whereas ensuring the molecular weight is not more than the upper limit of the above range enables resist pattern swelling to be suppressed. As a result, the resolution can be improved. Further, suppressing pattern swelling also yields an improvement in the depth of focus (DOF) properties and improved suppression of line edge roughness (LER). Furthermore, ensuring a weight average molecular weight within the above range is preferred in terms of achieving a large suppression effect on resist pattern swelling. Lower weight average molecular weights within the above-mentioned range tend to yield more favorable properties.

Further, the dispersity (Mw/Mn) is preferably within a range from 1.0 to 5.0, and is more preferably from 1.0 to 2.5.

When the component (A2-1) is used in the component (A2), one type of the above component (A2-1-10) may be used alone, or a mixture of two or more types may be used.

In those cases where the component (A2-1-10) is used, the amount of the component (A2-1-10) within the component (A2-1) is preferably at least 40% by weight, more preferably 50% by weight or greater, and most preferably 60% by weight or greater.

Polymeric Compound (A2-1-20)

The component (A2-1-20) includes a structural unit (a1") that contains an aliphatic cyclic group having a fluorinated hydroxyalkyl group.

Further, in addition to the structural unit (a1"), the component (A2-1-20) preferably also includes a structural unit (a2") derived from an acrylate ester containing a hydroxyl group-containing aliphatic cyclic group.

Furthermore, in addition to the structural unit (a1"), or in addition to a combination of the structural unit (a1") and the structural unit (a2"), the component (A2-1-20) preferably also includes a structural unit (a3") derived from an acrylic acid that has no cyclic structure and has an alcoholic hydroxyl group on a side chain.

Structural Unit (a1")

The structural unit (a1") is a structural unit that includes an aliphatic cyclic group having a fluorinated hydroxyalkyl group. Including the structural unit (a1") improves the solubility of the polymeric compound in an alkali developing solution. Further, swelling of the resist pattern is suppressed, and lithography properties such as the resolution, pattern shape and LWR are improved.

The aliphatic cyclic group having a fluorinated hydroxyalkyl group is the same as that described above for the structural unit (a1'), and as the aliphatic cyclic group (prior to the bonding of the fluorinated hydroxyalkyl group), groups in which two hydrogen atoms have been removed from cyclohexane, adamantane, norbornane or tetracyclododecane are readily available industrially, and are consequently preferred.

Of these monocyclic and polycyclic groups, a group in which two hydrogen atoms have been removed from norbornane is particularly desirable.

The structural unit (a1") is preferably a structural unit derived from acrylic acid. A structure in which the above-mentioned aliphatic cyclic group is bonded to the oxygen atom (—O—) at the terminal of the carbonyloxy group [—C(O)—O—] of an acrylate ester (namely, a structure in which the hydrogen atom of the carboxyl group of acrylic acid has been substituted with the aliphatic cyclic group) is particularly desirable.

As the structural unit (a1"), structural units (a1"-1) represented by general formula (1) shown below are preferred.

[Chemical Formula 42]

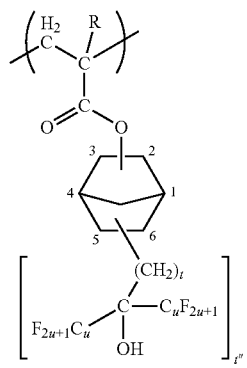

(1)

In formula (1), R represents a hydrogen atom, a lower alkyl group or a halogenated lower alkyl group, and each of u, t and t" independently represents an integer of 1 to 5.

In formula (1), R represents a hydrogen atom, a lower alkyl group or a halogenated lower alkyl group.

Examples of the lower alkyl group or halogenated lower alkyl group for R include the same groups as those listed above for the lower alkyl group or halogenated lower alkyl group that may be bonded to the α-position of the above-mentioned acrylate ester.

R is preferably a hydrogen atom or a lower alkyl group, and in terms of industrial availability, is most preferably a hydrogen atom or a methyl group.

Each u independently represents an integer of 1 to 5, and is preferably an integer of 1 to 3, and most preferably 1.

t represents an integer of 1 to 5, preferably an integer of 1 to 3, and most preferably 1.

t" represents an integer of 1 to 5, preferably an integer of 1 to 3, more preferably an integer of 1 or 2, and most preferably 1.

The structural unit (a1"-1) represented by general formula (1) preferably has a 2-norbornyl group or 3-norbornyl group bonded to the terminal of the carboxyl group of the α-lower alkyl)acrylic acid. The fluorinated alkyl alcohol is preferably bonded to the 5th or 6th position of the norbornyl group.

The structural unit (a1") may use either one type of structural unit, or a mixture of two or more types.

The amount of the structural unit (a1") within the component (A2-1-20), based on the combined total of all the structural units that constitute the component (A2-1-20), is preferably within a range from 10 to 90 mol %, more preferably from 20 to 90 mol %, still more preferably from 40 to 90 mol %, and most preferably from 45 to 85 mol %. Ensuring that this amount is at least as large as the lower limit of the above-mentioned range enables the effects generated by including the structural unit (a1") to be obtained, whereas by ensuring that the amount is not more than the upper limit of the above range, a good balance can be achieved with the other structural units.

Structural Unit (a2")

In addition to the structural unit (a1"), the component (A2-1-20) preferably also includes a structural unit (a2") derived from an acrylate ester containing a hydroxyl group-containing aliphatic cyclic group.

When a component (A2-1-20) that includes the structural unit (a2") is blended into the negative chemically amplified resist composition, the hydroxyl group (the alcoholic hydroxyl group) of this structural unit (a2") reacts with the component (C) under the action of the acid generated from the component (B), and this reaction causes the component (A2-1-20) to change from a state that is soluble in the alkali developing solution to a state that is insoluble.

The expression "hydroxyl group-containing aliphatic cyclic group" describes a group in which a hydroxyl group is bonded to an aliphatic cyclic group.

The number of hydroxyl groups bonded to the aliphatic cyclic group is preferably within a range from 1 to 3, and is most preferably 1.

The aliphatic cyclic group may be either monocyclic or polycyclic, but is preferably a polycyclic group. Furthermore, an alicyclic hydrocarbon group is preferred. Moreover, a saturated group is preferred. Furthermore, the number of carbon atoms within the aliphatic cyclic group is preferably within a range from 5 to 15.

Specific examples of the aliphatic cyclic group (prior to bonding of the hydroxyl group) include the same groups as those listed above in connection with the aliphatic cyclic group of the structural unit (a1").

As the aliphatic cyclic group of the structural unit (a2"), of the groups described above, a cyclohexyl group, adamantyl group, norbornyl group and tetracyclododecyl group are the most readily available commercially, and are consequently preferred. Of these, a cyclohexyl group or adamantyl group is particularly preferred, and an adamantyl group is the most desirable.

Besides the hydroxyl group, a linear or branched alkyl group of 1 to 4 carbon atoms may also be bonded to the aliphatic cyclic group.

In the structural unit (a2"), the hydroxyl group-containing aliphatic cyclic group is preferably bonded to the oxygen atom at the terminal of the ester group (—C(O)—O—) of the acrylate ester.

In such cases, in the structural unit (a2"), another substituent may be bonded to the α-position (the α-position carbon atom) of the acrylate ester instead of a hydrogen atom. Examples of preferred substituents include a lower alkyl group or a halogenated lower alkyl group.

Examples of this lower alkyl group or halogenated lower alkyl group include the same groups as those listed above for R within general formula (1) representing the above-mentioned structural unit (a1"), and of the various moieties that can be bonded to the α-position, a hydrogen atom or a lower alkyl group is preferred, and a hydrogen atom or methyl group is particularly desirable.

As the structural unit (a2"), structural units (a2"-1) represented by general formula (2) shown below are preferred.

[Chemical Formula 43]

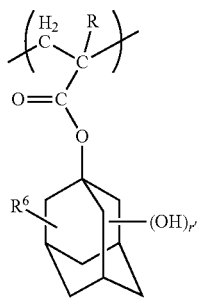

(2)

In formula (2), R is the same as defined above, $R^6$ represents a hydrogen atom, a lower alkyl group, or an alkoxy group of 1 to 5 carbon atoms, and r' represents an integer of 1 to 3.

R is the same as defined above for R in general formula (1).

The lower alkyl group for $R^6$ is the same as defined above for the lower alkyl group for R in general formula (1).

In general formula (2), R and $R^6$ are preferably both hydrogen atoms.

r' represents an integer of 1 to 3, and is most preferably 1.

Although there are no particular limitations on the bonding position of the hydroxyl group, units in which the hydroxyl group is bonded to the 3rd position of the adamantyl group are preferred.

The structural unit (a2") may use either one type of structural unit, or a mixture of two or more types.

The amount of the structural unit (a2") within the component (A2-1-20), based on the combined total of all the structural units that constitute the component (A2-1-20), is preferably within a range from 10 to 70 mol %, more preferably from 10 to 50 mol %, and most preferably from 20 to 40 mol %. Ensuring that this amount is at least as large as the lower limit of the above-mentioned range enables the effects generated by including the structural unit (a2") to be obtained, whereas by ensuring that the proportion is not more than the upper limit of the above range, a good balance can be achieved with the other structural units.

Structural Unit (a3")

In addition to the structural unit (a1"), or in addition to both the structural unit (a1") and the structural unit (a2"), the component (A2-1-20) preferably also includes a structural unit (a3") derived from an acrylic acid that has no cyclic structure and has an alcoholic hydroxyl group on a side chain.

When a component (A2-1-20) that includes the structural unit (a3") is blended into the negative chemically amplified resist composition, the alcoholic hydroxyl group of this structural unit (a3") reacts with the component (C), together with the hydroxyl group of the structural unit (a2"), under the action of the acid generated from the component (B).

Accordingly, the component (A2-1-20) changes more readily from a state that is soluble in the alkali developing solution to a state that is insoluble, which has the effect of improving the lithography properties such as the resolution. Further, thickness loss can also be suppressed. Furthermore, the controllability of the cross-linking reaction that occurs during pattern formation improves. Moreover, the film density also tends to increase, and as a result, the heat resistance tends to improve. Moreover, the etching resistance also improves.

In the structural unit (a3"), the expression "has no cyclic structure" means that the structural unit includes no aliphatic cyclic groups or aromatic groups.

The structural unit (a3") is readily distinguishable from the structural unit (a2") as a result of having no cyclic structure.

Examples of structural units that include an alcoholic hydroxyl group on a side chain include structural units having a hydroxyalkyl group.

Examples of this hydroxyalkyl group include the same hydroxyalkyl groups as those within the "fluorinated hydroxyalkyl group" described above in relation to the structural unit (a1").

The hydroxyalkyl group may, for example, be bonded directly to the α-position carbon atom of the main chain (the portion formed by cleavage of the ethylenic double bond of the acrylic acid), or may form an ester group through substitution of the hydrogen atom of the acrylic acid carboxyl group.

In the structural unit (a3"), the hydroxyalkyl group preferably exists at either one, or both of these locations.

In those cases where the hydroxyalkyl group is not bonded to the α-position, the hydrogen atom at the α-position carbon atom may be replaced with a lower alkyl group or a halogenated lower alkyl group.

Examples of this lower alkyl group or halogenated lower alkyl group include the same groups as those described above for R within general formula (1).

As the structural unit (a3"), structural units (a3"-1) represented by general formula (3) shown below are preferred.

[Chemical formula 44]

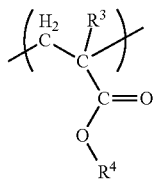

(3)

In formula (3), $R^3$ represents a hydrogen atom, a lower alkyl group, a halogenated lower alkyl group or a hydroxyalkyl group, and $R^4$ represents a hydrogen atom, an alkyl group or a hydroxyalkyl group, provided that at least one of $R^3$ and $R^4$ represents a hydroxyalkyl group.

The hydroxyalkyl group for $R^3$ is preferably a hydroxyalkyl group of not more than 10 carbon atoms, is preferably a linear or branched group, is more preferably a hydroxyalkyl group of 2 to 8 carbon atoms, and is most preferably a hydroxymethyl group or hydroxyethyl group.

There are no particular limitations on the number of hydroxyl groups or the bonding positions of those groups, although one hydroxyl group is typical, and the hydroxyl group is preferably bonded to the terminal of the alkyl group.

The lower alkyl group for $R^3$ is preferably an alkyl group of not more than 10 carbon atoms, more preferably an alkyl group of 2 to 8 carbon atoms, and is most preferably an ethyl group or methyl group.

The halogenated lower alkyl group for $R^3$ is preferably a lower alkyl group of not more than 5 carbon atoms (most preferably an ethyl group or methyl group) in which some or all of the hydrogen atoms have been substituted with halogen atoms (and preferably fluorine atoms).

Examples of the alkyl group and hydroxyalkyl group for $R^4$ include the same groups as those listed above for the lower alkyl group and hydroxyalkyl group for $R^3$.

Specific examples of the structural unit (a3"-1) represented by general formula (3) include structural units derived from α-(hydroxyalkyl)acrylic acids (but not including structural units derived from acrylate esters), structural units derived from alkyl α-(hydroxyalkyl)acrylate esters, and structural units derived from hydroxyalkyl (α-alkyl)acrylate esters.

Of these, including a structural unit derived from an alkyl α-(hydroxyalkyl)acrylate ester as the structural unit (a3") is preferred in terms of improving the film density. Of the various possibilities, structural units derived from ethyl α-(hydroxymethyl)acrylate or methyl α-(hydroxymethyl)acrylate are particularly desirable.

Furthermore, including a structural unit derived from a hydroxyalkyl (α-alkyl)acrylate ester as the structural unit (a3") is preferred in terms of improving the cross-linking efficiency. Of such units, structural units derived from hydroxyethyl α-methyl-acrylate or hydroxymethyl α-methyl-acrylate are particularly desirable.

The structural unit (a3") may use either one type of structural unit, or a mixture of two or more types.

The amount of the structural unit (a3") within the component (A2-1-20), based on the combined total of all the structural units that constitute the component (A2-1-20), is preferably within a range from 5 to 50 mol %, more preferably from 5 to 40 mol %, still more preferably from 5 to 30 mol %, and most preferably from 10 to 25 mol %. Ensuring that this amount is at least as large as the lower limit of the above-mentioned range enables the effects generated by including the structural unit (a3") to be obtained, whereas by ensuring that the amount is not more than the upper limit of the above range, a good balance can be achieved with the other structural units.

Other Structural Units

Besides each of the structural units (a1") to (a3") described above, the component (A2-1-20) may also include other copolymerizable structural units.

As such structural units, any of the structural units used in known resin components of conventional chemically amplified resist compositions can be used. An example is a structural unit (a4") derived from an acrylate ester that includes a lactone-containing monocyclic or polycyclic group.

As the structural unit (a4"), any unit that satisfies the above definition can be used without any particular limitations. Specific examples of lactone-containing monocyclic groups include groups in which one hydrogen atom has been removed from γ-butyrolactone. Further, examples of lactone-containing polycyclic groups include groups in which one hydrogen atom has been removed from a lactone ring-containing bicycloalkane, tricycloalkane, or tetracycloalkane.

The structural unit (a4") may use either one type of structural unit, or a mixture of two or more types.

If the structural unit (a4") is included in the component (A2-1-20), then the amount of the structural unit (a4") within the component (A2-1-20), based on the combined total of all the structural units that constitute the component (A2-1-20), is preferably within a range from 10 to 70 mol %, more preferably from 10 to 40 mol %, and most preferably from 10 to 25 mol %. Ensuring that this amount is at least as large as the lower limit of the above-mentioned range enables the effects generated by including the structural unit (a4"), that is, the effects in improving the adhesion between the resist film and the substrate, and increasing the compatibility with developing solutions containing water, to be obtained, whereas by ensuring that the amount is not more than the upper limit of the above range, a good balance can be achieved with the other structural units.

However, the component (A2-1-20) is preferably a polymeric compound in which the structural units (a1") to (a3") represent the main components.

Here, the term "main components" means that the combined amount of the structural units (a1") to (a3") represents at least 50 mol %, preferably at least 70 mol %, and more preferably 80 mol % or greater, of all the structural units. Component (A2-1-20) in which this proportion is 100 mol %, namely polymeric compounds composed solely of the structural unit (a1"), the structural unit (a2") and the structural unit (a3"), is the most desirable.

As the component (A2-1-20), polymeric compounds that include a combination of structural units such as that represented by formula (A2-1-21) shown below are particularly desirable.

[Chemical Formula 45]

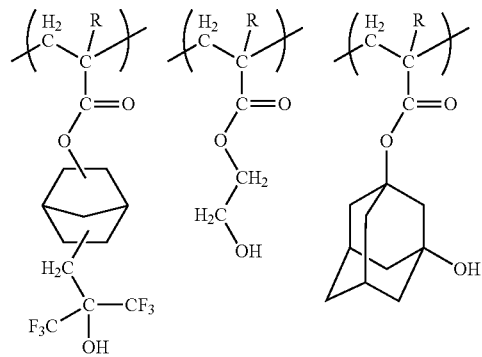

(A2-1-21)

In the formulas, R is the same as defined above, and the plurality of R may be the same or different from each other.

The weight average molecular weight (Mw) of the component (A2-1-20) is preferably within a range from 2,000 to 30,000, more preferably from 2,000 to 10,000, and most preferably from 3,000 to 8,000. Ensuring a molecular weight within this range is preferred in terms of obtaining a favorable dissolution rate within an alkali developing solution, and achieving a high level of resolution. For the weight average molecular weight, lower values within the above-mentioned range tend to yield more favorable properties.

Further, the dispersity (Mw/Mn) is preferably within a range from 1.0 to 5.0, and more preferably from 1.0 to 2.5.

When the component (A2-1) is used in the component (A2), one type of the component (A2-1-20) may be used alone, or a mixture of two or more types may be used.

In those cases where the component (A2-1-20) is used, the amount of the component (A2-1-20) within the component (A2-1) is preferably at least 40% by weight, more preferably at least 50% by weight, and still more preferably 60% by weight or greater.

The component (A2-1-10) or the component (A2-1-20) used in the present invention can be synthesized, for example, by the method disclosed in International Patent Publication 2004/076495 pamphlet, or a method in which the monomers that give rise to each of the structural units are subjected to a radical polymerization using normal methods.

As the component (A2), one type of component may be used alone, or two or more types may be used in combination.

Besides the component (A2-1-10) and the component (A2-1-20), the component (A2) may also use other polymeric compounds typically used within conventional negative resist compositions (such as hydroxystyrene resins, novolak resins or acrylic resins).

In the resist composition of the present invention, the amount of the component (A) can be appropriately adjusted depending on the thickness of the resist film to be formed.

<Component (B)>

In the resist composition of the present invention, there are no particular limitations on the component (B), and any of the known acid generators proposed for use in conventional chemically amplified resist compositions can be used.

Examples of these acid generators are numerous, and include onium salt-based acid generators such as iodonium salts and sulfonium salts, oxime sulfonate-based acid generators, diazomethane-based acid generators such as bisalkyl or bisaryl sulfonyl diazomethanes and poly(bis-sulfonyl)diazomethanes, nitrobenzylsulfonate-based acid generators, iminosulfonate-based acid generators, and disulfone-based acid generators.

As an onium salt-based acid generator, a compound represented by general formula (b-1) or (b-2) shown below may be used.

[Chemical formula 46]

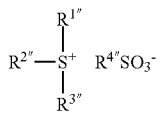

(b-1)

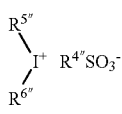

(b-2)

In the above formulas, $R^{1''}$ to $R^{3''}$, $R^{5''}$ and $R^{6''}$ each independently represents an aryl group or alkyl group, wherein two of $R^{1''}$ to $R^{3''}$ in formula (b-1) may be bonded to each other to form a ring with the sulfur atom, and $R^{4''}$ represents an alkyl group, halogenated alkyl group, aryl group or alkenyl group which may have a substituent, with the proviso that at least one of $R^{1''}$ to $R^{3''}$ represents an aryl group, and at least one of $R^{5''}$ and $R^{6''}$ represents an aryl group.

In formula (b-1), each of $R^{1''}$ to $R^{3''}$ independently represents an aryl group or an alkyl group. In formula (b-1), two of $R^{1''}$ to $R^{3''}$ may be bonded to each other to form a ring with the sulfur atom.

Further, among $R^{1''}$ to $R^{3''}$, at least one group represents an aryl group. Among $R^{1''}$ to $R^{3''}$, two or more groups are preferably aryl groups, and it is particularly desirable that all of $R^{1''}$ to $R^{3''}$ are aryl groups.

The aryl group for $R^{1''}$ to $R^{3''}$ is not particularly limited. For example, an aryl group having 6 to 20 carbon atoms may be used, in which some or all of the hydrogen atoms of the aryl group may or may not be substituted with alkyl groups, alkoxy groups, halogen atoms or hydroxyl groups.

The aryl group is preferably an aryl group having 6 to 10 carbon atoms because it can be synthesized at a low cost. Specific examples thereof include a phenyl group and naphthyl group.

The alkyl group with which hydrogen atoms of the aryl group may be substituted is preferably an alkyl group having 1 to 5 carbon atoms, and most preferably a methyl group, ethyl group, propyl group, n-butyl group or tert-butyl group.

The alkoxy group with which hydrogen atoms of the aryl group may be substituted is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or ethoxy group.

The halogen atom with which hydrogen atoms of the aryl group may be substituted is preferably a fluorine atom.

The alkyl group for $R^{1''}$ to $R^{3''}$ is not particularly limited and includes, for example, a linear, branched or cyclic alkyl group having 1 to 10 carbon atoms. In terms of achieving excellent resolution, the alkyl group preferably has 1 to 5 carbon atoms. Specific examples thereof include a methyl group, ethyl group, n-propyl group, isopropyl group, n-butyl group, isobutyl group, n-pentyl group, cyclopentyl group, hexyl group, cyclohexyl group, nonyl group or decyl group, and a methyl group is most preferable because it is excellent in resolution and can be synthesized at a low cost.

When two of $R^{1''}$ to $R^{3''}$ in formula (b-1) are bonded to each other to form a ring with the sulfur atom shown in the formula, it is preferable that the two of $R^{1''}$ to $R^{3''}$ form a 3- to 10-membered ring including the sulfur atom, and it is particularly desirable that the two of $R^{1''}$ to $R^{3''}$ form a 5- to 7-membered ring including the sulfur atom.

When two of $R^{1''}$ to $R^{3''}$ in formula (b-1) are bonded to each other to form a ring with the sulfur atom shown in the formula, the remaining one of $R^{1''}$ to $R^{3''}$ is preferably an aryl group. As examples of the aryl group, the same as the above-mentioned aryl groups for $R^{1''}$ to $R^{3''}$ can be used.

Preferred examples of the cation moiety for the compound represented by formula (b-1) include cation moieties containing a triphenylmethane skeleton represented by formulas (I-1-1) to (I-1-8) shown below.

[Chemical Formula 47]

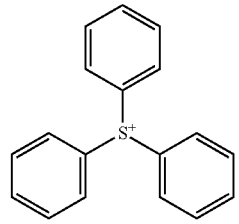

(I-1-1)

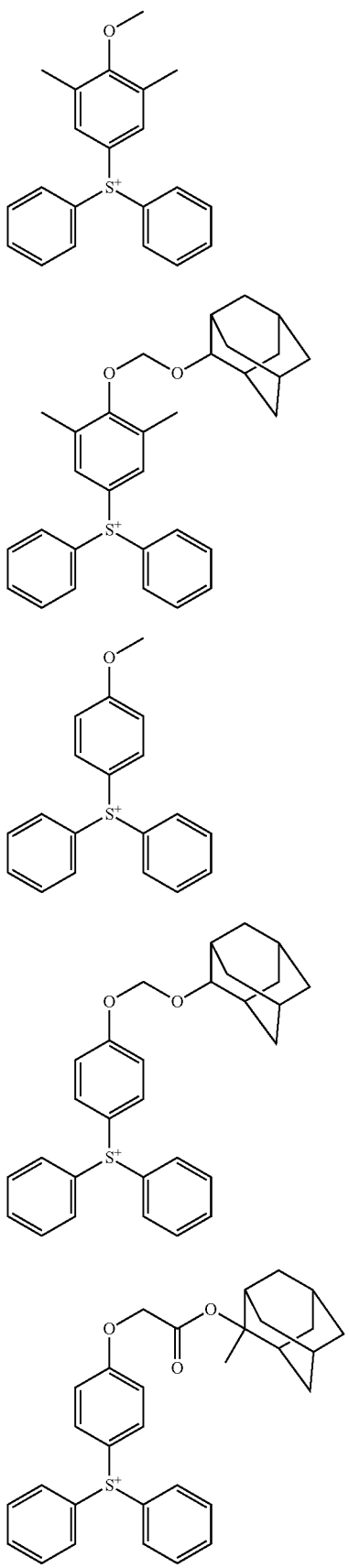

Further, cation moieties represented by formulas (I-1-9) and (I-1-10) shown below are also preferred as the cation moiety for an onium salt-based acid generator.

In formulas (I-1-9) and (I-1-10), each of $R^{27}$ and $R^{39}$ independently represents a phenyl group or naphthyl group which may have a substituent, an alkyl group of 1 to 5 carbon atoms, an alkoxy group or a hydroxyl group.

v is an integer of 1 to 3, and is most preferably 1 or 2.

[Chemical formula 48]

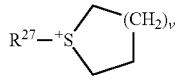

(I-1-9)

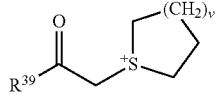

(I-1-10)

$R^{4'''}$ represents an alkyl group, halogenated alkyl group, aryl group or alkenyl group, which may have a substituent.

The alkyl group for $R^{4'''}$ may be any of linear, branched or cyclic.

The linear or branched alkyl group preferably contains 1 to 10 carbon atoms, more preferably 1 to 8 carbon atoms, and most preferably 1 to 4 carbon atoms.

The cyclic alkyl group preferably contains 4 to 15 carbon atoms, more preferably 4 to 10 carbon atoms, and most preferably 6 to 10 carbon atoms.

Examples of the halogenated alkyl group for $R^{4'''}$ include groups in which some or all of the hydrogen atoms of an aforementioned linear, branched or cyclic alkyl group have been substituted with halogen atoms. Examples of the halogen atoms include a fluorine atom, chlorine atom, bromine atom or iodine atom, and a fluorine atom is preferable.

In the halogenated alkyl group, the percentage of the number of halogen atoms based on the total number of halogen atoms and hydrogen atoms within the halogenated alkyl group (namely, the halogenation ratio (%)) is preferably within a range from 10 to 100%, more preferably from 50 to 100%, and most preferably 100%. A higher halogenation ratio is preferable because the acid strength increases.

The aryl group for $R^{4''}$ is preferably an aryl group of 6 to 20 carbon atoms.

The alkenyl group for $R^{4''}$ is preferably an alkenyl group of 2 to 10 carbon atoms.

With respect to $R^{4''}$, the expression "may have a substituent" means that some or all of the hydrogen atoms within the aforementioned linear, branched or cyclic alkyl group, halogenated alkyl group, aryl group or alkenyl group may be substituted with substituents (atoms other than hydrogen atoms, or groups).

$R^{4''}$ may have one substituent, or two or more substituents.

Examples of the substituent include halogen atoms, hetero atoms, alkyl groups, and groups represented by the formula $X-Q^1-$ (wherein $Q^1$ represents a divalent linking group containing an oxygen atom, and X represents a hydrocarbon group of 3 to 30 carbon atoms which may have a substituent).

Examples of the halogen atoms and alkyl groups include the same halogen atoms and alkyl groups as those described above with respect to the halogenated alkyl group for $R^{4''}$.

Examples of the hetero atoms include an oxygen atom, a nitrogen atom, and a sulfur atom.

In the group represented by formula $X-Q^1-$, $Q^1$ represents a divalent linking group containing an oxygen atom.

$Q^1$ may also contain atoms other than the oxygen atom. Examples of atoms other than the oxygen atom include a carbon atom, a hydrogen atom, a sulfur atom and a nitrogen atom.

Examples of the divalent linking group containing an oxygen atom include non-hydrocarbon-based oxygen atom-containing linking groups such as an oxygen atom (an ether bond, —O—), an ester bond (—C(=O)—O—), an amido bond (—C(=O)—NH—), a carbonyl group (—C(=O)—), a carbonate bond (—O—C(=O)—O—), and combinations of these non-hydrocarbon-based oxygen atom-containing linking groups with an alkylene group.

Specific examples of these combinations include —$R^{91}$—O—, —$R^{92}$—O—C(=O)—, and —C(=O)—O—$R^{93}$—O—C(=O)— (wherein each of $R^{91}$ to $R^{93}$ independently represents an alkylene group).

The alkylene group for $R^{91}$ to $R^{93}$ is preferably a linear or branched alkylene group, and preferably contains 1 to 12 carbon atoms, more preferably 1 to 5 carbon atoms, and most preferably 1 to 3 carbon atoms.

Specific examples of alkylene group include a methylene group [—CH$_2$—]; alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—; an ethylene group [—CH$_2$CH$_2$—]; alkylethylene groups such as —CH(CH$_3$)CH$_2$—, —CH(CH$_3$)CH(CH$_3$)—, —C(CH$_3$)$_2$CH$_2$— and —CH(CH$_2$CH$_3$)CH$_2$—; a trimethylene group (n-propylene group) [—CH$_2$CH$_2$CH$_2$—]; alkyltrimethylene groups such as —CH(CH$_3$)CH$_2$CH$_2$— and —CH$_2$CH(CH$_3$)CH$_2$—; a tetramethylene group [—CH$_2$CH$_2$CH$_2$CH$_2$—]; alkyltetramethylene groups such as —CH(CH$_3$)CH$_2$CH$_2$CH$_2$— and —CH$_2$CH(CH$_3$)CH$_2$CH$_2$—; and a pentamethylene group [—CH$_2$CH$_2$CH$_2$CH$_2$CH$_2$—].

$Q^1$ is preferably a divalent linking group containing an ester linkage or ether linkage, and more preferably a group represented by —$R^{91}$—O—, —$R^{92}$—O—C(=O)— or —C(=O)—O—$R^{93}$—O—C(=O)—.

In the group represented by the formula $X-Q^1-$, the hydrocarbon group for X may be either an aromatic hydrocarbon group or an aliphatic hydrocarbon group.

The aromatic hydrocarbon group is a hydrocarbon group having an aromatic ring. The aromatic hydrocarbon group preferably has 3 to 30 carbon atoms, more preferably 5 to 30, still more preferably 5 to 20, still more preferably 6 to 15, and most preferably 6 to 12 carbon atoms. This number of carbon atoms does not include any carbon atoms within substituents.

Specific examples of the aromatic hydrocarbon group include aryl groups, which are aromatic hydrocarbon rings having one hydrogen atom removed therefrom, such as a phenyl group, biphenyl group, fluorenyl group, naphthyl group, anthryl group or phenanthryl group, and arylalkyl groups such as a benzyl group, phenethyl group, 1-naphthylmethyl group, 2-naphthylmethyl group, 1-naphthylethyl group or 2-naphthylethyl group. The alkyl chain within the arylalkyl group preferably has 1 to 4 carbon atoms, more preferably 1 or 2 carbon atoms, and most preferably 1 carbon atom.

The aromatic hydrocarbon group may have a substituent. For example, some of the carbon atoms constituting the aromatic ring within the aromatic hydrocarbon group may be substituted with a hetero atom, or a hydrogen atom bonded to the aromatic ring within the aromatic hydrocarbon group may be substituted with a substituent.

Examples of the former case include heteroaryl groups in which a portion of the carbon atoms constituting the ring within an aforementioned aryl group have been substituted with a hetero atom such as an oxygen atom, a sulfur atom or a nitrogen atom, and heteroarylalkyl groups in which a portion of the carbon atoms constituting the aromatic hydrocarbon ring within an aforementioned arylalkyl group have been substituted with an aforementioned hetero atom.

In the latter example, examples of the substituent for the aromatic hydrocarbon group include an alkyl group, alkoxy group, halogen atom, halogenated alkyl group, hydroxyl group or oxygen atom (=O) or the like.

The alkyl group as the substituent for the aromatic hydrocarbon group is preferably an alkyl group having 1 to 5 carbon atoms, and a methyl group, ethyl group, propyl group, n-butyl group or tert-butyl group is particularly desirable.

The alkoxy group as the substituent for the aromatic hydrocarbon group is preferably an alkoxy group having 1 to 5 carbon atoms, is more preferably a methoxy group, ethoxy group, n-propoxy group, iso-propoxy group, n-butoxy group or tert-butoxy group, and is most preferably a methoxy group or an ethoxy group.

Examples of the halogen atom as the substituent for the aromatic hydrocarbon group include a fluorine atom, chlorine atom, bromine atom and iodine atom, and a fluorine atom is preferable.

Examples of the halogenated alkyl group as the substituent for the aromatic hydrocarbon group include groups in which some or all of the hydrogen atoms within an aforementioned alkyl group have been substituted with an aforementioned halogen atom.

The aliphatic hydrocarbon group for X may be either a saturated aliphatic hydrocarbon group or an unsaturated aliphatic hydrocarbon group. Further, the aliphatic hydrocarbon group may be a linear, branched or cyclic group.

In the aliphatic hydrocarbon group for X, a portion of the carbon atoms constituting the aliphatic hydrocarbon group may be substituted with a substituent containing a hetero atom, and/or some or all of the hydrogen atoms constituting the aliphatic hydrocarbon group may be substituted with a substituent containing a hetero atom.

There are no particular limitations on this "hetero atom" within X, as long as it is an atom other than a carbon atom or a hydrogen atom. Examples of the hetero atom include a halogen atom, oxygen atom, sulfur atom and nitrogen atom. Examples of the halogen atom include a fluorine atom, chlorine atom, iodine atom or bromine atom.

The substituent containing a hetero atom may consist solely of the hetero atom, or may be a group that also contains a group or atom other than a hetero atom.

Specific examples of the substituent for substituting a portion of the carbon atoms include —O—, —C(=O)—O—, —C(=O)—, —O—C(=O)—O—, —C(=O)—NH—, —NH— (wherein H may be substituted with a substituent such as an alkyl group or an acyl group), —S—, —S(=O)$_2$— and —S(=O)$_2$—O—. When the aliphatic hydrocarbon group is cyclic, these substituents may be included within the ring structure.

Examples of the substituent for substituting some or all of the hydrogen atoms include an alkoxy group, halogen atom, halogenated alkyl group, hydroxyl group, oxygen atom (=O) and cyano group.

The alkoxy group is preferably an alkoxy group of 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom include a fluorine atom, chlorine atom, bromine atom and iodine atom, and a fluorine atom is preferable.

Examples of the halogenated alkyl group includes a group in which some or all of the hydrogen atoms within an alkyl group of 1 to 5 carbon atoms (such as a methyl group, ethyl group, propyl group, n-butyl group or tert-butyl group) have been substituted with the aforementioned halogen atoms.

As the aliphatic hydrocarbon group, a linear or branched saturated hydrocarbon group, a linear or branched monovalent unsaturated hydrocarbon group, or a cyclic aliphatic hydrocarbon group (aliphatic cyclic group) is preferable.

The linear saturated hydrocarbon group (alkyl group) preferably contains 1 to 20 carbon atoms, more preferably 1 to 15 carbon atoms, and most preferably 1 to 10 carbon atoms. Specific examples include a methyl group, ethyl group, propyl group, butyl group, pentyl group, hexyl group, heptyl group, octyl group, nonyl group, decyl group, undecyl group, dodecyl group, tridecyl group, isotridecyl group, tetradecyl group, pentadecyl group, hexadecyl group, isohexadecyl group, heptadecyl group, octadecyl group, nonadecyl group, eicosyl group, heneicosyl group or docosyl group.

The branched saturated hydrocarbon group (alkyl group) preferably contains 3 to 20 carbon atoms, more preferably 3 to 15 carbon atoms, and most preferably 3 to 10 carbon atoms. Specific examples include a 1-methylethyl group, 1-methylpropyl group, 2-methylpropyl group, 1-methylbutyl group, 2-methylbutyl group, 3-methylbutyl group, 1-ethylbutyl group, 2-ethylbutyl group, 1-methylpentyl group, 2-methylpentyl group, 3-methylpentyl group or 4-methylpentyl group.

The unsaturated hydrocarbon group preferably contains 2 to 10 carbon atoms, more preferably 2 to 5 carbon atoms, still more preferably 2 to 4 carbon atoms, and most preferably 3 carbon atoms. Examples of linear monovalent unsaturated hydrocarbon groups include a vinyl group, a propenyl group (an allyl group) and a butynyl group. Examples of branched monovalent unsaturated hydrocarbon groups include a 1-methylpropenyl group and a 2-methylpropenyl group.

Among the above examples, a propenyl group is particularly desirable as the unsaturated hydrocarbon group.

The aliphatic cyclic group may be either a monocyclic group or a polycyclic group. The aliphatic cyclic group preferably contains 3 to 30 carbon atoms, more preferably 5 to 30, still more preferably 5 to 20, still more preferably 6 to 15, and most preferably 6 to 12 carbon atoms.

Examples of the aliphatic cyclic group include groups in which one or more hydrogen atoms have been removed from a monocycloalkane, and groups in which one or more hydrogen atoms have been removed from a polycycloalkane such as a bicycloalkane, tricycloalkane or tetracycloalkane. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

When the aliphatic cyclic group does not contain a hetero atom-containing substituent in the ring structure thereof, the aliphatic cyclic group is preferably a polycyclic group, more preferably a group in which one or more hydrogen atoms have been removed from a polycycloalkane, and most preferably a group in which one or more hydrogen atoms have been removed from adamantane.

When the aliphatic cyclic group contains a hetero atom-containing substituent in the ring structure thereof, the hetero atom-containing substituent is preferably —O—, —C(=O)—O—, —S—, —S(=O)$_2$— or —S(=O)$_2$—O—. Specific examples of such aliphatic cyclic groups include the aliphatic cyclic groups represented by formulas (L1) to (L5) and (S1) to (S4) shown below.

[Chemistry Formula 49]

(L1)

(L2)

(L3)

(L4)

(L5)

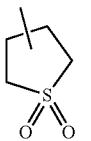
(S1)

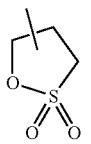
(S2)

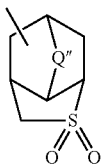
(S3)

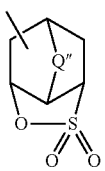
(S4)

In the formulas, Q" represents an alkylene group of 1 to 5 carbon atoms, —O—, —S—, —O—R$^{94}$— or —S—R$^{95}$— (wherein each of R$^{94}$ and R$^{95}$ independently represents an alkylene group of 1 to 5 carbon atoms), and m represents an integer of 0 or 1.

Examples of the alkylene groups for Q", R$^{94}$ and R$^{95}$ include the same alkylene groups as those described above for R$^{91}$ to R$^{93}$.

In these aliphatic cyclic groups, a portion of the hydrogen atoms bonded to the carbon atoms that constitute the ring structure may be substituted with a substituent. Examples of this substituent include an alkyl group, alkoxy group, halogen atom, halogenated alkyl group, hydroxyl group or oxygen atom (=O).

As the alkyl group, an alkyl group of 1 to 5 carbon atoms is preferable, and a methyl group, ethyl group, propyl group, n-butyl group or tert-butyl group is particularly desirable.

Examples of the alkoxy group and the halogen atom include the same groups and atoms as those listed above for the substituent used for substituting some or all of the hydrogen atoms.

Of the above options, X is preferably a cyclic group which may have a substituent. This cyclic group may be either an aromatic hydrocarbon group which may have a substituent, or an aliphatic cyclic group which may have a substituent, although an aliphatic cyclic group which may have a substituent is preferable.

As the aromatic hydrocarbon group, a naphthyl group which may have a substituent or a phenyl group which may have a substituent is preferable.

As the aliphatic cyclic group which may have a substituent, a polycyclic aliphatic group which may have a substituent is preferable. As this polycyclic aliphatic group, groups in which one or more hydrogen atoms have been removed from an aforementioned polycycloalkane, and groups represented by formulas (L2) to (L5), and (S3) and (S4) above are preferable.

Further, X is preferably a group containing a polar region, as such groups yield superior improvements in the lithography properties and resist pattern shape.

Examples of these groups containing a polar region include groups in which a portion of the carbon atoms that constitute the aliphatic cyclic group of the aforementioned group X have been substituted with a substituent containing a hetero atom, namely with a substituent such as —O—, —C(=O)—O—, —C(=O)—, —O—C(=O)—O—, —C(=O)—NH—, —NH— (wherein H may be substituted with a substituent such as an alkyl group or acyl group or the like), —S—, —S(=O)$_2$— or —S(=O)$_2$—O.

R$^{4''}$ preferably has X-Q$^1$- as a substituent. In such a case, R$^{4''}$ is preferably a group represented by the formula X-Q$^1$-Y$^1$—(wherein Q$^1$ and X are the same as defined above, and Y$^1$ represents an alkylene group of 1 to 4 carbon atoms which may have a substituent, or a fluorinated alkylene group of 1 to 4 carbon atoms which may have a substituent).

In the group represented by the formula X-Q$^1$-Y$^1$—, examples of the alkylene group represented by Y$^1$ include those alkylene groups described above for Q$^1$ in which the number of carbon atoms is from 1 to 4.

Examples of the fluorinated alkylene group for Y$^1$ include groups in which some or all of the hydrogen atoms of an aforementioned alkylene group have been substituted with fluorine atoms.

Specific examples of Y$^1$ include —CF$_2$—, —CF$_2$CF$_2$—, —CF$_2$CF$_2$CF$_2$—, —CF(CF$_3$)CF$_2$—, —CF(CF$_2$CF$_3$)—, —C(CF$_3$)$_2$—, —CF$_2$CF$_2$CF$_2$CF$_2$—, —CF(CF$_3$)CF$_2$CF$_2$—, —CF$_2$CF(CF$_3$)CF$_2$—, —CF(CF$_3$)CF(CF$_3$)—, —C(CF$_3$)$_2$CF$_2$—, —CF(CF$_2$CF$_3$)CF$_2$—, —CF(CF$_2$CF$_2$CF$_3$)—, —C(CF$_3$)(CF$_2$CF$_3$)—, —CHF—, —CH$_2$CF$_2$—, —CH$_2$CH$_2$CF$_2$—, —CH$_2$CF$_2$CF$_2$—, —CH(CF$_3$)CH$_2$—, —CH(CF$_2$CF$_3$)—, —C(CH$_3$)(CF$_3$)—, —CH$_2$CH$_2$CH$_2$CF$_2$—, —CH$_2$CH$_2$CF$_2$CF$_2$—, —CH(CF$_3$)CH$_2$CH$_2$—, —CH$_2$CH(CF$_3$)CH$_2$—, —CH(CF$_3$)CH(CF$_3$)—, —C(CF$_3$)$_2$CH$_2$—, —CH$_2$—, —CH$_2$CH$_2$—, —CH$_2$CH$_2$CH$_2$—, —CH(CH$_3$)CH$_2$—, —CH(CH$_2$CH$_3$)—, —C(CH$_3$)$_2$—, —CH$_2$CH$_2$CH$_2$CH$_2$—, —CH(CH$_3$)CH$_2$CH$_2$—, —CH$_2$CH(CH$_3$)CH$_2$—, —CH(CH$_3$)CH(CH$_3$)—, —C(CH$_3$)$_2$CH$_2$—, —CH(CH$_2$CH$_3$)CH$_2$—, —CH(CH$_2$CH$_2$CH$_3$)— and —C(CH$_3$)(CH$_2$CH$_3$)—.

Y$^1$ is preferably a fluorinated alkylene group, and particularly preferably a fluorinated alkylene group in which the carbon atom bonded to the adjacent sulfur atom is fluorinated. Examples of such fluorinated alkylene groups include —CF$_2$—, —CF$_2$CF$_2$—, —CF$_2$CF$_2$CF$_2$—, —CF(CF$_3$)CF$_2$—, —CF$_2$CF$_2$CF$_2$CF$_2$—, —CF(CF$_3$)CF$_2$CF$_2$—, —CF$_2$CF(CF$_3$)CF$_2$—, —CF(CF$_3$)CF(CF$_3$)—, —C(CF$_3$)$_2$CF$_2$—, —CF(CF$_2$CF$_3$)CF$_2$—; —CH$_2$CF$_2$—, —CH$_2$CH$_2$CF$_2$—, —CH$_2$CF$_2$CF$_2$—; —CH$_2$CH$_2$CH$_2$CF$_2$—, —CH$_2$CH$_2$CF$_2$CF$_2$—, and —CH$_2$CF$_2$CF$_2$CF$_2$—.

Of these, —CF$_2$—, —CF$_2$CF$_2$—, —CF$_2$CF$_2$CF$_2$— or CH$_2$CF$_2$CF$_2$— is preferable, —CF$_2$—, —CF$_2$CF$_2$— or —CF$_2$CF$_2$CF$_2$— is more preferable, and —CF$_2$— is particularly desirable.

The alkylene group or fluorinated alkylene group may have a substituent. The expression that the alkylene group or fluorinated alkylene group "may have a substituent" means that some or all of the hydrogen atoms or fluorine atoms in the alkylene group or fluorinated alkylene group may be substituted, either with atoms or with groups other than hydrogen atoms and fluorine atoms.

Examples of substituents which the alkylene group or fluorinated alkylene group may have include alkyl groups of 1 to 4 carbon atoms, alkoxy groups of 1 to 4 carbon atoms, and a hydroxyl group.

In formula (b-2), each of $R^{5''}$ and $R^{6''}$ independently represents an aryl group or alkyl group. At least one of $R^{5''}$ and $R^{6''}$ represents an aryl group. It is preferable that $R^{5''}$ and $R^{6''}$ both represent aryl groups.

As the aryl group for $R^{5''}$ and $R^{6''}$, the same as the aryl groups for $R^{1''}$ to $R^{3''}$ can be used.

As the alkyl group for $R^{5''}$ and $R^{6''}$, the same as the alkyl groups for $R^{1''}$ to $R^{3''}$ can be used.

It is particularly desirable that $R^{5''}$ and $R^{6''}$ both represent phenyl groups.

As $R^{4''}$ in formula (b-2), the same as those mentioned above for $R^{4''}$ in formula (b-1) can be used.

Specific examples of the onium salt-based acid generators represented by formula (b-1) or (b-2) include diphenyliodonium trifluoromethanesulfonate or nonafluorobutanesulfonate, bis(4-tert-butylphenyl)iodonium trifluoromethanesulfonate or nonafluorobutanesulfonate, triphenylsulfonium trifluoromethanesulfonate, heptafluoropropanesulfonate or nonafluorobutanesulfonate, tri(4-methylphenyl)sulfonium trifluoromethanesulfonate, heptafluoropropanesulfonate or nonafluorobutanesulfonate, dimethyl(4-hydroxynaphthyl)sulfonium trifluoromethanesulfonate, heptafluoropropanesulfonate or nonafluorobutanesulfonate, monophenyldimethylsulfonium trifluoromethanesulfonate, heptafluoropropanesulfonate or nonafluorobutanesulfonate, diphenylmonomethylsulfonium trifluoromethanesulfonate, heptafluoropropanesulfonate or nonafluorobutanesulfonate, (4-methylphenyl)diphenylsulfonium trifluoromethanesulfonate, heptafluoropropanesulfonate or nonafluorobutanesulfonate, (4-methoxyphenyl)diphenylsulfonium trifluoromethanesulfonate, heptafluoropropanesulfonate or nonafluorobutanesulfonate, tri(4-tert-butyl)phenylsulfonium trifluoromethanesulfonate, heptafluoropropanesulfonate or nonafluorobutanesulfonate, diphenyl(1-(4-methoxy)naphthyl)sulfonium trifluoromethanesulfonate, heptafluoropropanesulfonate or nonafluorobutanesulfonate, di(1-naphthyl)phenylsulfonium trifluoromethanesulfonate, heptafluoropropanesulfonate or nonafluorobutanesulfonate, 1-phenyltetrahydrothiophenium trifluoromethanesulfonate, heptafluoropropanesulfonate or nonafluorobutanesulfonate, 1-(4-methylphenyl)tetrahydrothiophenium trifluoromethanesulfonate, heptafluoropropanesulfonate or nonafluorobutanesulfonate, 1-(3,5-dimethyl-4-hydroxyphenyl)tetrahydrothiophenium trifluoromethanesulfonate, heptafluoropropanesulfonate or nonafluorobutanesulfonate, 1-(4-methoxynaphthalene-1-yl)tetrahydrothiophenium trifluoromethanesulfonate, heptafluoropropanesulfonate or nonafluorobutanesulfonate, 1-(4-ethoxynaphthalene-1-yl)tetrahydrothiophenium trifluoromethanesulfonate, heptafluoropropanesulfonate or nonafluorobutanesulfonate, 1-(4-n-butoxynaphthalene-1-yl)tetrahydrothiophenium trifluoromethanesulfonate, heptafluoropropanesulfonate or nonafluorobutanesulfonate, 1-phenyltetrahydrothiopyranium trifluoromethanesulfonate, heptafluoropropanesulfonate or nonafluorobutanesulfonate, 1-(4-hydroxyphenyl)tetrahydrothiopyranium trifluoromethanesulfonate, heptafluoropropanesulfonate or nonafluorobutanesulfonate, 1-(3,5-dimethyl-4-hydroxyphenyl)tetrahydrothiopyranium trifluoromethanesulfonate, heptafluoropropanesulfonate or nonafluorobutanesulfonate, and 1-(4-methylphenyl)tetrahydrothiopyranium trifluoromethanesulfonate, heptafluoropropanesulfonate or nonafluorobutanesulfonate.

It is also possible to use onium salts in which the anion moiety of these onium salts has been replaced by either an alkylsulfonate such as methanesulfonate, n-propanesulfonate, n-butanesulfonate, n-octanesulfonate, 1-adamantanesulfonate or 2-norbornanesulfonate; or a sulfonate such as d-camphor-10-sulfonate, benzenesulfonate, perfluorobenzenesulfonate or p-toluenesulfonate.

Further, onium salts in which the anion moiety of these onium salts has been replaced by an anion moiety represented by any one of chemical formulas (b1) to (b8) shown below can also be used.

[Chemical Formula 50]

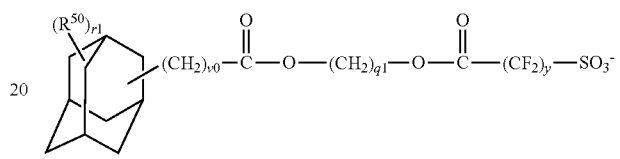
(b1)

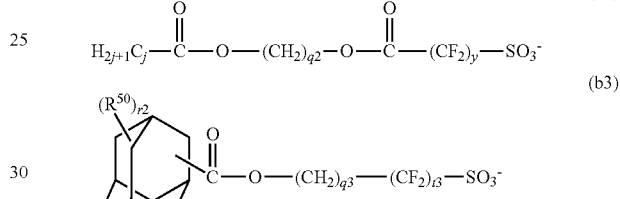
(b2)

(b3)
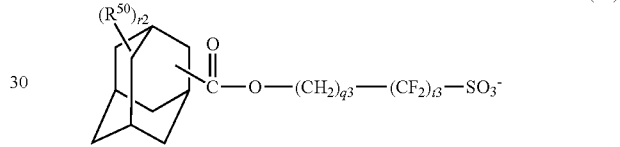

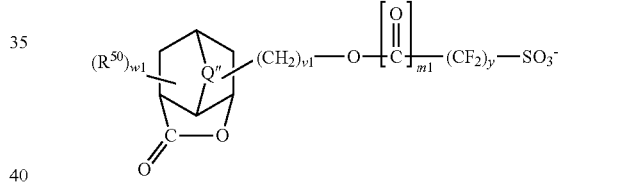
(b4)

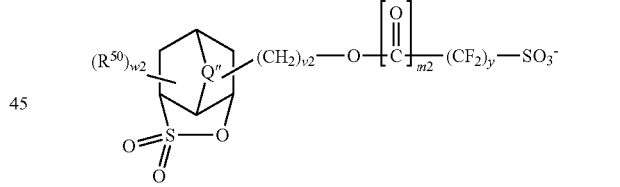
(b5)

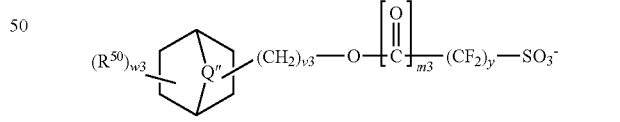
(b6)

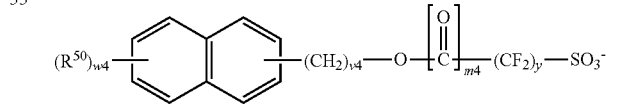
(b7)

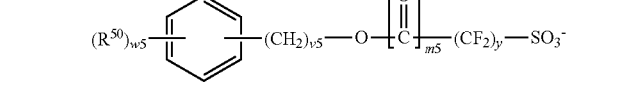
(b8)

In the formulas, each y independently represents an integer of 1 to 3, each of q1 and q2 independently represents an integer of 1 to 5, q3 represents an integer of 1 to 12, t3 represents an integer of 1 to 3, each of r1 and r2 independently represents an integer of 0 to 3, j represents an integer of 1 to 20, $R^{50}$ represents a substituent, each of m1 to m5 independently represents 0 or 1, each of v0 to v5 independently represents an integer of 0 to 3, each of w1 to w5 independently represents an integer of 0 to 3, and Q'' is the same as defined above.

Examples of the substituent for $R^{50}$ include the same groups as those which the aforementioned aliphatic hydrocarbon group or aromatic hydrocarbon group for X may have as a substituent.

If there are two or more $R^{50}$ groups, as indicated by the values r1 and r2, and w1 to w5, then the plurality of $R^{50}$ groups within the compound may be the same or different from each other.

Further, onium salt-based acid generators in which the anion moiety ($R^{4''}SO_3^-$) in general formula (b-1) or (b-2) is replaced by an anion moiety represented by general formula (b-3) or (b-4) shown below (and the cation moiety is the same as cation moiety within formula (b-1) or (b-2)) may also be used as the onium salt-based acid generator.

[Chemical Formula 51]

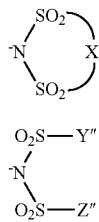

(b-3)

(b-4)

In the formula, X'' represents an alkylene group of 2 to 6 carbon atoms in which at least one hydrogen atom has been substituted with a fluorine atom; and each of Y'' and Z'' independently represents an alkyl group of 1 to 10 carbon atoms in which at least one hydrogen atom has been substituted with a fluorine atom.

X'' represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

Each of Y'' and Z'' independently represents a linear or branched alkyl group in which at least one hydrogen atom has been substituted with a fluorine atom, and the alkyl group has 1 to 10 carbon atoms, preferably 1 to 7 carbon atoms, and more preferably 1 to 3 carbon atoms.

The smaller the number of carbon atoms of the alkylene group for X'' or those of the alkyl group for Y'' and Z'' within the above-mentioned range of the number of carbon atoms, the more preferable because of the reason that the solubility in a resist solvent is improved, and the like.

Further, in the alkylene group for X'' or the alkyl group for Y'' and Z'', it is preferable that the number of hydrogen atoms substituted with fluorine atoms is as large as possible, because the acid strength increases and the transparency to high energy radiation of 200 nm or less or electron beam is improved.

The ratio of fluorine atoms within the alkylene group or alkyl group, namely the fluorination ratio, is preferably within a range from 70 to 100%, and more preferably from 90 to 100%. It is particularly desirable that the alkylene group or alkyl group is a perfluoroalkylene or perfluoroalkyl group in which all hydrogen atoms are substituted with fluorine atoms.

Further, onium salt-based acid generators in which the anion moiety ($R^{4''}SO_3^-$) in general formula (b-1) or (b-2) is replaced by $R^a$—COO— (wherein $R^a$ represents an alkyl group or a fluorinated alkyl group) (and the cation moiety is the same as cation moiety within formula (b-1) or (b-2)) may also be used as the onium salt-based acid generator.

In the formula above, as $R^a$, the same groups as those described above for $R^{4''}$ can be used.

Specific examples of $R^a$—COO— include a trifluoroacetate ion, an acetate ion, and a 1-adamantanecarboxylate ion.

Furthermore, as the onium salt-based acid generator, a sulfonium salt having a cation moiety represented by general formula (b-5) or (b-6) shown below may also be used.

[Chemical Formula 52]

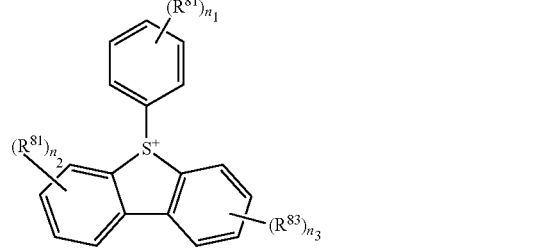

(b-5)

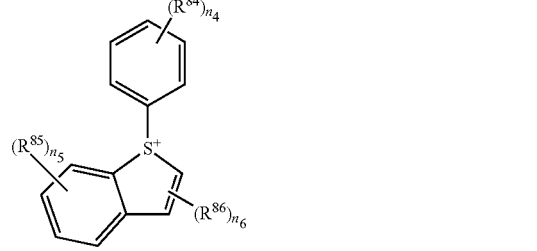

(b-6)

In the above formula, each of $R^{81}$ to $R^{86}$ independently represents an alkyl group, acetyl group, alkoxy group, carboxyl group, hydroxyl group or hydroxyalkyl group, each of $n_1$ to $n_5$ independently represents an integer of 0 to 3, and $n_6$ represents an integer of 0 to 2.

The alkyl group for $R^{81}$ to $R^{86}$ is preferably an alkyl group of 1 to 5 carbon atoms, more preferably a linear or branched alkyl group, and most preferably a methyl group, ethyl group, propyl group, isopropyl group, n-butyl group or tert-butyl group.

The alkoxy group is preferably an alkoxy group of 1 to 5 carbon atoms, more preferably a linear or branched alkoxy group, and most preferably a methoxy group or ethoxy group.

The hydroxyalkyl group is preferably the aforementioned alkyl group in which one or more hydrogen atoms have been substituted with hydroxy groups, and examples thereof include a hydroxymethyl group, hydroxyethyl group and hydroxypropyl group.

When the subscripts $n_1$ to $n_6$ of $R^{81}$ to $R^{86}$ represent an integer of 2 or more, the plurality of $R^{81}$ to $R^{86}$ groups may be the same or different.

$n_1$ is preferably 0 to 2, more preferably 0 or 1, and still more preferably 0.

It is preferable that $n_2$ and $n_3$ each independently represent 0 or 1, and more preferably 0.

$n_4$ is preferably 0 to 2, and more preferably 0 or 1.

$n_5$ is preferably 0 or 1, and more preferably 0.

$n_6$ is preferably 0 or 1, and more preferably 1.

The anion moiety of the sulfonium salt having a cation moiety represented by general formula (b-5) or (b-6) is not particularly limited, and the same anion moieties for onium salt-based acid generators which have been proposed may be used. Examples of such anion moieties include fluorinated alkylsulfonate ions such as anion moieties ($R^{4"}SO_3^-$) for onium salt-based acid generators represented by general formula (b-1) or (b-2) shown above, and anion moieties represented by general formula (b-3) or (b-4) shown above.

In the present description, an oxime sulfonate-based acid generator is a compound having at least one group represented by general formula (B-1) shown below, and has a feature of generating acid upon irradiation (exposure). Such oxime sulfonate-based acid generators are widely used for a chemically amplified resist composition, and can be selected as appropriate.

[Chemical Formula 53]

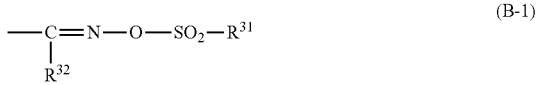

(B-1)

In formula (B-1), each of $R^{31}$ and $R^{32}$ independently represents an organic group.

The organic group for $R^{31}$ and $R^{32}$ refers to a group containing a carbon atom, and may also include atoms other than carbon atoms (such as a hydrogen atom, oxygen atom, nitrogen atom, sulfur atom or halogen atom (such as a fluorine atom or chlorine atom) or the like).

As the organic group for $R^{31}$, a linear, branched or cyclic alkyl group or aryl group is preferable. The alkyl group or aryl group may have a substituent. There are no particular limitations on the substituent, and examples thereof include a fluorine atom and a linear, branched or cyclic alkyl group having 1 to 6 carbon atoms. The expression that the alkyl group or aryl group "may have a substituent" means that some or all of the hydrogen atoms of the alkyl group or aryl group may be substituted with a substituent.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which some of the hydrogen atoms are substituted with halogen atoms, and the "completely halogenated alkyl group" refers to an alkyl group in which all of the hydrogen atoms are substituted with halogen atoms. Examples of the halogen atom include a fluorine atom, chlorine atom, bromine atom or iodine atom, and a fluorine atom is particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, a partially or completely halogenated aryl group is particularly desirable. The "partially halogenated aryl group" refers to an aryl group in which some of the hydrogen atoms are substituted with halogen atoms, and the "completely halogenated aryl group" refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched or cyclic alkyl group, an aryl group, or a cyano group is preferable. Examples of the alkyl group and the aryl group for $R^{32}$ include the same alkyl groups and aryl groups as those described above for $R^{31}$.

As $R^{32}$, a cyano group, an alkyl group of 1 to 8 carbon atoms having no substituent, or a fluorinated alkyl group of 1 to 8 carbon atoms is particularly desirable.

Preferred examples of the oxime sulfonate-based acid generator include compounds represented by general formula (B-2) or (B-3) shown below.

[Chemical Formula 54]

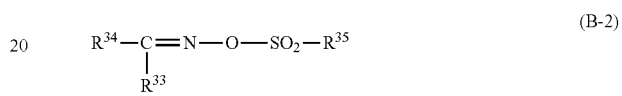

(B-2)

In formula (B-2), $R^{33}$ represents a cyano group, an alkyl group having no substituent or a halogenated alkyl group; $R^{34}$ represents an aryl group; and $R^{35}$ represents an alkyl group having no substituent or a halogenated alkyl group.

[Chemical Formula 55]

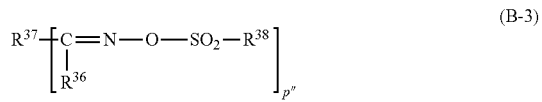

(B-3)

In formula (B-3), $R^{36}$ represents a cyano group, an alkyl group having no substituent or a halogenated alkyl group; $R^{37}$ represents a divalent or trivalent aromatic hydrocarbon group; $R^{38}$ represents an alkyl group having no substituent or a halogenated alkyl group; and p" represents 2 or 3.

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more fluorinated, and most preferably 90% or more fluorinated.

Examples of the aryl group for $R^{34}$ include groups in which one hydrogen atom has been removed from an aromatic hydrocarbon ring, such as a phenyl group, biphenyl group, fluorenyl group, naphthyl group, anthryl group or phenanthryl group, and heteroaryl groups in which some of the carbon atoms constituting the ring(s) of these groups are substituted with hetero atoms such as an oxygen atom, a sulfur atom or a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. The halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has 50% or more of the hydrogen atoms fluorinated, more preferably 70% or more fluorinated, still more preferably 90% or more fluorinated. A completely fluorinated alkyl group in which 100% of the hydrogen atoms are substituted with fluorine atoms is particularly desirable.

In general formula (B-3), the alkyl group having no substituent and the halogenated alkyl group for $R^{36}$ are the same as the alkyl group having no substituent and the halogenated alkyl group for $R^{33}$.

Examples of the divalent or trivalent aromatic hydrocarbon group for $R^{37}$ include groups in which one or two hydrogen atoms have been removed from the aryl group for $R^{34}$.

As the alkyl group having no substituent or the halogenated alkyl group for $R^{38}$, the same one as the alkyl group having no substituent or the halogenated alkyl group for $R^{35}$ can be used.

p" is preferably 2.

Specific examples of suitable oxime sulfonate-based acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate-based acid generators disclosed in Japanese Unexamined Patent Application, First Publication No. Hei 9-208554 (Chemical Formulas 18 and 19 shown in paragraphs [0012] to [0014]) and oxime sulfonate-based acid generators disclosed in International Patent Publication No. 2004/074242 pamphlet (Examples 1 to 40 described on pages 65 to 85) may also be used favorably.

Furthermore, the following compounds may also be used as preferred examples.

[Chemical Formula 56]

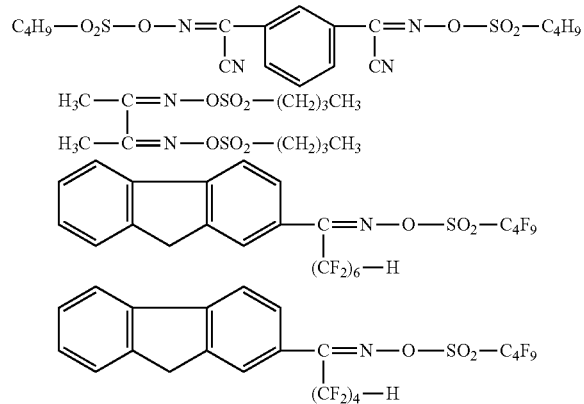

Of the aforementioned diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane-based acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may be preferably used.

Furthermore, as poly(bis-sulfonyl)diazomethanes, those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, may be used.

As the component (B), one type of acid generator described above may be used alone, or two or more types of acid generators may be used in combination.

The use of an onium salt-based acid generator having a fluorinated alkylsulfonate ion as the anion as the component (B) is particularly desirable.

The amount of the component (B) within the resist composition of the present invention is preferably within a range from 0.5 to 50 parts by weight, and more preferably 1 to 40 parts by weight, relative to 100 parts by weight of the component (A). By ensuring that the amount of the component (B) is within the above-mentioned range, formation of a pattern can be performed satisfactorily. Further, by virtue of the above-mentioned range, a uniform solution can be obtained and the storage stability tends to improve.

<Optional Components>

[Component (C)]

In those cases where the resist composition of the present invention is a negative-type chemically amplified resist composition, the component (A) includes the component (A2-1), and preferably also includes a cross-linking component (C) (hereafter referred to as "component (C)").

There are no particular limitations on the component (C), which may be selected appropriately from the various cross-linkers used within conventional chemically amplified negative resist compositions.

Examples include aliphatic cyclic hydrocarbons containing a hydroxyl group, a hydroxyalkyl group, or a hydroxyl group and a hydroxyalkyl group, as well as oxygen-containing derivatives thereof, such as 2,3-dihydroxy-5-hydroxymethylnorbornane, 2-hydroxy-5,6-bis(hydroxymethyl)norbornane, cyclohexanedimethanol, 3,4,8 (or 9)-trihydroxytricyclodecane, 2-methyl-2-adamantanol, 1,4-dioxane-2,3-diol, and 1,3,5-trihydroxycyclohexane.

Furthermore, other examples include compounds produced by reacting an amino group-containing compound such as melamine, acetoguanamine, benzoguanamine, urea, ethylene urea, propylene urea or glycoluril with either formaldehyde or a combination of formaldehyde and a lower alcohol, thereby substituting the hydrogen atoms of the amino group with hydroxymethyl groups or lower alkoxymethyl groups, as well as compounds having an epoxy group.

Of these, compounds that use melamine are referred to as melamine-based cross-linkers, compounds that use urea are referred to as urea-based cross-linkers, compounds that use an alkylene urea such as ethylene urea or propylene urea are referred to as alkylene urea-based cross-linkers, compounds that use glycoluril are referred to as glycoluril-based cross-linkers, and compounds that use a compound having an epoxy group are referred to as epoxy-based cross-linkers.

As the component (C), at least one type of cross-linker selected from the group consisting of melamine-based cross-linkers, urea-based cross-linkers, alkylene urea-based cross-linkers, glycoluril-based cross-linkers and epoxy-based cross-linkers is preferred, and a glycoluril-based cross-linker is particularly desirable.

Examples of the melamine-based cross-linkers include compounds obtained by reacting melamine with formaldehyde, thereby substituting the hydrogen atoms of the amino group with hydroxymethyl groups, and compounds obtained by reacting melamine with formaldehyde and a lower alcohol, thereby substituting the hydrogen atoms of the amino group with lower alkoxymethyl groups. Specific examples include hexamethoxymethylmelamine, hexaethoxymethylmelamine, hexapropoxymethylmelamine and hexabutoxybutylmelamine, and of these, hexamethoxymethylmelamine is preferred.

Examples of the urea-based cross-linkers include compounds obtained by reacting urea with formaldehyde, thereby substituting the hydrogen atoms of the amino group with hydroxymethyl groups, and compounds obtained by reacting urea with formaldehyde and a lower alcohol, thereby substituting the hydrogen atoms of the amino group with lower alkoxymethyl groups. Specific examples include bismethoxymethylurea, bisethoxymethylurea, bispropoxymethylurea and bisbutoxymethylurea, and of these, bismethoxymethylurea is preferred.

Examples of the alkylene urea-based cross-linkers include compounds represented by general formula (C-1) shown below.

[Chemical Formula 57]

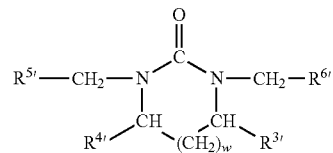

(C-1)

In formula (C-1), each of $R^{5'}$ and $R^{6'}$ independently represents a hydroxyl group or a lower alkoxy group, each of $R^{3'}$ and $R^{4'}$ independently represents a hydrogen atom, a hydroxyl group or a lower alkoxy group, and w represents 0 or an integer of 1 to 2.

When $R^{5'}$ or $R^{6'}$ represents a lower alkoxy group, an alkoxy group of 1 to 4 carbon atoms is preferred, and the alkoxy group may be either linear or branched. $R^{5'}$ and $R^{6'}$ may be either the same or different, but are preferably the same.

When $R^{3'}$ or $R^{4'}$ represents a lower alkoxy group, an alkoxy group of 1 to 4 carbon atoms is preferred, and the alkoxy group may be either linear or branched. $R^{3'}$ and $R^{4'}$ may be either the same or different, but are preferably the same.

w is either 0 or an integer from 1 to 2, and is preferably 0 or 1.

As the alkylene urea-based cross-linker, compounds in which w is 0 (ethylene urea-based cross-linkers) and/or compounds in which w is 1 (propylene urea-based cross-linkers) are preferred.

Compounds represented by general formula (C-1) above can be obtained by a condensation reaction between an alkylene urea and formalin, and by further reacting the resulting product with a lower alcohol.

Specific examples of the alkylene urea-based cross-linkers include ethylene urea-based cross-linkers such as mono- and/or di-hydroxymethylated ethylene urea, mono- and/or di-methoxymethylated ethylene urea, mono- and/or di-ethoxymethylated ethylene urea, mono- and/or di-propoxymethylated ethylene urea, and mono- and/or di-butoxymethylated ethylene urea; propylene urea-based cross-linkers such as mono- and/or di-hydroxymethylated propylene urea, mono- and/or di-methoxymethylated propylene urea, mono- and/or di-ethoxymethylated propylene urea, mono- and/or di-propoxymethylated propylene urea, and mono- and/or di-butoxymethylated propylene urea; as well as 1,3-di(methoxymethyl)-4,5-dihydroxy-2-imidazolidinone, and 1,3-di(methoxymethyl)-4,5-dimethoxy-2-imidazolidinone.

Examples of the glycoluril-based cross-linkers include glycoluril derivatives in which the N-position is substituted with either one or both of a hydroxyalkyl group and an alkoxyalkyl group of 1 to 4 carbon atoms. These glycoluril derivatives can be obtained by a condensation reaction between glycoluril and formalin, and by further reacting the resulting product with a lower alcohol.

Specific examples of the glycoluril-based cross-linkers include mono-, di-, tri- and/or tetra-hydroxymethylated glycoluril, mono-, di-, tri- and/or tetra-methoxymethylated glycoluril, mono-, di-, tri- and/or tetra-ethoxymethylated glycoluril, mono-, di-, tri- and/or tetra-propoxymethylated glycoluril, and mono-, di-, tri- and/or tetra-butoxymethylated glycoluril.

There are no particular restrictions on the epoxy-based cross-linkers, and any cross-linker having an epoxy group (and a molecular weight of less than 1,000) may be used. Of such cross-linkers, those having two or more epoxy groups are preferred. Including two or more epoxy groups improves the cross-linking reaction.

The number of epoxy groups is preferably at least two, more preferably from 2 to 4, and is most preferably 2.

Preferred examples of the epoxy-based cross-linkers are shown below.

[Chemical Formula 58]

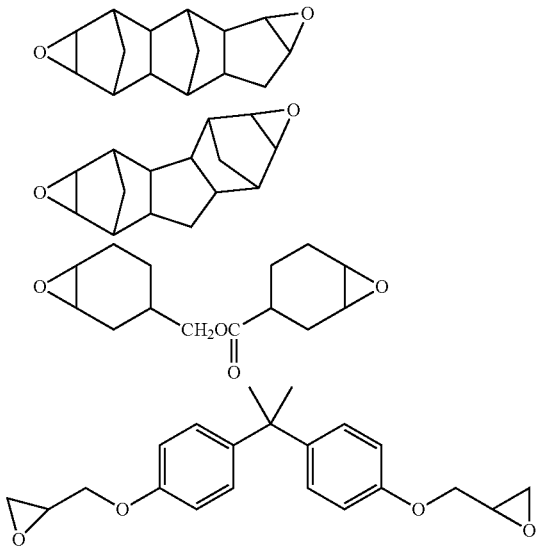

As the component (C), one type of cross-linker may be used alone, or two or more types may be used in combination.

The amount of the component (C) is preferably within a range from 1 to 50 parts by weight, more preferably from 3 to 30 parts by weight, still more preferably from 3 to 15 parts by weight, and most preferably from 5 to 10 parts by weight, relative to 100 parts by weight of the component (A). By ensuring that the amount of the component (C) is at least as large as the lower limit of the above-mentioned range, the formation of cross-linking is able to proceed favorably, and a favorable resist pattern with minimal swelling is obtained. On the other hand, by ensuring that the amount of the component (C) is not more than the upper limit of the above range, the storage stability of the resist coating liquid improves, and deterioration in the sensitivity over time can be suppressed.

[Component (D)]

The resist composition of the present invention preferably also includes a nitrogen-containing organic compound (D) (hereafter referred to as "component (D)") as an optional component.

There are no particular limitations on the component (D) as long as it functions as an acid diffusion control agent, namely, a quencher which traps the acid generated from the component (B) upon exposure. A multitude of these components (D) have already been proposed, and any of these known compounds may be used, although an aliphatic amine, and particularly a secondary aliphatic amine or tertiary aliphatic amine is preferable.

An "aliphatic amine" is an amine having one or more aliphatic groups, wherein the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group of not more than 12 carbon atoms (namely, alkylamines or alkyl alcohol amines), and cyclic amines.

Specific examples of alkylamines and alkyl alcohol amines include monoalkylamines such as n-hexylamine, n-heptylamine, n-octylamine, n-nonylamine and n-decylamine, dialkylamines such as diethylamine, di-n-propylamine, di-n-heptylamine, di-n-octylamine and dicyclohexylamine, trialkylamines such as trimethylamine, triethylamine, tri-n-propylamine, tri-n-butylamine, tri-n-pentylamine, tri-n-hexylamine, tri-n-heptylamine, tri-n-octylamine, tri-n-nonylamine, tri-n-decylamine and tri-n-dodecylamine, and alkyl alcohol amines such as diethanolamine, triethanolamine, diisopropanolamine, triisopropanolamine, di-n-octanolamine and tri-n-octanolamine. Among these, trialkylamines of 5 to 10 carbon atoms are preferable, and tri-n-pentylamine or tri-n-octylamine is particularly desirable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

As the component (D), one compound may be used alone, or two or more compounds may be used in combination.

The component (D) is typically used in an amount within a range from 0.01 to 5.0 parts by weight, relative to 100 parts by weight of the component (A). By ensuring that the amount of the component (D) is within the above-mentioned range, the shape of the resist pattern and the post exposure stability of the latent image formed by the pattern-wise exposure of the resist layer are improved.

[Component (E)]

Furthermore, in the resist composition of the present invention, in order to prevent any deterioration in sensitivity and improve the resist pattern shape and the post exposure stability of the latent image formed by the pattern-wise exposure of the resist layer, at least one compound (E) (hereafter referred to as "component (E)") selected from the group consisting of organic carboxylic acids, phosphorus oxo acids and derivatives thereof may be added as an optional component.

Examples of the organic carboxylic acids include acetic acid, malonic acid, citric acid, malic acid, succinic acid, benzoic acid and salicylic acid.

Examples of the phosphorus oxo acids include phosphoric acid, phosphonic acid and phosphinic acid. Among these, phosphonic acid is particularly desirable.

Examples of oxo acid derivatives include esters in which a hydrogen atom within an above-mentioned oxo acid is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters and phenylphosphinic acid.

As the component (E), one type of compound may be used alone, or two or more types of compounds may be used in combination.

The component (E) is preferably an organic carboxylic acid, and is more preferably salicylic acid.

The component (E) is typically used in an amount within a range from 0.01 to 5.0 parts by weight, relative to 100 parts by weight of the component (A).

If desired, other miscible additives can also be added to the resist composition of the present invention. Examples of such miscible additives include additive resins for improving the performance of the resist film, surfactants for improving the applicability, dissolution inhibitors, plasticizers, stabilizers, colorants, halation prevention agents, and dyes.

[Component (S)]

The resist composition of the present invention can be prepared by dissolving the components for the resist composition in an organic solvent (hereafter, frequently referred to as "component (S)").

The component (S) may be any organic solvent which can dissolve the respective components to give a uniform solution, and any one or more kinds of organic solvents can be appropriately selected from those which have been conventionally known as solvents for chemically amplified resists.

Specific examples of the component (S) include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene.

The organic solvents (S) may be used individually, or as mixed solvents containing two or more solvents.

Among these, γ-butyrolactone, propylene glycol monomethyl ether acetate (PGMEA), propylene glycol monomethyl ether (PGME) and ethyl lactate (EL) are preferable.

Further, among the mixed solvents, a mixed solvent obtained by mixing PGMEA with a polar solvent is preferable. The mixing ratio (weight ratio) of this mixed solvent can be determined appropriately with due consideration of the compatibility of the PGMEA with the polar solvent, but is preferably in the range of 1:9 to 9:1, and more preferably from 2:8 to 8:2.

Specifically, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME is preferably from 1:9 to 9:1, more preferably from 2:8 to 8:2, and still more preferably 3:7 to 7:3.

Further, as the component (S), a mixed solvent of at least one of PGMEA and EL with γ-butyrolactone is also preferable. The mixing ratio (former:latter) of such a mixed solvent is preferably within a range from 70:30 to 95:5.

The amount of the component (S) is not particularly limited, and may be adjusted appropriately to a concentration which enables coating of a coating solution onto a substrate in accordance with the thickness of the coating film. In general, the organic solvent is used in an amount that yields a solid content for the resist composition that is within a range from 0.5 to 20% by weight, and preferably from 1 to 15% by weight.

Dissolving of the components of the resist composition in the component (S) can be conducted, for example, by simply mixing and stirring each of the above components using a conventional method. Where required, the composition may also be mixed and dispersed using a dispersion device such as a dissolver, a homogenizer, or a triple roll mill. Furthermore, following mixing, the composition may also be filtered using a mesh or a membrane filter or the like.

EXAMPLES

As follows is a more detailed description of the present invention based on a series of examples, although the scope of the present invention is in no way limited by these examples.

<Preparation of Surface Modifying Material>

As surface modifying materials, the respective epoxy polymer solutions (having an epoxy polymer concentration of 0.020% by weight) were prepared by dissolving each epoxy polymers represented by chemical formulas (G-1-1) to (G-1-4), (G-4-1) and (G-5-1) shown below in PGMEA.

[Chemical Formula 59]

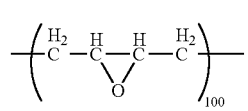

(G-1-1) ~ (G-1-4)

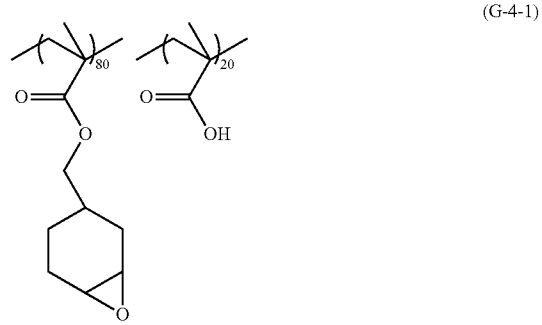

(G-4-1)

-continued

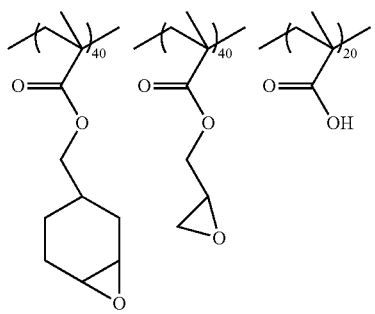

(G-5-1)

Each of the subscript numerals shown at the lower right of the structural units in the aforementioned chemical formula indicates the compositional ratio within the copolymers (namely, the percentage (molar ratio) of each structural unit, based on the combined total of all the structural units that constitute the epoxy polymer) determined by carbon 13 nuclear magnetic resonance spectroscopy (600 MHz $^{13}$C-NMR).

The weight average molecular weight and dispersity of the epoxy polymers used in each surface modifying materials (epoxy polymer solutions) are shown in Table 1.

TABLE 1

|  | Epoxy polymer | | |
|---|---|---|---|
|  | Chemical formula | Weight average molecular weight | Dispersity |
| Surface modifying material (1) | (G-1-1) | 60,000 | 1.93 |
| Surface modifying material (2) | (G-1-2) | 20,000 | 4.13 |
| Surface modifying material (3) | (G-1-3) | 10,000 | 2.13 |
| Surface modifying material (4) | (G-1-4) | 3,000 | 2.11 |
| Surface modifying material (5) | (G-4-1) | 5,000 | 2.92 |
| Surface modifying material (6) | (G-5-1) | 5,000 | 2.83 |

<Preparation of Resist Compositions>

The components shown in Table 2 were mixed together and dissolved to prepare a series of positive chemically amplified resist compositions.

TABLE 2

| Component (A) | Component (B) | Component (D) | Component (E) | Component (S) |
|---|---|---|---|---|
| (A)-1 [100] | (B)-1 [3.50] | (D)-1 [0.75] | (E)-1 [1.00] | (S)-1 [1,700] |

In Table 2, the reference characters indicate the following. Further, the numerical values in brackets [ ] in Table 2 indicate the amount (in parts by weight) of the component added.

(A)-1: a copolymer represented by chemical formula (A1-1-11) shown below with a weight average molecular weight (Mw) of 13,000 and a dispersity of 1.80. In the formula, the subscript numerals shown at the lower right of the parentheses ( ) indicate the percentage (mol %) of the respective structural units provided with the numerals, and a1:a2:a3:a4=40:40:15:5.

[Chemical Formula 60]

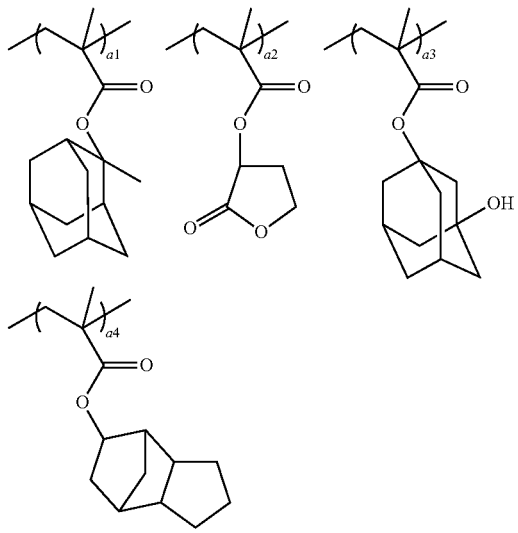

(A1-1-11)

(B)-1: (4-methylphenyl)diphenylsulfonium nonafluoro-n-butane sulfonate
(D)-1: tri-n-pentylamine
(E)-1: salicylic acid
(S)-1: a mixed solvent of PGMEA/PGME=6/4 (weight ratio)

<Resist Pattern Formation>

Examples 1 to 3

Each of the above-mentioned surface modifying materials (2) to (4) was coated onto an 8-inch silicon wafer, and a bake treatment was conducted at 240° C. for 60 seconds to dry the material, thereby forming a surface modifying layer having a thickness of 220 nm.

Using a Clean Track Act8 (product name, manufactured by Tokyo Electron Limited), each of the above-mentioned chemically amplified resist compositions was spin-coated onto the silicon wafer on which the aforementioned surface modifying layer had been formed, and a prebake (PAB) was then conducted on a hotplate for 60 seconds at 120° C. to dry the composition, thereby forming a resist film having a film thickness of 220 nm.

Subsequently, the resist film was selectively exposed through a mask (binary mask) pattern with an ArF excimer laser (193 nm), using an ArF exposure apparatus NSR-S302A (manufactured by Nikon Corporation, NA (numerical aperture)/sigma=0.60/0.75).

The resist film was subjected to a post exposure bake treatment (PEB) at 130° C. for 60 seconds, was subsequently developed for 30 seconds at 23° C. in a 2.38% by weight aqueous solution of tetramethylammonium hydroxide (TMAH) (product name: NMD-3, manufactured by Tokyo Ohka Kogyo Co., Ltd.), and was then rinsed for 30 seconds in pure water and shaken dry. An additional bake treatment (post bake) was then performed at 100° C. for 60 seconds.

As a result, in each of the examples, an isolated line resist pattern (ISO pattern) having a line width of 250 nm was formed in the resist film.

Examples 4 and 5

Each of the above-mentioned surface modifying materials (5) and (6) was coated onto an 8-inch silicon wafer, and a bake treatment was conducted at 240° C. for 60 seconds to dry the material, thereby forming a surface modifying layer having a thickness of 220 nm.

Subsequently, a resist film having a film thickness of 220 nm was formed, and an ISO pattern having a line width of 250 nm was then formed in the resist film in the same manner as that described in Examples 1 to 3.

Comparative Example 1

A resist film having a film thickness of 220 nm was formed, and an ISO pattern having a line width of 250 nm was then formed in the resist film in the same manner as that described in Examples 1 to 3, with the exception that an 8-inch silicon wafer was treated with hexamethyldisilazane (HMDS) at 90° C. for 36 seconds instead of forming the aforementioned surface modifying layer thereon.

Comparative Example 2

A resist film having a film thickness of 220 nm was formed, and an ISO pattern having a line width of 250 nm was then formed in the resist film in the same manner as that described in Examples 1 to 3, with the exception that the surface modifying material (1) was used instead of the surface modifying materials (2) to (4).

[Evaluation of Sensitivity]

For the resist pattern formation described above, the optimum exposure dose Eop (sensitivity, units: mJ/cm$^2$) during formation of the ISO pattern having a line width 250 nm was determined. The results are shown in Table 3.

[Evaluation of Exposure Margin (EL Margin)]

The resist patterns were formed in the same manner as the above-mentioned method of forming a resist pattern by changing the exposure dose, the exposure doses with which lines from the ISO pattern were able to be formed within a range of ±5% from the target dimension (that is, a line width of 250 nm) (namely, within a range from 237.5 nm to 262.5 nm) were determined, and the EL margin (unit: %) was determined using the following formula. The results are shown in Table 3.

form ISO patterns, and the size (line width) of the formed ISO patterns was measured.

Then, a straight line was drawn by plotting the mask size on the horizontal axis and the measured size (line width) of the ISO patterns on the vertical axis, and the gradient of the straight line was calculated. The results are shown in Table 3.

It should be noted that the closer the gradient of this straight line is to 1, the better the mask reproducibility.

[Evaluation of Resolution]

The critical resolution at the above Eop value was evaluated using a scanning electron microscope S-9220 (product name, manufactured by Hitachi, Ltd.).

This evaluation was performed by conducting resist pattern formation, and measuring the line width immediately prior to the point where pattern collapse started to occur. The results are shown in Table 3.

[Evaluation of Pattern Collapse]

With the exception of altering the exposure dose within a range from 20 to 70 mJ/cm$^2$, ISO patterns were formed in the same manner as that in the resist pattern formation described above, and the line width and exposure dose immediately prior to the values where pattern collapse started to occur were recorded. These results were recorded in Table 3 under the heading "[Pattern collapse (nm)]/[exposure dose (mJ/cm$^2$)]".

The greater the difference between the exposure dose immediately prior to collapse of the ISO pattern and the Eop value, the less likely the resist pattern is to suffer pattern collapse, and the better resistance to pattern collapse.

[Measurement of Contact Angle]

2 μL of water was dropped onto the surface of each surface modifying layers formed after the bake treatment in the surface modifying layer formation step, and a DROP MASTER-700 apparatus (a product name, manufactured by Kyowa Interface Science Co., Ltd.) was used to measure the static contact angle. The result of this measurement is shown in Table 3 as the "contact angle (°)".

TABLE 3

| Material of surface modifying layer | Comp. Ex. 1 HMDS | Comp. Ex. 2 Surface modifying material (1) | Ex. 1 Surface modifying material (2) | Ex. 2 Surface modifying material (3) | Ex. 3 Surface modifying material (4) | Ex. 4 Surface modifying material (5) | Ex. 5 Surface modifying material (6) |
|---|---|---|---|---|---|---|---|
| Eop (mJ/cm$^2$) | 44 | 43 | 43 | 44 | 44 | 44 | 44 |
| EL margin (%) | 6.68 | 6.01 | 6.63 | 6.72 | 6.73 | 7.04 | 6.81 |
| Mask linearity | 1.26 | 1.31 | 1.12 | 1.25 | 1.19 | 1.17 | 1.10 |
| Critical resolution (nm) | 160 | 160 | 140 | 140 | 140 | 140 | 150 |
| [Pattern collapse (nm)]/[exposure dose (mJ/cm$^2$)] | 135.4/61 | 142.1/56 | 105.4/64 | 127.0/61 | 115.4/64 | 71.6/64 | 125.2/62 |
| Contact angle (°) | 58.6 | 35.5 to 45.2 | 38.3 | 36.5 | 39.8 | 38.9 | 40.5 |

EL margin (%)=($|E1-E2|/Eop$)×100

E1: the exposure dose (mJ/cm$^2$) for forming an ISO pattern with a line width of 237.5 nm E2: the exposure dose (mJ/cm$^2$) for forming an ISO pattern with a line width of 262.5 nm The larger the value of EL margin, the smaller the fluctuation in the pattern size accompanied by the variation in the exposure dose.

[Evaluation of Mask Linearity]

With the above Eop, the mask size (line width) was changed to 150 nm, 160 nm, 170 nm, 200 nm and 250 nm to From the results shown in Table 3, it was confirmed that compared with the resist patterns of Comparative Examples 1 to 2, the resist patterns formed by the resist pattern formation methods of Examples 1 to 5 were superior in terms of both the resolution and the resistance to pattern collapse.

Further, from the comparison between the results of examples 1 to 3 and those of Comparative Example 2, it was confirmed that both the resolution and the resistance to pattern collapse improved when the weight average molecular weight of the epoxy polymer within the surface modifying material was within a range from 1,000 to 50,000.

Because the contact angle values in Examples 1 to 5 are smaller than that in Comparative Example 1, it is thought that the silicon wafer and the surface modifying layer are strongly bonded together.

Because the contact angle value in Comparative Example 2 varies, it is thought that the in-plane uniformity of the silicon wafer is low, and the silicon wafer and the surface modifying layer are not bonded together satisfactorily. Further, it is thought that the evaluation of pattern collapse is poor because of this.

Furthermore, it is clear that the resist patterns formed by the resist pattern formation methods of Examples 1 to 5 exhibited superior mask reproducibility and at least equivalent levels of EL margin compared with those of the resist pattern of Comparative Example 1, and were superior in terms of both the mask reproducibility and EL margin compared with those of the resist pattern of Comparative Example 2.

<Wet Etching>

Test Examples 1 to 7

The surface modifying material (2) described above was coated onto $SiO_2$ substrates (with a $SiO_2$ film thickness of 10,000 Å), and each bake treatment was conducted at a bake temperature of 160° C., 180° C., 200° C., 220° C., 240° C., 280° C. or 300° C. for 60 seconds to dry the material, thereby forming a surface modifying layer having a thickness of 220 nm.

Using a Clean Track Act8 (product name, manufactured by Tokyo Electron Limited), each of the above-mentioned chemically amplified resist compositions was spin-coated onto the $SiO_2$ substrate on which the aforementioned surface modifying layer had been formed, and a bake (post bake) treatment was then conducted on a hotplate for 60 seconds at 100° C. to dry the composition, thereby forming a resist film having a film thickness of 780 nm.

Subsequently, the substrate having the resist film formed thereon was subjected to a wet etching treatment by being immersed in an etchant (a 20% by weight aqueous solution, composition (weight ratio): $HF/NH_4F=1/6$) at a temperature of 23° C. for 5 minutes.

Test Example 8

A wet etching treatment by immersion was conducted in the same manner as that described in Test Examples 1 to 7, with the exception that a $SiO_2$ substrate (with a $SiO_2$ film thickness of 10,000 Å) was treated with hexamethyldisilazane (HMDS) at 90° C. for 36 seconds instead of forming the aforementioned surface modifying layer thereon.

[Evaluation of Likelihood of Detachment from Substrate]

The state of the interface between the substrate following wet etching treatment and the edge of the surface modifying layer having the resist film formed was observed using a scanning electron microscope SEM, and the likelihood of detachment of the resist film (namely, the surface modifying layer having the resist film formed) from the substrate was evaluated.

[Measurement of Contact Angle]

2 µL of water was dropped onto the surface of the surface modifying layer formed after the bake treatment, and a DROP MASTER-700 apparatus (a product name, manufactured by Kyowa Interface Science Co., Ltd.) was used to measure the static contact angle. The result of this measurement is shown in Table 4 as the "contact angle (°)".

TABLE 4

| | Test Ex. 1 | Test Ex. 2 | Test Ex. 3 | Test Ex. 4 | Test Ex. 5 | Test Ex. 6 | Test Ex. 7 | Test Ex. 8 |
|---|---|---|---|---|---|---|---|---|
| Material of surface modifying layer | Surface modifying material (2) | | | | | | | HMDS |
| Bake temperature (° C.) | 160 | 180 | 200 | 220 | 240 | 280 | 300 | 200 |
| Contact angle (°) | 65 | 60 | 61 | 57 | 52 | 43 | 45 | 63 |

From the comparison between the SEM observation of Test Example 3 and Test Example 8, it was confirmed that the detachment degree for the edge of the surface modifying layer from the substrate was smaller in Test Example 3 compared to that in Test Example 8. From this result, it is clear that the resist film formed by the method of Test Example 3 is less likely to detach from the $SiO_2$ substrate than the resist film formed by the method of Test Example 8.

Further, from the results of contact angle measurements in Test Examples 1 to 7, it was confirmed that because the contact angle reduces as the bake temperature increases, detachment of the resist film from the $SiO_2$ substrate is less likely as the bake temperature increases, and also the level of resistance to wet etching improves as the bake temperature increases.

While preferred embodiments of the present invention have been described and illustrated above, it should be understood that these are exemplary of the present invention and are not to be considered as limiting. Additions, omissions, substitutions, and other modifications can be made without departing from the spirit or scope of the present invention. Accordingly, the present invention is not to be considered as being limited by the foregoing description, and is only limited by the scope of the appended claims.

What is claimed is:

1. A method of forming a resist pattern, comprising:
forming a surface modifying layer on a substrate using a surface modifying material containing an epoxy resin having a weight average molecular weight of 1,000 to 50,000;
forming a resist film on said substrate, on which said surface modified layer has been formed, using a resist composition;
conducting exposure of said resist film; and
alkali developing said resist film to form a resist pattern, wherein
said epoxy resin has a repeating structure comprising a structural unit (g1) containing an epoxy group, and said structural unit (g1) containing an epoxy group includes a structural unit represented by general formula (g1-1) shown below:

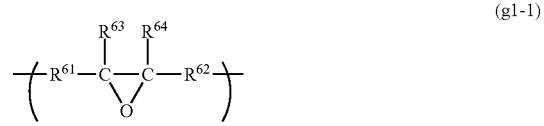

(g1-1)

wherein each of $R^{61}$ and $R^{62}$ independently represents a divalent hydrocarbon group which may have a substituent, and each of $R^{63}$ and $R^{64}$ independently represents a hydrogen atom or an alkyl group.

2. The method of forming a resist pattern according to claim 1,
wherein an amount of said structural unit (g1), based on a combined total of all structural units that constitute said epoxy resin, is at least 10 mol %.

3. The method of forming a resist pattern according to claim 1, wherein a bake temperature when forming a surface modifying layer on said substrate using said surface modifying material is within a range from 80 to 400° C.

4. The method of forming a resist pattern according to claim 3, wherein said bake temperature is within a range from 150 to 300° C.

5. The method of forming a resist pattern according to any one of claims 1, 2, 3 and 4, wherein said resist composition is a chemically amplified resist composition.

6. A method of forming a pattern comprising etching a substrate, on which a resist pattern has been formed by the method of forming a resist pattern according to claim 5.

7. A method of forming a resist pattern, comprising:
forming a surface modifying layer on a substrate using a surface modifying material containing an epoxy resin having a weight average molecular weight of 1,000 to 50,000;
forming a resist film on said substrate, on which said surface modified layer has been formed, using a resist composition;
conducting exposure of said resist film; and
alkali developing said resist film to form a resist pattern, wherein
said epoxy resin has a repeating structure comprising a structural unit (g1) containing an epoxy group, and said structural unit (g1) containing an epoxy group includes a structural unit represented by general formula (g1-3) shown below:

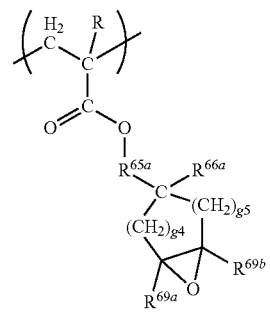

(g1-3)

wherein R represents a hydrogen atom, an alkyl group of 1 to 5 carbon atoms or a halogenated alkyl group of 1 to 5 carbon atoms; $R^{65a}$ represents a divalent hydrocarbon group which may have a substituent; each of $R^{66a}$, $R^{69a}$ and $R^{69b}$) independently represents a hydrogen atom or an alkyl group; g4 represents an integer of 1 to 20; and g5 represents an integer of 1 to 20.

8. The method of forming a resist pattern according to claim 7, wherein an amount of said structural unit (g1), based on a combined total of all structural units that constitute said epoxy resin, is at least 10 mol %.

9. The method of forming a resist pattern according to claim 7, wherein a bake temperature when forming a surface modifying layer on said substrate using said surface modifying material is within a range from 80 to 400° C.

10. The method of forming a resist pattern according to claim 9, wherein said bake temperature is within a range from 85 to 350° C.

11. The method of forming a resist pattern according to any one of claims 7, 8, 9 and 10, wherein said resist composition is a chemically amplified resist composition.

12. A method of forming a pattern comprising etching a substrate, on which a resist pattern has been formed by the method of forming a resist pattern according to claim 11.

* * * * *